(12) United States Patent
Ohba et al.

(10) Patent No.: US 6,330,192 B1
(45) Date of Patent: Dec. 11, 2001

(54) NONVOLATILE SEMICONDUCTOR MEMORY DEVICE AND METHOD OF ERASING DATA OF NONVOLATILE SEMICONDUCTOR MEMORY DEVICE

(75) Inventors: Atsushi Ohba; Satoshi Shimizu; Yoshikazu Miyawaki, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/676,758

(22) Filed: Oct. 2, 2000

(30) Foreign Application Priority Data

Jan. 27, 2000 (JP) .................................................. 12-018508
Mar. 31, 2000 (JP) .................................................. 12-097705

(51) Int. Cl.$^7$ ..................................................... G11C 16/00
(52) U.S. Cl. .................................. 365/185.3; 365/185.22; 365/185.24
(58) Field of Search ........................... 365/185.3, 185.22, 365/185.29, 185.23, 185.24

(56) References Cited

U.S. PATENT DOCUMENTS

| | | | | |
|---|---|---|---|---|
| 5,343,434 | * | 8/1994 | Noguchi | 365/185.3 |
| 5,410,511 | * | 4/1995 | Michiyama | 365/185.22 |
| 5,661,685 | * | 8/1997 | Lee et al. | 365/185.22 |
| 5,831,905 | * | 11/1998 | Hirano | 365/185.24 |
| 5,991,206 | * | 11/1999 | Shin | 365/185.22 |
| 6,252,803 | * | 6/2001 | Fastow et al. | 365/185.3 |

FOREIGN PATENT DOCUMENTS 6-28875   2/1994 (JP) .

* cited by examiner

Primary Examiner—Tan T. Nguyen
(74) Attorney, Agent, or Firm—McDermott, Will & Emery

(57) ABSTRACT

Operations of applying an erase pulse and further performing block program before erasure are executed in steps S2 and S3 before applying the erase pulse on a block by block basis. This narrows the distribution width of the threshold voltage, and reduces the number of the memory transistors to be subjected to over-erase verify so that a total erasing time of data of a flash memory can be reduced.

30 Claims, 51 Drawing Sheets

Vth DISTRIBUTION AT START
OF ERASE SEQUENCE

Vth DISTRIBUTION AFTER APPLICATION OF ERASE PULSE
BEFORE BLOCK PROGRAM BEFORE ERASURE

Vth DISTRIBUTION AFTER BLOCK PROGRAM
BEFORE ERASURE

Vth DISTRIBUTION AFTER APPLICATION OF ERASE PULSE

Vth DISTRIBUTION AFTER APPLICATION OF BLOCK PROGRAM PULSE

Vth DISTRIBUTION AFTER APPLICATION
OF NEXT ERASE PULSE

Vth DISTRIBUTION BEFORE OVER-ERASE VERIFY

SELECTED BIT

SELECTED BIT

SELECTED BIT

SELECTED BIT

SELECTED BIT

Vth DISTRIBUTION BEFORE APPLICATION OF ERASE PULSE

Vth DISTRIBUTION DURING ERASING

Vth DISTRIBUTION AFTER END OF ERASING

Vg-Vd CHARACTERISTICS OF ERASED CELL WITH VARIOUS Vth'S

SELECTED BIT

Vth DISTRIBUTION BEFORE APPLICATION OF PULSE
FOR BLOCK PROGRAM BEFORE ERASURE

Vth DISTRIBUTION DURING BLOCK PROGRAM
BEFORE ERASURE

Vth DISTRIBUTION AFTER BLOCK PROGRAM
BEFORE ERASURE

NONVOLATILE SEMICONDUCTOR MEMORY DEVICE AND METHOD OF ERASING DATA OF NONVOLATILE SEMICONDUCTOR MEMORY DEVICE

BACKGROUND OF THE INVENTION

1. Field of the Invention

The present invention relates to a nonvolatile semiconductor memory device, and particularly a nonvolatile semiconductor memory device of a flash type.

2. Description of the Background Art

A nonvolatile semiconductor memory device of a flash type, i.e., a flash memory is functionally a nonvolatile semiconductor memory device of an entire memory block erasing type allowing electrical programming and erasing. Since such nonvolatile semiconductor memory devices are inexpensive and electrically erasable, they are in great demand for use in portable devices and others, and the research and development of them have been increasingly done in recent years. The flash memory uses transistors (which will be referred to as "memory transistors" hereinafter) as memory cells. These transistors include floating gates, and have variable threshold voltages, respectively.

The flash memory of the NOR type utilizes hot channel electrons for writing or programming.

The NOR type flash memory performs the erasing by changing the threshold voltage of memory transistor from a high to a low.

At present, a flash memory of a type, in which electrons in the floating gate are extracted through an edge into a source region in the erase operation, is the mainstream in the NOR type flash memories. In this invention, description will be made by way of example on applied voltages in the NOR type flash memory, in which electrons are extracted through a whole channel surface for performing the erasing. The NOR type flash memory, in which the erasing is performed by extracting electrons through the whole channel surface, allows scale-down of the cell sizes in contrast to the flash memory of the conventional edge extracting type.

FIG. 47 is a flowchart showing an example of the most simple erase sequence of the conventional flash memory.

Referring to FIG. 47, after an erase command is issued in step S101, an erase pulse having a predetermined pulse strength is applied to a memory transistor in subsequent step S102.

Then, determination by an erase verify function is performed in step S103 for determining whether erasing is completed or not.

When it is determined in step S103 that information held in the memory cell is not erased, the processing returns to step S102, and steps S102 and S103 will be repeated until the threshold voltage of memory transistor decreases to or below an erase determination voltage so that the application of the erase pulse and the erase verify are repeated.

When it is determined in step S103 that the threshold voltage of memory transistor is equal to or lower than the erase determination voltage, the processing advances to step S104, and the erasing operation ends.

FIG. 48 is a circuit diagram of a memory block for showing voltages which are applied during application of the erase pulse in step S102 shown in FIG. 47.

Referring to FIG. 48, this memory block includes memory transistors which are arranged in n rows and m columns, and each has a floating gate. For applying the erase pulse, a source line potential $V_{SL}$ and a well potential $V_{well}$ are both set to 8 V. All word lines WL1–WLn for activating the memory transistors in the respective rows are set to −10 V. All bit lines BL1–BLm for reading data from the memory transistors in the respective columns are set to an open state.

FIG. 49 shows voltages applied to the memory transistor when the erase pulse is applied.

Referring to FIG. 49, source line potential $V_{SL}$ applied to a source of the memory transistor and well potential $V_{well}$ applied to a substrate of the memory transistor are both set to 8 V. A word line potential $V_{WL}$ applied to the word line for selecting the memory transistor is set to −10 V. In this state, a drain of the memory transistor is in the open state. Since a high electric field is applied not only between the gate and the source but also between the gate and the substrate, erasing is performed by extracting electrons through the whole channel surface of the memory transistor.

FIG. 50 is a circuit diagram showing voltages which are applied for erase verify performed in step S103 of the sequence shown in FIG. 47.

Referring to FIG. 50, well potential $V_{well}$ and source line potential $V_{SL}$ are both set to 0 V. Word line WLi which selects the memory transistor corresponding to the selected bit is set to 3.5 V, and the other word lines are all set to 0 V. Bit line BLj connected to the memory transistor corresponding to the selected bit is set to 1.0 V, and the other bit lines are all set to 0 V. The potentials are set as described above, and a current flowing through the memory transistor is determined, whereby it is determined whether erasing of memory transistor MT(j, i) is completed or not.

FIG. 51 shows voltages applied to the memory transistor corresponding to the selected bit in FIG. 50.

Referring to FIG. 51, both the source and well of selected memory transistor MT(j, i) are set to 0 V. The memory transistor receives 3.5 V on its gate, and also receives 1.0 V on its drain.

Description will now be made on voltage setting in the read operation of the conventional flash memory.

FIG. 52 is a circuit diagram showing the voltage setting in the read operation of the conventional flash memory.

Referring to FIG. 52, word line WLi which is connected to the gate of the memory transistor corresponding to the selected bit is set to 4.5 V, and the other word lines are all set to 0 V. In this state, source line potential $V_{SL}$ and well potential $V_{well}$ are both set to 0 V.

FIG. 53 shows potentials applied to the memory transistor which is selected in the read operation shown in FIG. 52.

Referring to FIG. 53, both the source and well of the memory transistor corresponding to the selected bit are set to 0 V. The drain carries 1.0 V, and the gate carries 4.5 V. In this state, when the threshold voltage of memory transistor is high, a current does not flow from the drain to the source. When the threshold voltage of memory transistor is low, a current flows from the drain to the source. By detecting this current, it can be determined whether data is already programmed into the memory transistor or not.

When an erase sequence of the conventional flash memory shown in FIG. 47 is used, such a problem may arise that a part of the memory transistors are over-erased. The over-erased state will now be described.

FIG. 54 shows a distribution of the threshold voltages before application of the erase pulse.

Referring to FIG. 54, a programmed state where the memory transistor has stored "0" and an erased state where the memory transistor has stored "1" are present in the initial state of the erasing operation, i.e., before the erase command is applied in step S101 in FIG. 47. The ordinate in FIG. 54 gives the number of memory transistors holding the respective threshold voltages in the memory block.

In the NOR type flash memory, the state where the threshold voltage is high corresponds to the programmed state, i.e., the state where "0" is held. The state where the threshold voltage is low corresponds to the erased state, i.e., the state where "1" is held.

In the state shown in FIG. 54, the memory block has already stored data through the preceding sequence, and the numbers of memory transistors in the programmed state and the erased state depend on this stored state, respectively. The memory transistors in the programmed state have the threshold voltages distributed in the range not lower than 5.5 V, and the memory transistors in the erased state have the threshold voltages distributed in a range not exceeding 3.5 V.

FIG. 55 shows an incompletely erased state where the data in all the bits are not completely erased even after the erase pulse was applied in the erase sequence shown in FIG. 47.

Referring to FIGS. 47 and 55, the erase pulse of a predetermined width is applied collectively to all the memory transistors in the memory block in step S102. Thereby, erasing is collectively performed on a memory block by memory block basis by an FN (Fowler-Nordheim) tunnel current. Therefore, when the block containing the memory transistors in the erased state as well as the memory transistors in the programmed state as shown in FIG. 54 is collectively supplied with the erase pulse, the memory cells in the erased state as well as the memory cells in the programmed state shift toward the side, on which the memory cells carry lower threshold voltages in FIG. 54.

FIG. 56 shows a distribution of the threshold voltages in the case where the erase verify is completed in step S103 shown in FIG. 47.

Referring to FIG. 56, after the erase verify is completed, all the memory transistors in the memory block have the threshold voltages equal to 3.5 V or less. However, it can be seen that the threshold voltages of the respective memory transistors in the memory block are distributed over a considerably wide range. Thus, the threshold voltages in FIG. 56 unpreferably exhibit a large distribution width.

As a result, the memory cells having a threshold voltage of 1 V or less, i.e., the memory cell in the over-erased state are present, as represented by a hatched portion. In the over-erased state, the memory transistor may form a transistor of a depression type in which a drain current flows even when a gate voltage is 0 V.

The foregoing wide distribution is due to variations in threshold voltage of the memory transistors in the erased state as well as variations in threshold voltage of the memory transistors in the programmed state shown in FIG. 54. These variations are further increased by applying the same erase pulse to the memory transistors in the erased state and the memory transistors in the programmed state.

FIG. 57 shows characteristics of the gate voltage and the drain current of the memory transistors having respective threshold voltages in the erased state.

Referring to FIG. 57, when the threshold voltage is 1.5 V or 3.5 V, and gate voltage Vg is 0 V, the drain current is smaller than a determination value. When the threshold voltage is 0 V, however, a current equal to the predetermined determination value flows through the memory transistor even when gate voltage Vg is equal to 0 V. Further, in the memory transistor having the threshold voltage of −1.0 V, the drain current disadvantageously flows unless the gate voltage is set to a considerably negative potential.

From comparison between the over-erased memory transistors and the normally erased memory transistors, it can be seen that a large leak current flows even when the over-erased memory transistor forms the depression transistor, and has the gate voltage of 0 V, i.e., when the memory transistor is in the unselected state.

When the above over-erased memory transistor is present, a large leak current flows on the same bit line due to the memory transistor in the unselected and over-erased state when the verify and read are performed with the voltages shown in FIGS. 51 and 53. As a result, the current value of the selected memory transistor cannot be determined due to a sum total of the above leak current. Thus, it is impossible to read out data. Consequently, accurate verify and read are impossible.

FIG. 58 is a flowchart showing a flow employing countermeasures against the problem of over-erasing in the erase sequence shown in FIG. 47.

Referring to FIG. 58, when the erase command is applied in step S111, the erase pulse is collectively applied to the entire memory block in step S112 so that the FN tunnel current changes the threshold voltage. Then, erase verify is executed in step S113. Steps S113 and S112 are repeated until the erased state is detected in all the memory cells. When the erased state is detected in all the memory cells in step S113, the processing advances to step S114.

In step S114, over-erase verify is performed for verifying whether the memory transistor is over-erased or not. More specifically, processing is performed to detect the memory transistor, of which threshold voltage takes a certain value (e.g., 1.5 V) or less after the erase verify is completed. When the over-erased memory transistor is detected, the processing advances to step S115, and over-erase recovery is performed bit by bit. The over-erase recovery is a function of recovering the data bit by bit with channel hot electrons (CHE), and therefore a function of positively increasing the threshold voltage in each memory transistor. The processing advances to step S116, in which it is determined whether the memory transistor in the over-erased state is present or not.

When it is verified that the over-erased memory transistor is not present, the processing advances to step S117. In step S117, the excess recovery verify is performed again because there is a possibility that the over-erase recovery function performed in step S115 caused excessive recovery. When the excess recovery is detected, the processing advances to step S112 again. If the memory transistor in the excessively recovered state is not present, the processing advances to step S118, and the erasing ends.

FIG. 59 is a circuit diagram showing voltages which are applied to the memory block during the over-erase verify executed in step S114 shown in FIG. 58.

Referring to FIG. 59, word line WLi for selecting the memory transistor corresponding to the selected bit is supplied with 1.5 V in the over-erase verify operation. The other word lines are supplied with 0 V. A bit line BLj connected to the drain of the memory transistor corresponding to the selected bit is supplied with 1.0 V, and the other bit lines are supplied with 0 V. Source line potential $V_{SL}$ and well potential $V_{well}$ are already set to 0 V.

FIG. 60 shows voltages which are applied to the memory transistor corresponding to the selected bit in the over-erase verify operation.

Referring to FIG. 60, the memory transistor of the selected bit receives 0 V on its source and substrate. Also, it receives 1.5 V on its gate, and receives 1.0 V on its drain.

In this manner, a voltage slightly lower than that in the read operation is applied to the gate, and it is determined whether a current flows between the source and drain or not. Thereby, the memory transistor in the over-erased state can be detected.

FIG. 61 is a circuit diagram showing voltages which are applied to the memory block during the over-erase recovery performed bit by bit in step S115 shown in FIG. 58.

Referring to FIG. 61, in the operation of bit over-erase recovery, 7 V is applied to word line WLi selecting the memory transistor corresponding to the selected bit, and the other word lines are supplied with 0 V. Bit line BLj connected to the drain of the memory transistor corresponding to the selected bit is supplied with 4 V. The other bits are supplied with 0 V. Source line potential $V_{SL}$ and well potential $V_{well}$ are both set to 0 V.

By setting the gate voltage to a value higher than that (e.g., 4.5 V) in the normal read operation, the drain current flows even through the memory transistor having the threshold voltage in the normal, i.e., "0" state. The above voltage may be applied to the memory transistor corresponding to the selected bit, and it may be detected that the current does not flow, whereby the memory transistor in the over-erased state can be detected.

In the case of the erase sequence shown in FIG. 58, recovery is effected on the over-erased memory transistor so that the verify and read can be performed accurately. However, a time is required for the overerase recovery operation performed bit by bit and the verification thereof. This results in disadvantageous increase in total erase time.

FIG. 62 is a flowchart showing the erase sequence for further reducing the erase time of the erase sequence in FIG. 58.

Referring to FIG. 62, when the erase command is applied in step S111, the processing advances to step S121, and bit program before erasure, i.e., an operation of biasing on a bit by bit basis is performed using channel hot electrons. This bit program before erasure is performed for the purpose of initially setting the erased bits shown in FIG. 54 to the programmed state, and thereby uniformizing the threshold voltages before application of the erase pulse. For changing and uniformizing the threshold voltages, channel hot electrons are used. This narrows the distribution width of the threshold voltages after completion of the erase verify, and therefore reduces the number of the memory transistors to be subjected to the over-erase recovery. Accordingly, the total erase time can be short. Steps S112–S118 are similar to those shown in FIG. 58, and therefore description thereof is not repeated.

However, even in the case of the erase sequence in which bit program before erasure is performed as shown in FIG. 62, the bit program before erasure requires a long time, resulting in a problem that the total erase time cannot be reduced sufficiently.

FIG. 63 is a flowchart for further reducing the erase time of the erase sequence shown in FIG. 62.

Referring to FIG. 63, this erase sequence includes step S131 instead of step S121 in the flowchart shown in FIG. 62. In step S131, block program before erasure is collectively executed on a memory block by memory block basis before application of the erase pulse.

According to this manner, the bit programming shown in FIG. 62 is not performed so that the erase time can be reduced.

FIG. 64 is a circuit diagram showing voltages which are applied to the memory block for performing block program before erasure in step S131 shown in FIG. 63.

Referring to FIG. 64, source line potential $V_{SL}$ and well potential $V_{well}$ are both set to –8 V. All word lines WL1–WLn are set to +10 V. Further, all bit lines BL1–BLm are set to the open state.

FIG. 65 shows voltages applied to the memory transistor for block program before erasure shown in FIG. 64.

Referring to FIG. 65, the source and well of the memory transistor are supplied with –8 V, and the gate thereof is supplied with +10 V. The drain is set to the open state. According to this setting, a high electric field is applied between the channel portion and gate of the transistor so that electrons are implanted from the channel portion into the floating gate, and the threshold voltage increases. Thereby, programming is entirely effected on the memory transistors in the memory block.

FIG. 66 shows a distribution of the threshold voltages before the block program before erasure in step S131 of the erase sequence shown in FIG. 63.

Referring to FIG. 66, the memory transistors storing "1" have the threshold voltages of 3.5 V or less. The memory transistors storing "0" have the threshold voltages which are distributed in a range between 5.5 V and 7 V.

FIG. 67 shows a distribution of the threshold voltages of the memory transistors during the block program before erasure.

Referring to FIG. 67, when the block program before erasure is performed, the threshold voltages of the memory transistors holding "1" shown in FIG. 66 and the threshold voltages of the memory transistors holding "0" are shifted to a larger side.

FIG. 68 shows a distribution of the threshold voltages exhibited after completion of the block program before erasure.

When the threshold voltages of all the memory transistors are 5.5 V or more, the transistors having the threshold voltages increased to about 9 V are present due to variations in threshold voltage, as can be seen from the figure. The memory transistors having the increased threshold voltages deteriorate the reliability because an extremely high electric field is applied to tunnel oxide films of the memory cells.

SUMMARY OF THE INVENTION

An object of the invention is to provide a nonvolatile semiconductor memory device which can reduce a total erase time, and can ensure high reliability.

In summary, the invention provides a nonvolatile semiconductor memory device including a plurality of memory blocks, a plurality of word lines, a plurality of bit lines, a potential generating portion and a program/erase control portion.

The memory block includes a plurality of nonvolatile memory transistors arranged in rows and columns. The plurality of word lines select the rows of the memory transistors, respectively. The plurality of bit lines are provided corresponding to the columns of the memory transistors. The potential generating portion generates potentials to be applied to the plurality of word lines, the plurality of bit lines, and substrates and sources of the plurality of memory transistors. The program/erase control portion controls the potential generated by the potential generating portion to erase data in the memory block. The program/erase control portion performs erasing of information held in the memory block by collectively performing programming on the plurality of memory transistors after collectively applying a first erase pulse to the plurality of memory transistors, then repeating the collective application of a second erase pulse to the plurality of memory transistors until the plurality of memory transistors assume an erased state, and selectively performing recovery on the memory transistor in an over-erased state after detection of the erased state.

According to another aspect, the invention provides a method of erasing data in a nonvolatile semiconductor memory device provided with a memory block including a plurality of nonvolatile memory transistors arranged in rows and columns, a plurality of word lines for selecting the rows of the memory transistors, respectively, a plurality of bit lines arranged corresponding to the columns of the memory transistors, a potential generating portion for generating a potential to be applied to the plurality of word lines, the plurality of bit lines, and substrates and sources of the memory transistors, and a program/erase control portion for controlling the potential generating portion to erase data of the memory block, including the steps of collectively applying a first erase pulse to the plurality of memory transistors, repeating, until the plurality of memory transistors assume the erased state, an operation of collectively applying a second erase pulse to the plurality of memory transistors after collectively applying a program pulse to the plurality of memory transistor, and selectively performing a recovery operation on the memory transistor in the over-erased state.

Accordingly, the invention can achieve the following major advantage. By collectively applying the program pulse to the block, a distribution width of the threshold voltages after the erase pulse application becomes narrow so that the memory transistors to be subjected to the over-erase recovery decrease in number, and the total erase time can be reduced.

As another advantage, even in the case where the memory transistor has the threshold voltage repeating increase and decrease around a determination value, a possibility that the transistor passes the erase verify increases so that it is possible to reduce the number of pulses which are applied until the erase verify is completed after the entry of the erase command. Therefore, the erase time can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figure, the same or corresponding portions bear the same reference numbers.

[First Embodiment]

Figure 1:
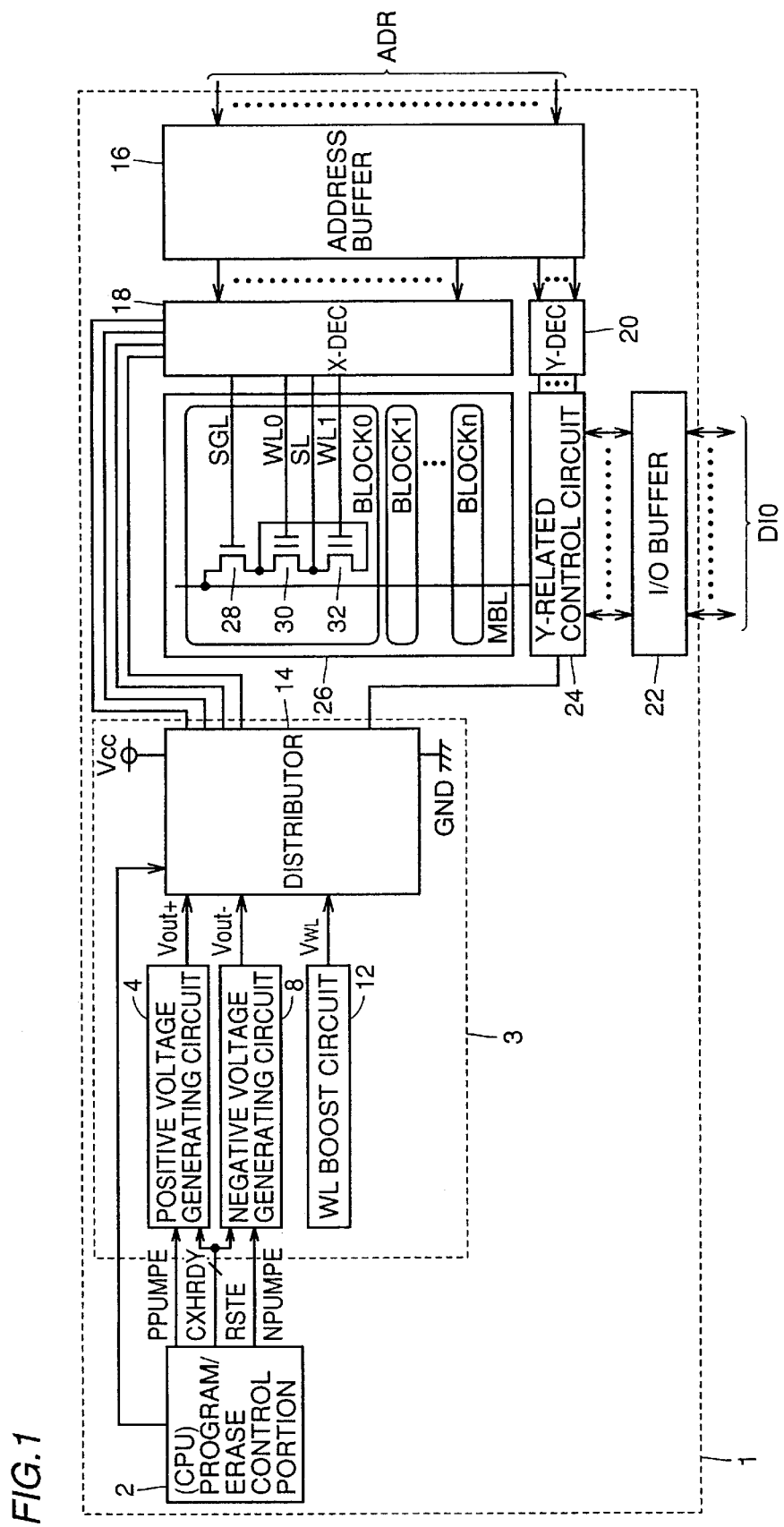
FIG. 1 is a block diagram showing a schematic structure of a nonvolatile semiconductor memory device 1 according to the invention.

FIG. 1 is a block diagram showing a schematic structure of a nonvolatile semiconductor memory device 1 according to the invention.

Referring to FIG. 1, nonvolatile semiconductor memory device 1 includes a program/erase control portion 2 which internally includes an ROM for controlling programming and erasing based on program codes held in this ROM, a voltage generating portion 3 which receives a standby signal CXHRDY, a charge pump activating signal PPUMPE and a reset signal RSTE from program/erase control portion 2, and issues output potentials Vout+, Vout− and $V_{WL}$ according to these received signals, respectively, an address buffer 16 which receives an externally supplied address signal ADR, an X-decoder 18 which receives an internal address signal sent from address buffer 16 and potentials generated by voltage generating portion 3, and determines respective potentials on a select gate line SGL, word lines WL0 and WL1, a source line SL and a well, an input/output buffer 22 for sending and receiving a data input/output signal DIO, a Y-decoder 20 which receives and decodes the address signal sent from address buffer 16, and a Y-related control circuit 24 which applies a high voltage to a main bit line MBL in accordance with the data I/O signal corresponding to the output of Y-decoder 20.

Voltage generating portion 3 includes a positive voltage generating circuit 4 which receives standby signal CXHRDY, charge pump activating signal PPUMPE and reset signal RSTE, and generates output potential Vout+ in accordance with these received signals, a negative voltage generating circuit 8 which receives standby signal CXHRDY, reset signal RSTE and charge pump activating signal NPUMPE, and generates output potential Vout−, a WL boost circuit 12 generating word line potential $V_{WL}$, and a distributor 14 which is controlled by program/erase control portion 2 to receive output potentials Vout+ and Vout− as well as word line potential $V_{WL}$ and distribute them to the respective internal circuits.

Although not shown, X-decoder 18 includes a WL decoder for selecting the word lines, an SG decoder for selecting a select gate, an WELL decoder for selecting a well region corresponding to the selected memory block, and an SL decoder for selecting a source line.

Y-related control circuit 24 includes YG and sense amplifiers as well as latch circuits for performing column selection in a read operation, and performing the read operation by the sense amplifiers, and also includes a page buffer for determining, based on the latched data, whether a high potential is to be applied to main bit line MBL in the write or program operation.

WL boost circuit 12 is a circuit for generating a boosted potential to be applied to word line WL and select gate SG, which are selected in the read operation, for achieving fast access.

Nonvolatile semiconductor memory device 1 further includes a memory array 26. Memory array 26 includes memory blocks BLOCK0–BLOCKn which are formed within individually isolated wells, respectively.

Memory block BLOCK0 includes memory cells 30 and 32, and a select gate 28. In memory block BLOCK0, the memory cells which correspond to select gate line SGL, word line WL0 and WL1 and source line SL selected by X-decoder 18 are selected, and a signal corresponding to data is supplied from main bit line MBL, and is held therein. FIG. 1 shows, as typical examples, select gate 28 and memory cells 30 and 32 corresponding to selected select gate line SGL, word lines WL0 and WL1, and source line SL.

Figure 2:
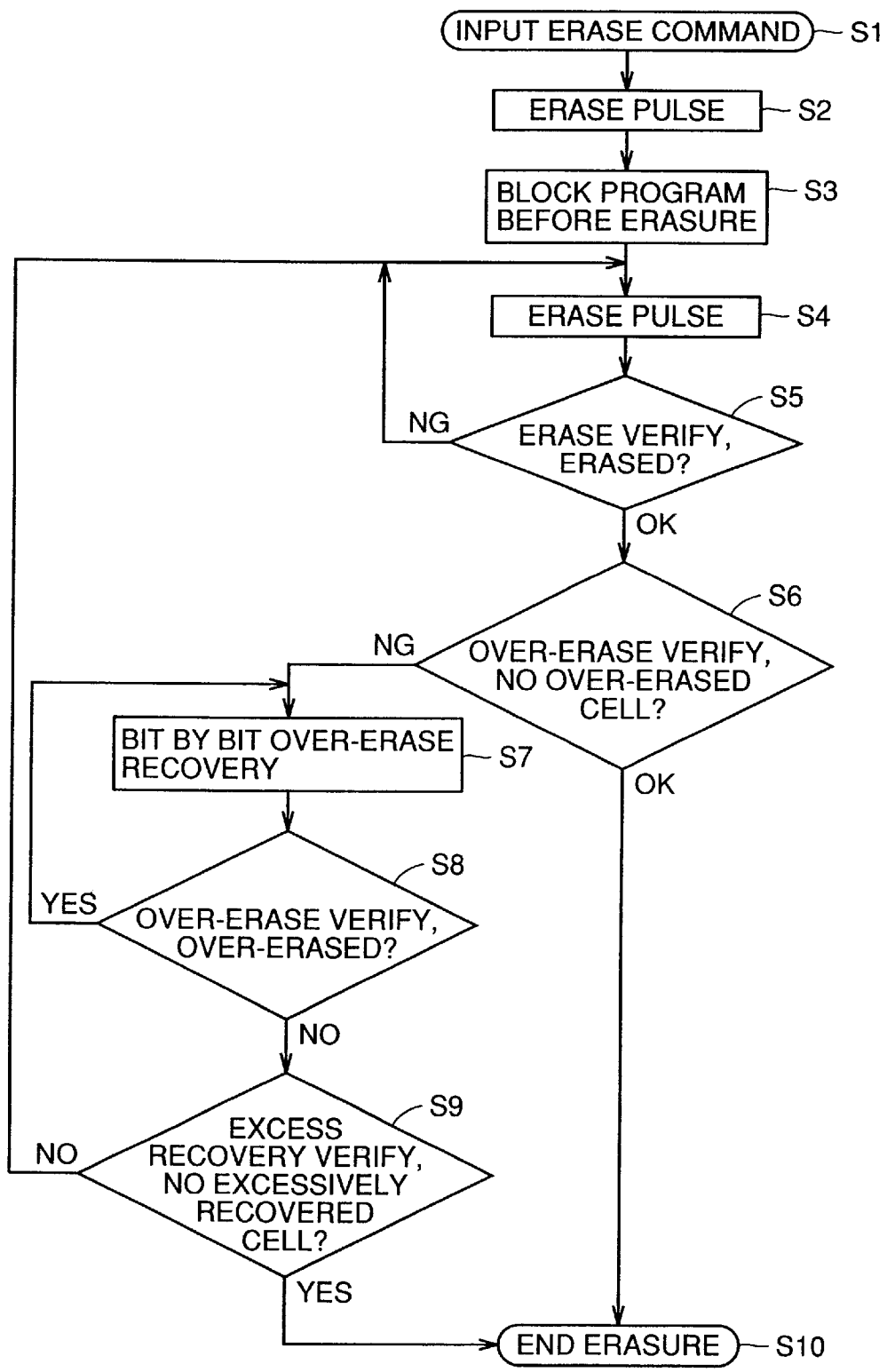
FIG. 2 is a flowchart showing an erase sequence of a flash memory controlled by a program/erase control portion 2 in FIG. 1.

FIG. 2 is a flowchart showing an erase sequence of a flash memory which is controlled by program/erase control portion 2 shown in FIG. 1.

Figure 64:
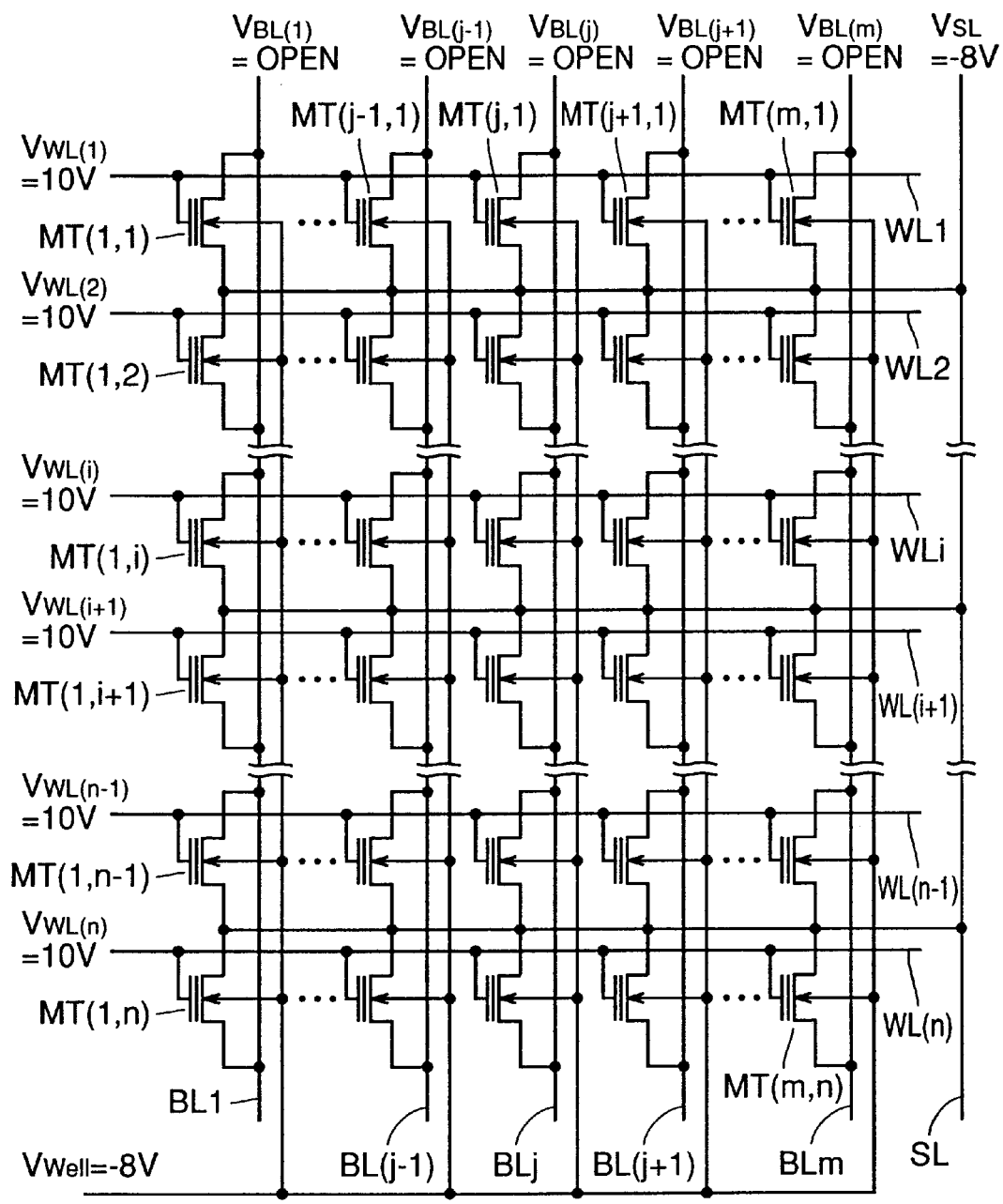
FIG. 64 is a circuit diagram showing voltages applied to the memory block for performing block program before erasure in step S131 shown in FIG. 63.

Referring to FIG. 2, an erase command is applied in step S1. In subsequent step S2, an erase pulse using an FN tunnel current is applied on a block by block basis, as will be described later. In subsequent step S3, block program before erasure is executed by using an FN tunnel current for performing programming on a block by block basis. In the operation of block program before erasure, the voltages shown in FIG. 64 are applied to the memory block.

Figure 48:
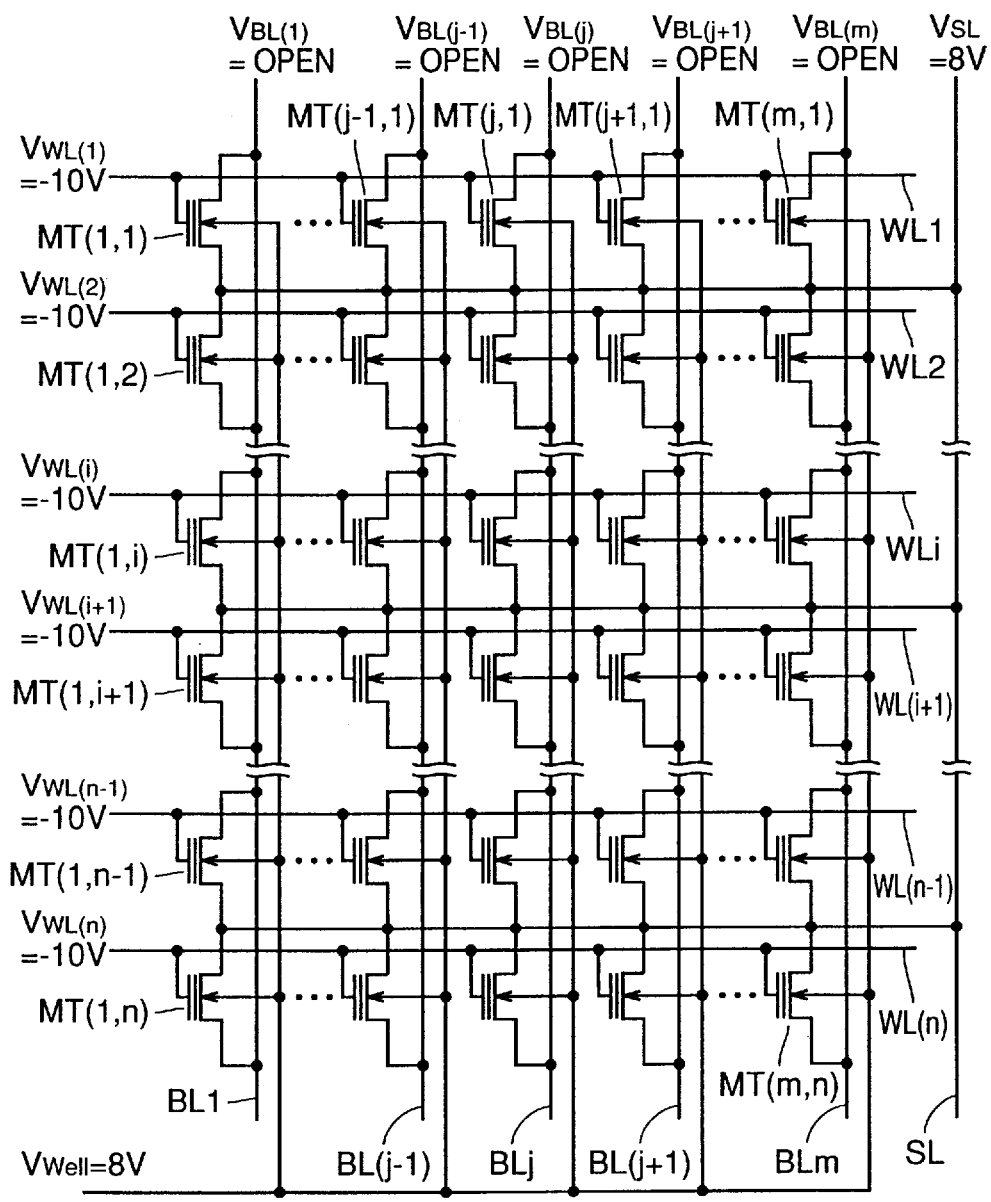
FIG. 48 is a circuit diagram of a memory block for showing voltages applied when an erase pulse is applied in step S102 shown in FIG. 47.

In subsequent step S4, the erase pulse of a predetermined pulse width is applied for performing erasing on a block by block basis by using the FN tunnel current. When this erase pulse is applied, the voltage, e.g., shown in FIG. 48 are applied to the memory block.

Figure 50:
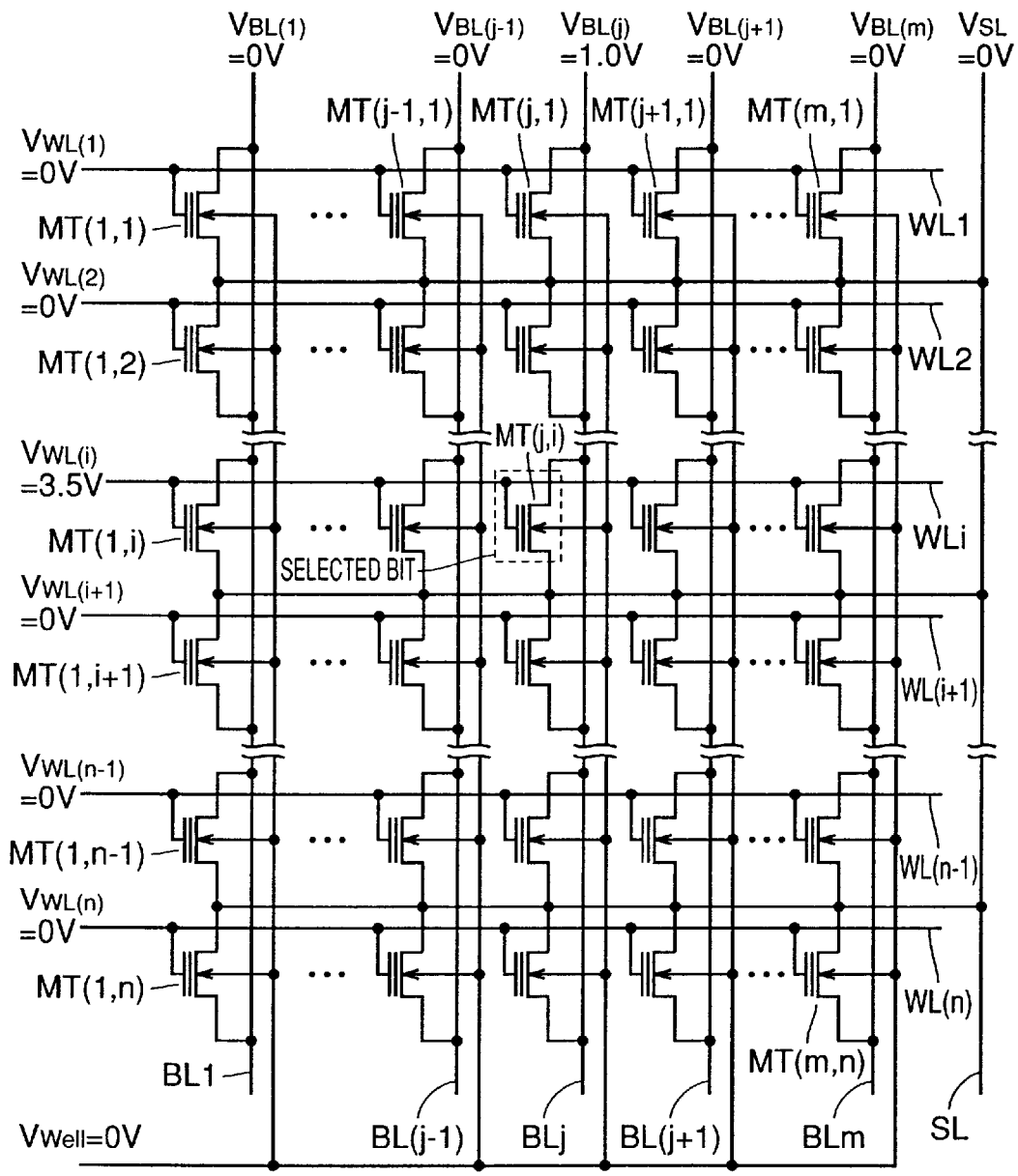
FIG. 50 is a circuit diagram showing voltages which are applied when the erase verify is performed in step S103 of the sequence shown in FIG. 47.

In step S5, erase verify is performed for determining whether data erasing was effected on all the memory transistors in the memory block or not. In this erase verify operation, voltages, e.g., shown in FIG. 50 are applied to the memory block.

When the erasing is not completed, the processing returns to step S4 for applying the erase pulse.

Figure 59:
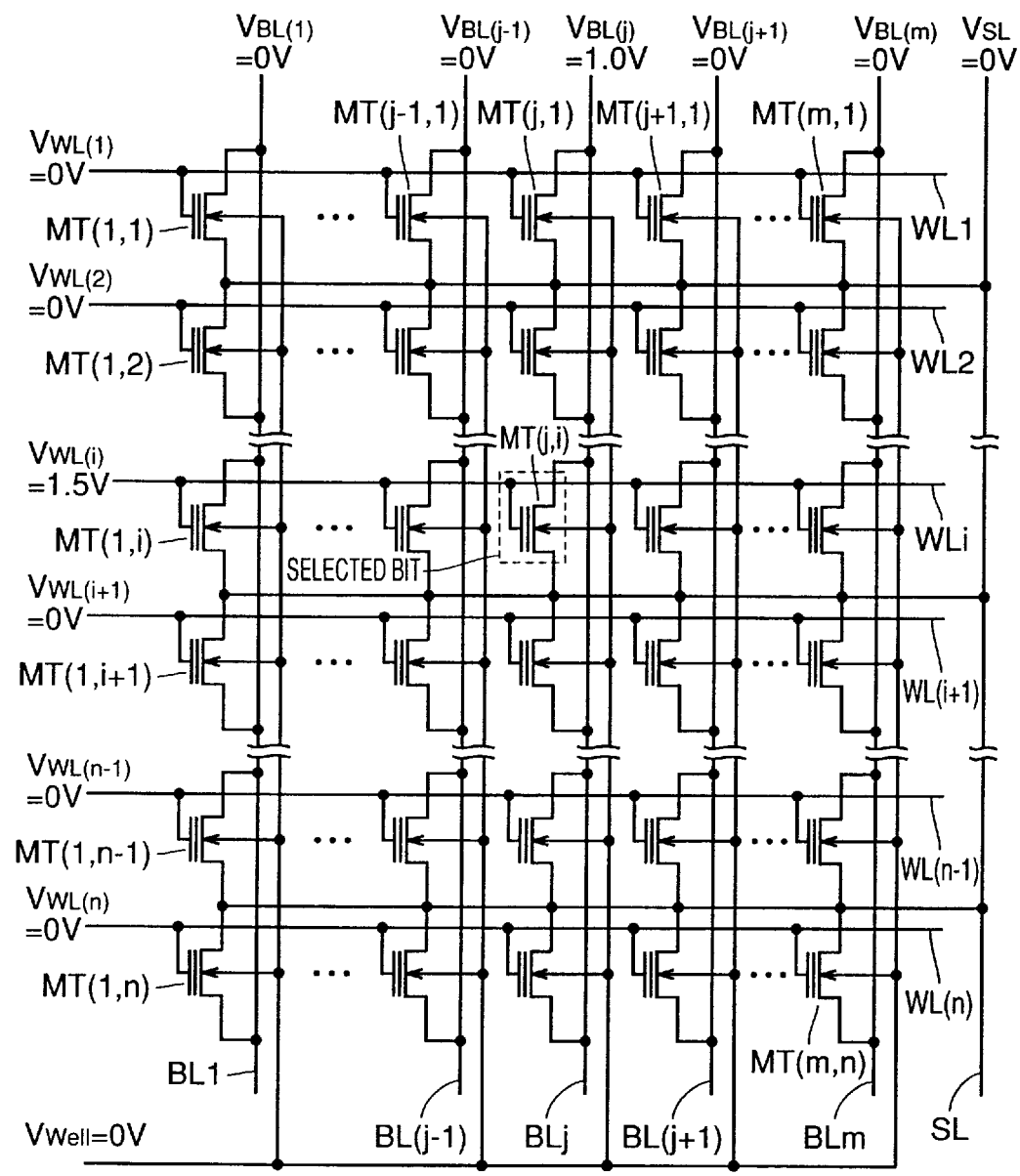
FIG. 59 is a circuit diagram showing voltages applied in the memory block during the over-erase verify executed in step S114 shown in FIG. 58.
Figure 60:
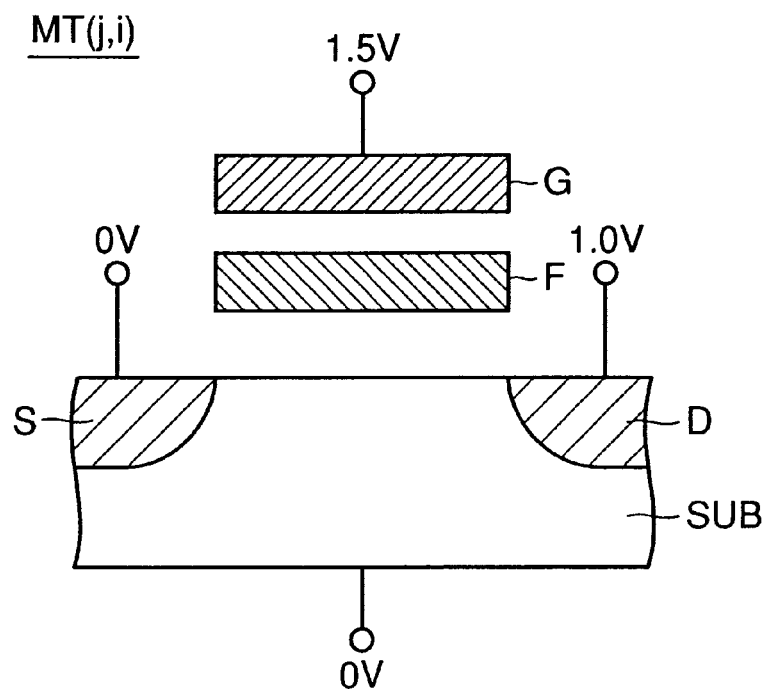
FIG. 60 shows voltages applied to the memory transistor corresponding to the selected bit in the over-erase verify operation.

When the data erasing of the memory transistors is detected, the processing advances to step S6 for executing the over-erase verify. In the over-erase verify, it is verified whether all the memory cells are in the over-erased state or not. In this over-erase verify operation, voltages, e.g., shown in FIG. 59 are applied to the memory block.

When the memory transistor in the over-erased state is present, the processing advances to step S7, in which the over-erase recovery is performed on a bit by bit basis. In this bit over-erase recovery, a recovery operation using channel hot electrons is selectively performed on the memory transistors, and in other words, an operation of increasing the threshold voltage which was excessively low is performed.

Actually, reading for verify is performed a byte (8 bits) or a word (16 bits) at a time, and thereby it is determined whether the over-erased state is present or not. The recovery is effected on the bits which are determined as being in the over-erased state. In the recovery operation, the selecting operation is performed a byte or a word at a time similarly to the verify operation, and the voltage for recovery is applied to the bits to be recovered.

Figure 61:
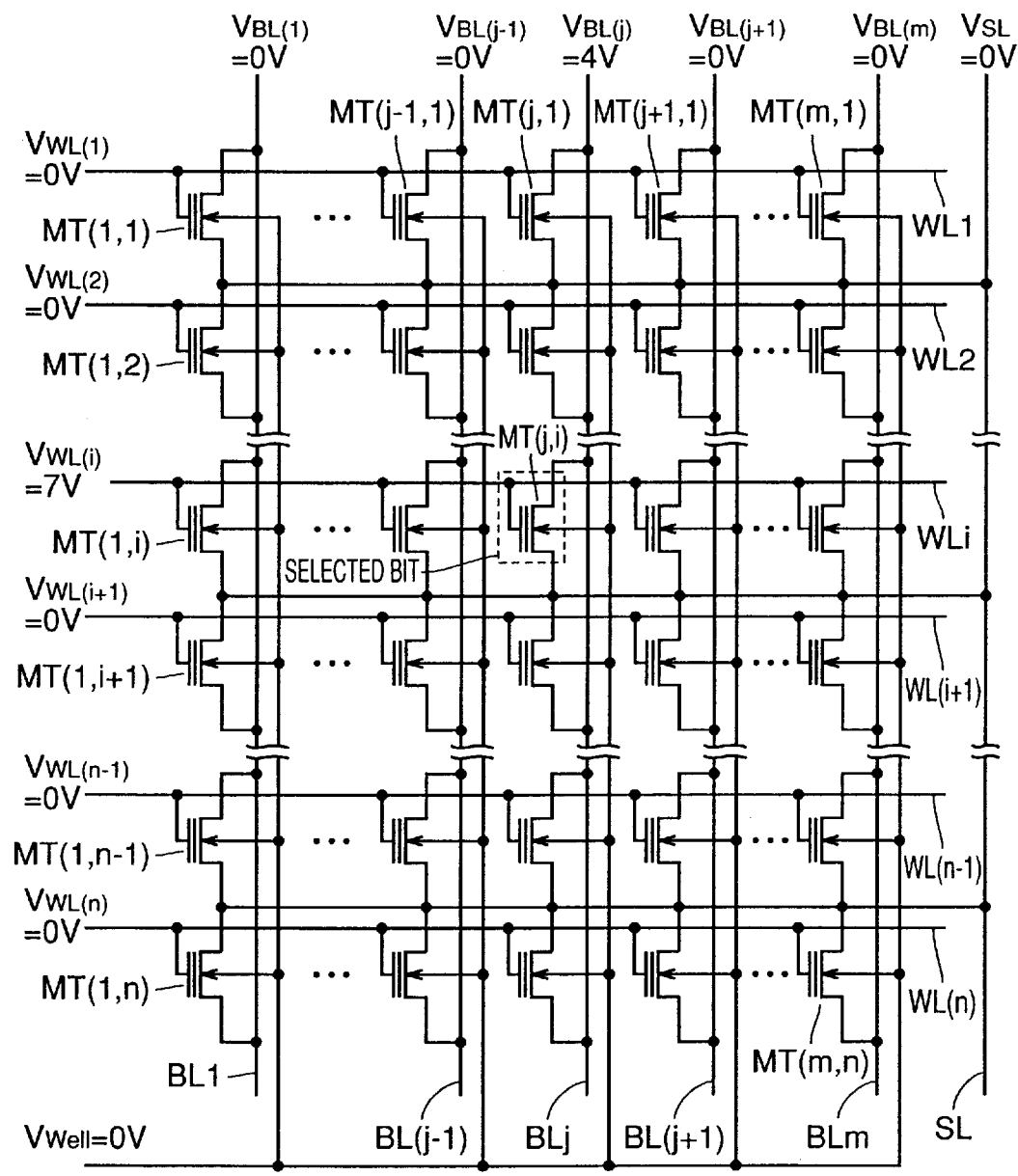
FIG. 61 is a circuit diagram showing voltages applied to the memory block in a bit over-erase recovery operation in step S115 shown in FIG. 58.
Figure 62:
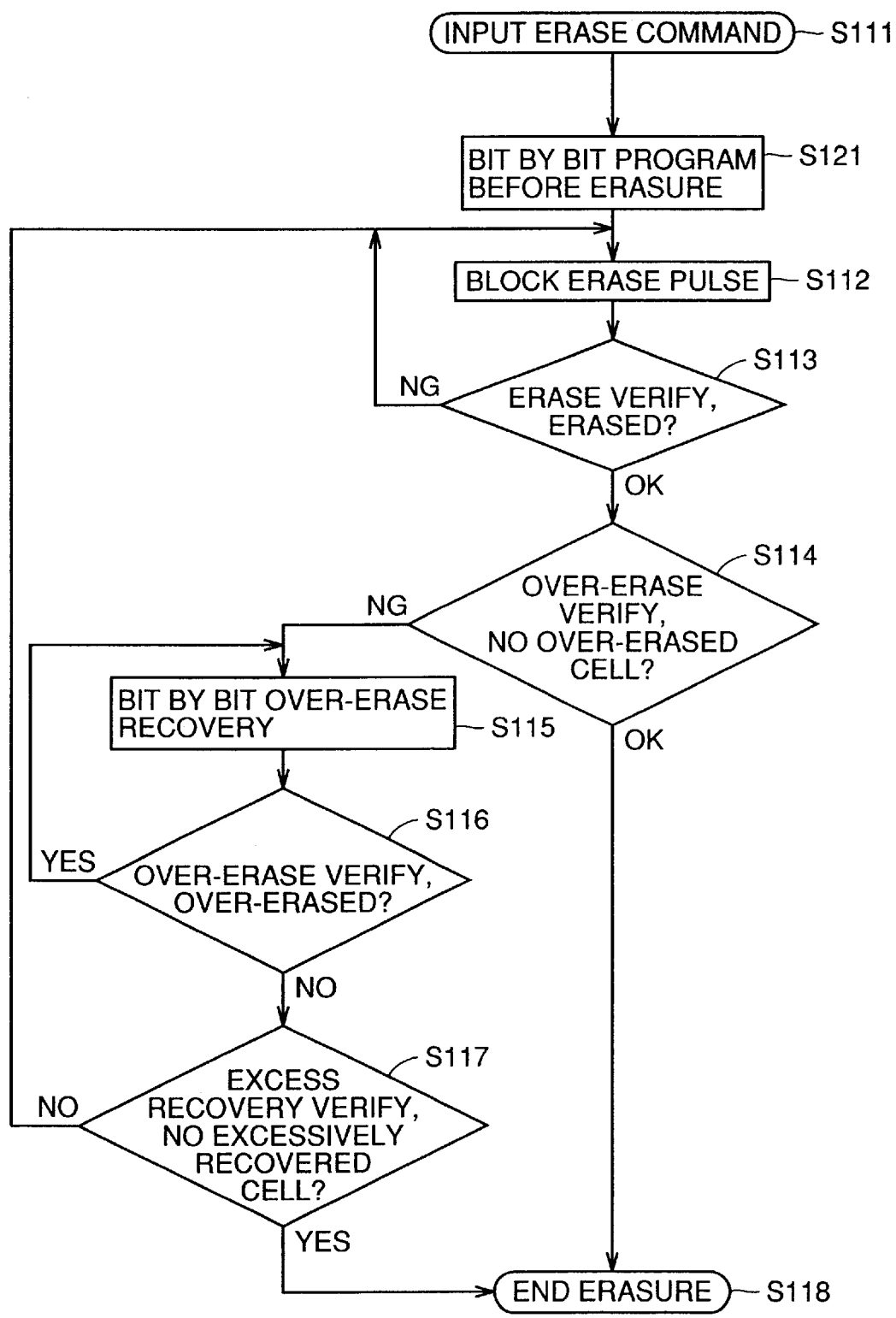
FIG. 62 is a flowchart showing an erase sequence for further reducing the erase time of the erase sequence shown in FIG. 58.

For performing the bit over-erase recovery, voltages, e.g., shown in FIG. 61 are applied to the memory block.

The processing advances to step S8 for performing the over-erase verify. The over-erase verify is performed to verify similarly to step S6 whether all the memory transistors in the block are in the over-erased state or not. If the over-erased memory transistor(s) are still present, the processing returns to step S7.

When the over-erased memory transistor is not present, the processing advances to step S9 to perform the excess recovery verify for determining whether the memory transistor in the excessively recovered state is present or not. When the memory transistor in the excessively recovered state is present, the processing returns to step S4, where application of the erase pulse is performed.

When the memory transistor in the excessively recovered state is not present, the processing advances to step S10, and the erasing ends.

Figure 63:
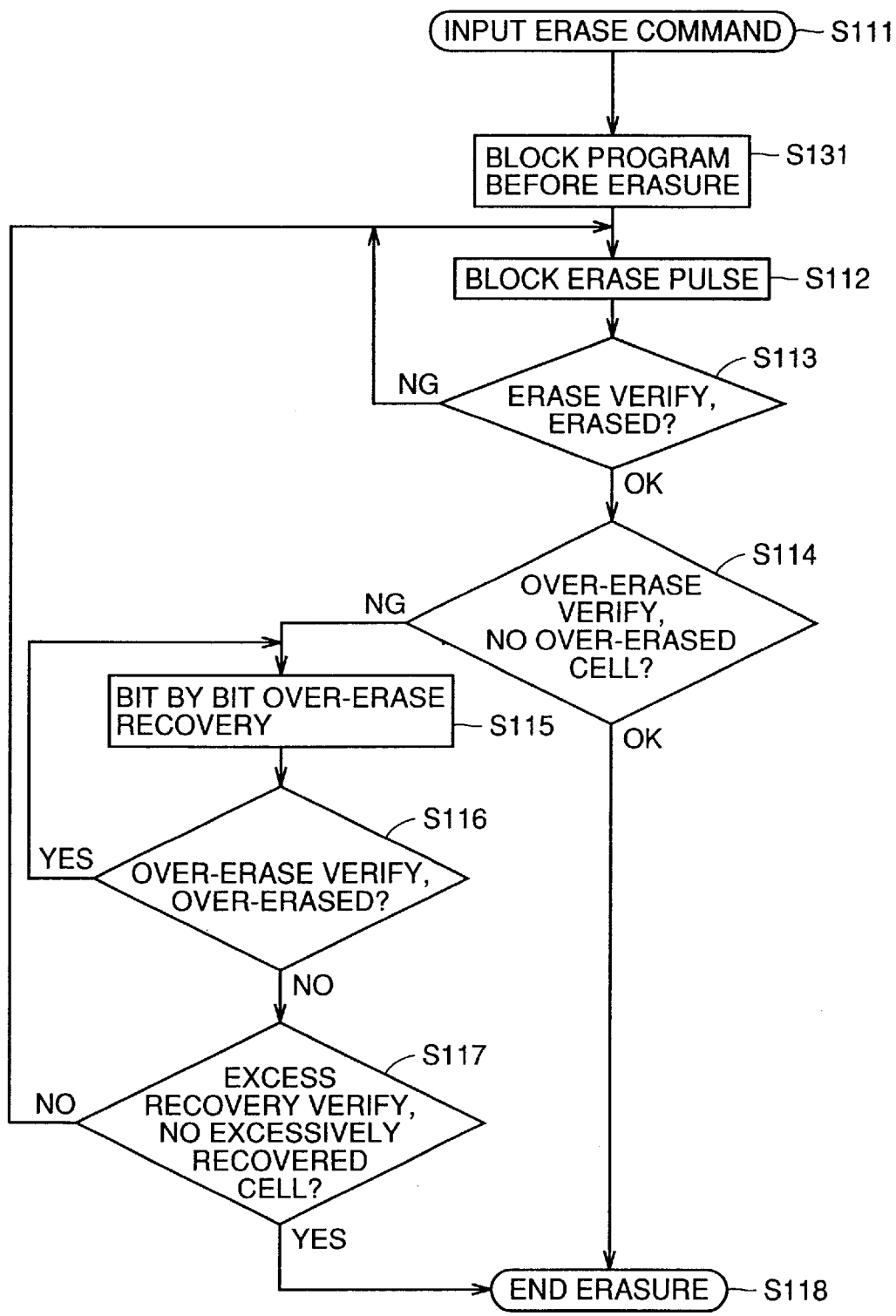
FIG. 63 is a flowchart showing an erase sequence for further reducing the erase time of the erase sequence shown in FIG. 62.

The flowchart of the first embodiment has such a feature that the erase pulse using the FN tunnel current is applied on a block by block basis in step S2 before the block program before erasure in contrast to the conventional erase sequence shown in FIG. 63.

Figure 3:
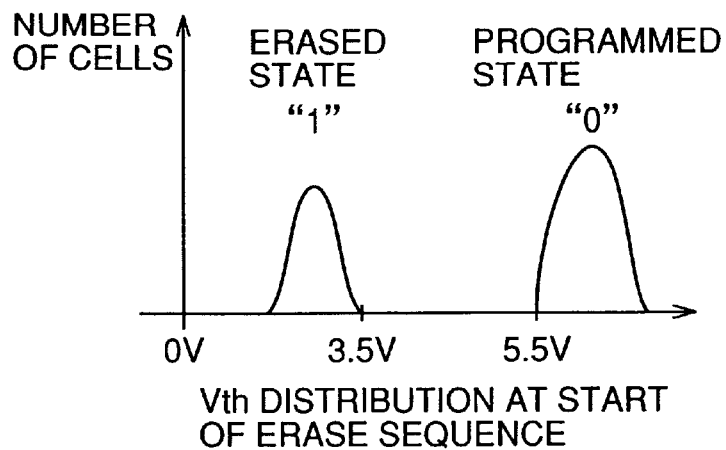
FIG. 3 shows a distribution of threshold voltages before input of an erase command in step S1 of the erase sequence in FIG. 2.

FIG. 3 shows a distribution of the threshold voltages before entry of the erase command in step S1 of the erase sequence shown in FIG. 2.

The NOR type flash memory has been described as an example of the nonvolatile semiconductor memory device of the invention. The memory transistor having the threshold voltage of 5.5 V or more is in the state where "0" is held. The memory transistor having the threshold voltage of 3.5 V or less is in the state where "1" is held. The state of "1" corresponds to the erased state, and "0" corresponds to the programmed state. The change from the state of "1" to the state of "0" is referred to as "program" or "programming".

Figure 4:
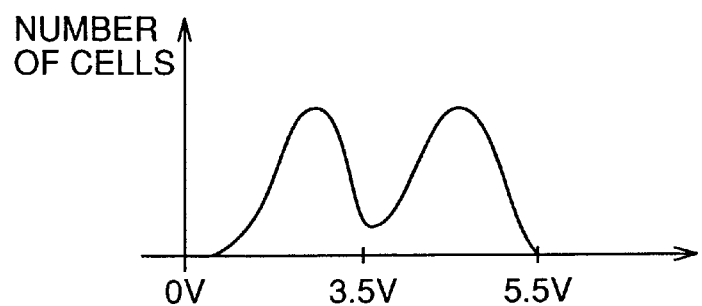
FIG. 4 shows a distribution of the threshold voltages in the memory block after application of the erase pulse in step S2 in FIG. 2.

FIG. 4 shows a distribution of the threshold voltages in the memory block after application of the erase pulse performed in step S2 shown in FIG. 2.

Referring to FIG. 4, when the erase pulse is applied, the memory transistor which was in the programmed state shown in FIG. 3 approaches the erased state. The memory transistor in the erased state has the threshold voltage which has been shifted toward the smaller side.

However, the erase pulse applied in step S2 shifts the threshold voltage of memory transistor to a smaller extent than the shift caused by steps S4 and S5. Application of the pulse stops before all the memory transistors in the memory block, which are in the state of "0", are completely erased so that the memory transistor in the depression state is not present. More specifically, by applying only one time the erase pulse used in step S4 in FIG. 2, the foregoing threshold voltage distribution can be achieved. Further, the extent of shift of the threshold voltage may be reduced by reducing the erase pulse width.

The voltages which are placed by applying the erase pulse in step S2 shown in FIG. 2 can be achieved by the same voltages as those for applying the erase pulse shown in FIG. 48, but may be different from those in FIG. 48. For example, the gate potential may be shifted from −10 V toward the source potential so that the electrons are slowly extracted from the floating gate.

Figure 5:
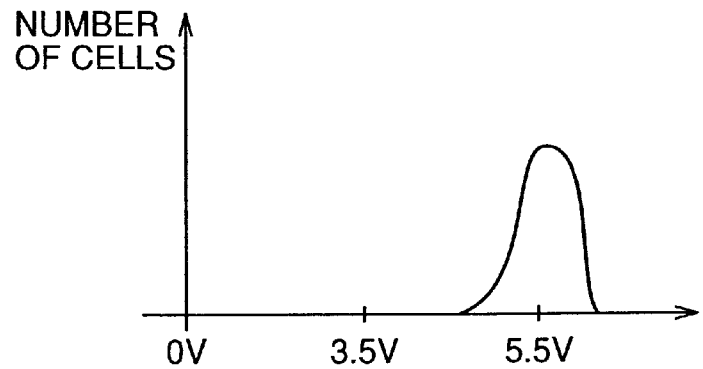
FIG. 5 shows a distribution of the threshold voltages of the memory transistors after completion of block program before erasure in step S3 in FIG. 2.

FIG. 5 shows a distribution of the threshold voltages of the memory transistors after the block program before erasure in step S3 shown in FIG. 2.

Figure 68:
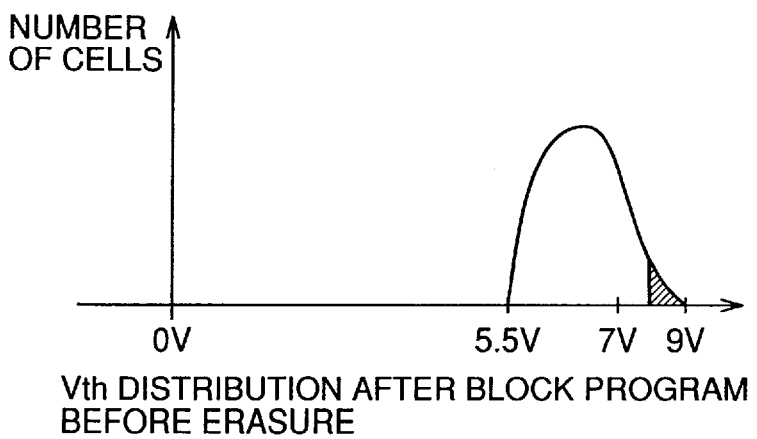
FIG. 68 shows a distribution of the threshold voltages exhibited after completion of the block program before erasure.

Referring to FIG. 5, the distribution of the threshold voltages of the memory transistors differs from the distribution of the threshold voltages exhibited after the block programming in the conventional erase sequence shown in FIG. 68 in that the memory transistor having the extremely raised threshold voltage is not present, and therefore the voltage applied to the tunnel oxide film of the memory transistor can be kept low, resulting in high reliability.

As already described, the erase pulse is applied on a block by block basis prior to the block program before erasure, whereby the threshold voltages after application of the erase pulse have a narrow distribution. Therefore, the memory transistors to be subjected to the over-erase recovery are reduced in number so that the total erase time can be reduced.

[Second Embodiment]

Figure 6:
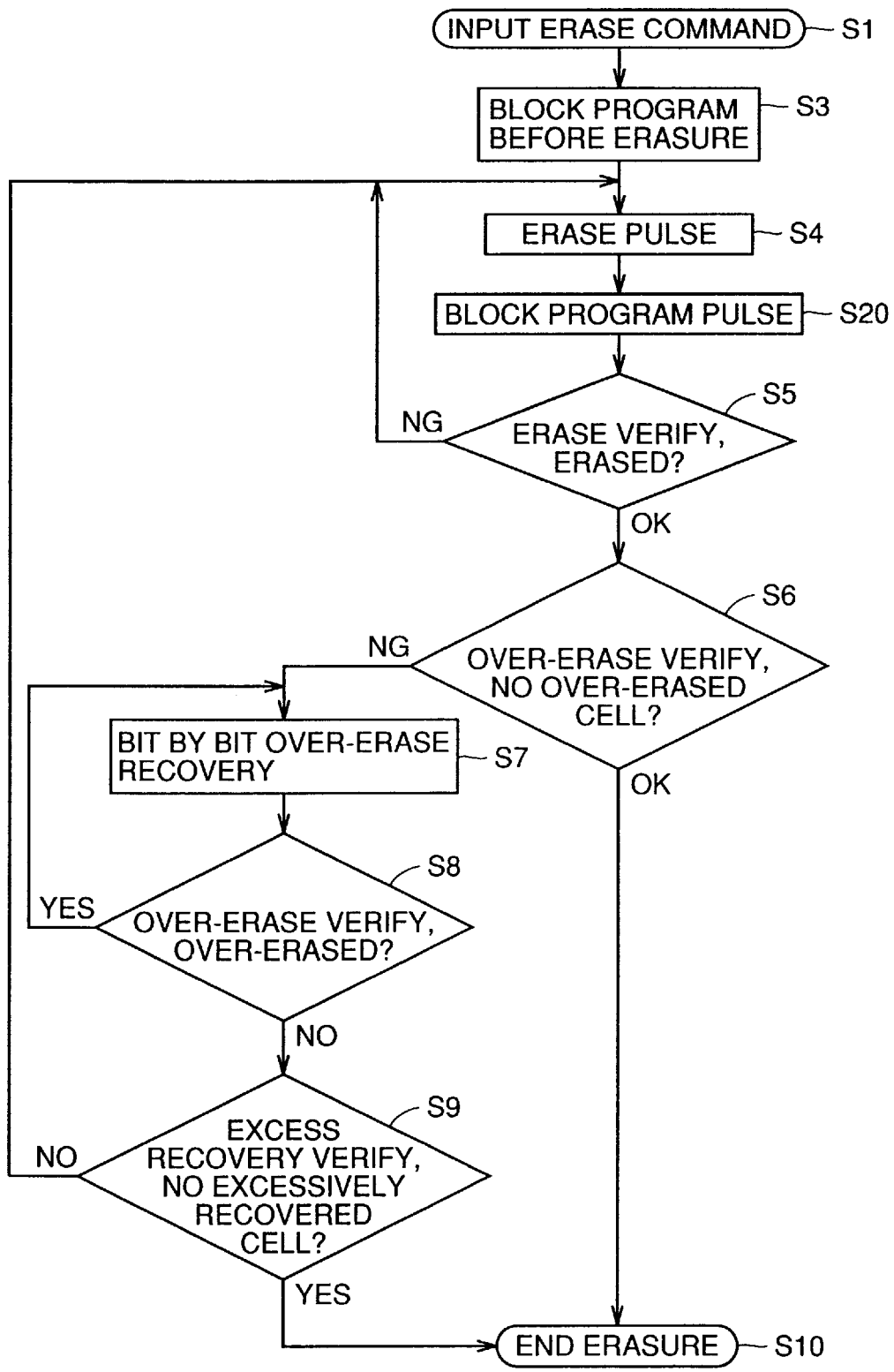
FIG. 6 is a flowchart showing an erase sequence performed in a nonvolatile semiconductor memory device of a second embodiment.

FIG. 6 is a flowchart showing an erase sequence performed in a nonvolatile semiconductor memory device of a second embodiment.

Referring to FIG. 6, the flowchart of this erase sequence does not employ step S2 of applying the erase pulse in the flowchart of the erase sequence of the first embodiment shown in FIG. 2, and alternatively employs step S20 of applying a block program pulse between steps S4 and S5. Operations other than the above are similar to those in the flowchart of the erase sequence shown in FIG. 2, and therefore description thereof is not repeated.

In step S20, the block program pulse using the FN tunnel current is applied on a block by block basis after step S4 of applying the erase pulse.

Figure 7:
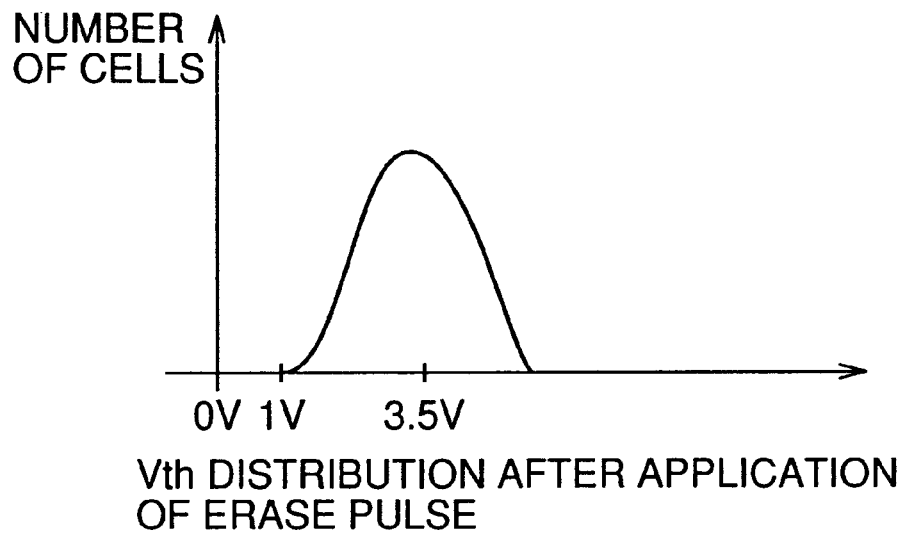
FIG. 7 shows a distribution of the threshold voltages exhibited after application of the erase pulse.

FIG. 7 shows a distribution of the threshold voltages after application of the erase pulse.

Referring to FIG. 7, the threshold voltages after application of the erase pulse are distributed to a considerably wide range, and exhibit a wide bell-shaped distribution.

Figure 8:
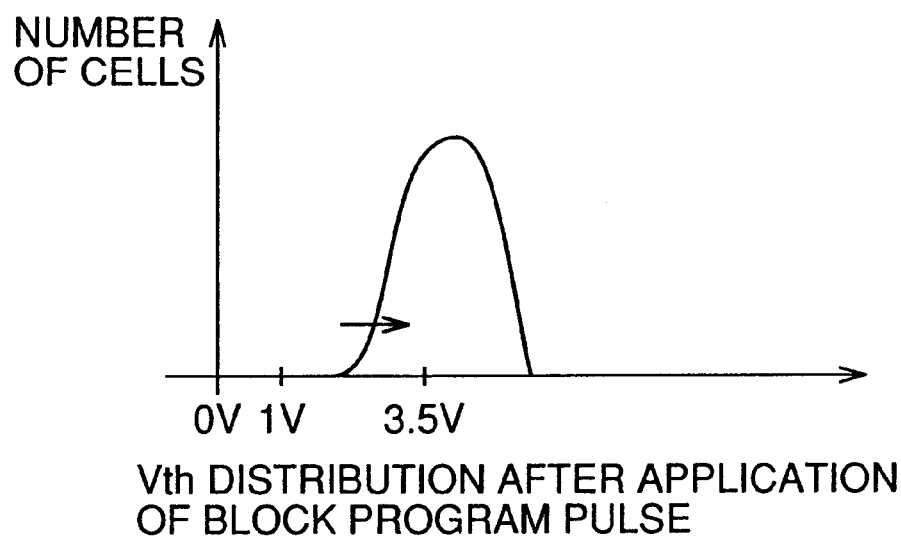
FIG. 8 shows a distribution of the threshold voltages exhibited after application of a block program pulse in step S20 shown in FIG. 6.

FIG. 8 shows a distribution of the threshold voltages exhibited after application of the block program pulse in step S20 shown in FIG. 6.

Referring to FIG. 8, when the block program pulse is applied, the memory transistors which are distributed within a section of lower threshold voltages in the threshold voltage distribution shown in FIG. 7 are recovered to increase the threshold voltages. Therefore, the distribution width of the threshold voltages is narrower than that in FIG. 7. However, if the block in the above state is then processed in step S5 shown in FIG. 6, erase verify will not be completed due to presence of many transistors having the threshold voltages larger than 3.5 V. Therefore, the processing returns to step S4, and the erase pulse is applied.

Figure 9:
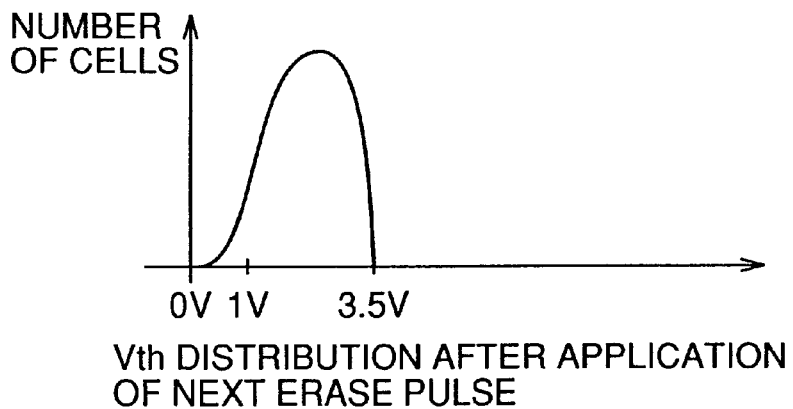
FIG. 9 shows a distribution of the threshold voltages exhibited after the erase pulse is applied again in step S4.

FIG. 9 shows a distribution of the threshold voltages exhibited after the erase pulse is applied again in step S4.

Referring to FIG. 9, the memory transistor having the threshold voltage larger than 3.5 V is not present owing to application of the erase pulse.

Figure 10:
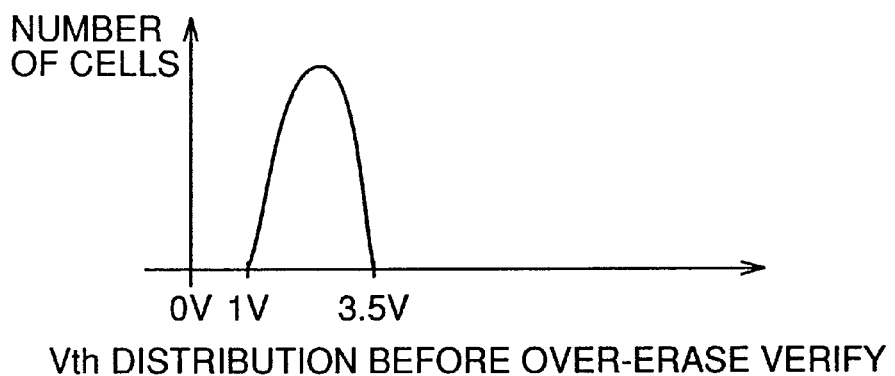
FIG. 10 shows a distribution of the threshold voltages of the memory transistors after the block program pulse is applied in step S20 to the memory block exhibiting the distribution of the threshold voltages shown in FIG. 9, and the erase verify in step S5 is passed.

FIG. 10 shows a distribution of the threshold voltages of the memory transistors after completion of the erase verify in step S5 subsequent to step S20 in which the block program pulse is applied to the memory block exhibiting the threshold voltage distribution shown in FIG. 9.

Referring to FIG. 10, since the block program pulse is applied in step S20, the distribution width of the threshold voltages can be smaller than that in the case where the block program pulse is not applied. Accordingly, the memory transistors in the over-erased state are small in number so that the memory transistors to be subjected to the over-erase recovery are small in number, and the total erase time can be short.

The applied voltage of the block program pulse in step S20 is set to shift the threshold voltage by a smaller amount than that in the normal data program operation. Usually, the amount of the shift is smaller than the amount of shift of the threshold voltage caused by application of the erase pulse in step S4. Therefore, such a possibility can be small that the threshold voltage is larger than the value exhibited before application of the erase pulse in step S4 although the block program pulse is applied in step S20 after application of the erase pulse in step S4.

The applied voltages in the above operation may be the same as those for the block program before erasure in step S3, but can be different therefrom. For example, the word line potential may be slightly shifted from 10 V toward the source potential for reducing the amount of shift of the threshold voltage. Further, the amount of shift of the threshold voltage can be reduced by reducing the program pulse width.

As described above, programming by the block program pulse using the FN tunnel current is lightly executed every time the erase pulse is applied once, whereby every application of the erase pulse reduces the distribution width of the threshold voltages, which has been increased by execution of the block erasing with the FN tunnel current. Accordingly, the memory transistors to be subjected to the over-erase recovery are reduced in number. Also, the memory transistors to be subjected to the over-erase recovery can be recovered fast with channel hot electrons. Consequently, the total time required for completing the erase sequence can be short.

[Third Embodiment]

Figure 11:
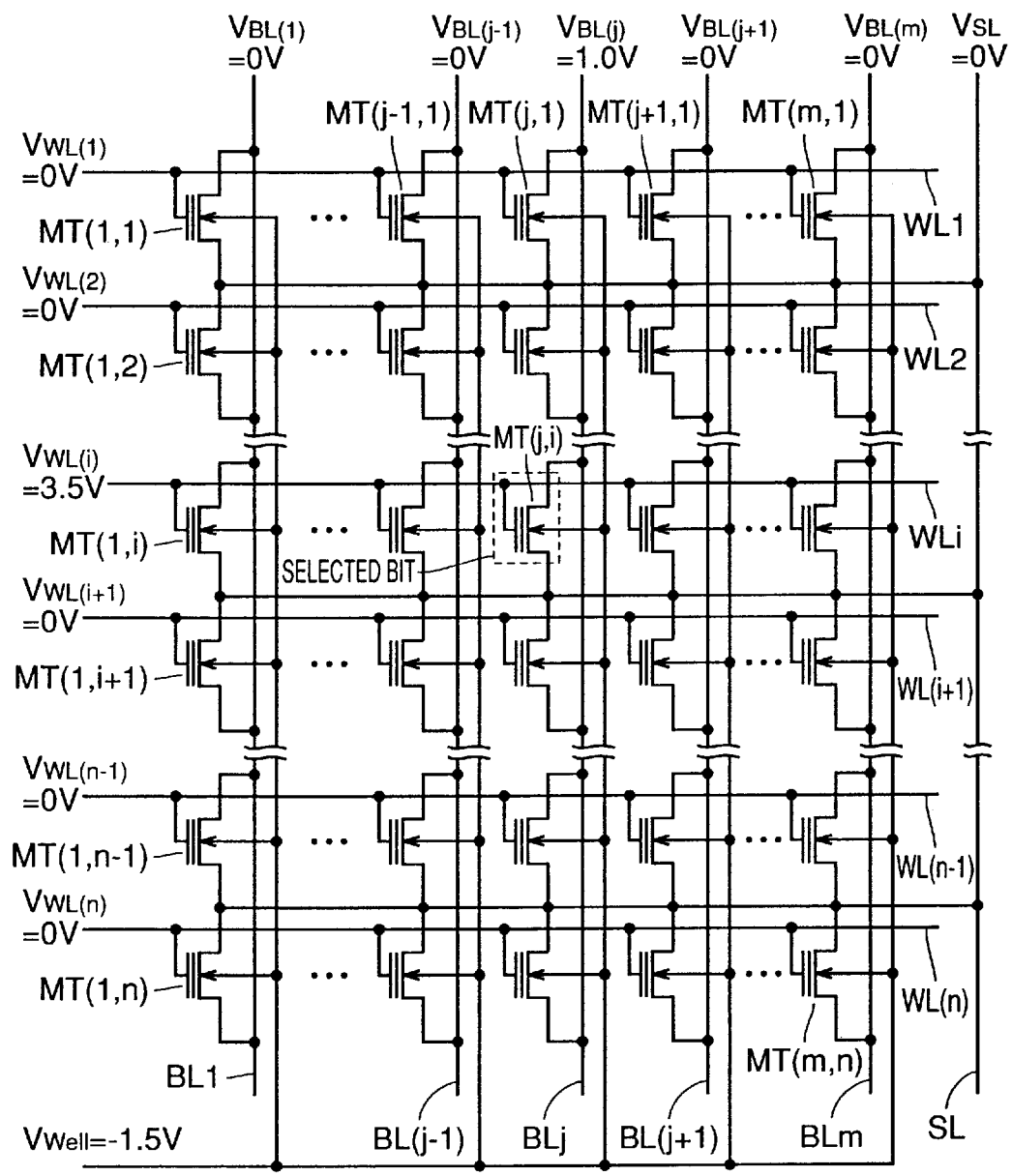
FIG. 11 is a circuit diagram showing setting of the voltages applied to the memory block in an erase verify operation according to a third embodiment.

FIG. 11 is a circuit diagram showing setting of voltages applied to a memory block for erase verify in a third embodiment.

Referring to FIG. 11, the memory block includes memory transistors which are arranged in n rows and m columns, and each have a floating gate. Word lines WL1–WLn are provided for selecting the memory cells in the respective rows. Drains of the memory transistors in the respective columns are connected to bit lines BL1–BLm.

The source of each memory transistor included in the memory block is connected to source line SL, which carries source potential $V_{SL}$. The memory transistors in the single memory block are formed in a common well, which is supplied with well potential $V_{well}$.

Word line WLi for selecting the memory transistor corresponding to the selected bit is supplied with 3.5 V. The other word lines are supplied with 0 V. Bit line BLi connected to the drain of the memory transistor corresponding to the selected bit is supplied with 1.0 V, and the other bit lines are supplied with 0 V. Source line potential $V_{SL}$ is set to 0 V, and well potential $V_{well}$ is set to -1.5 V.

Figure 12:
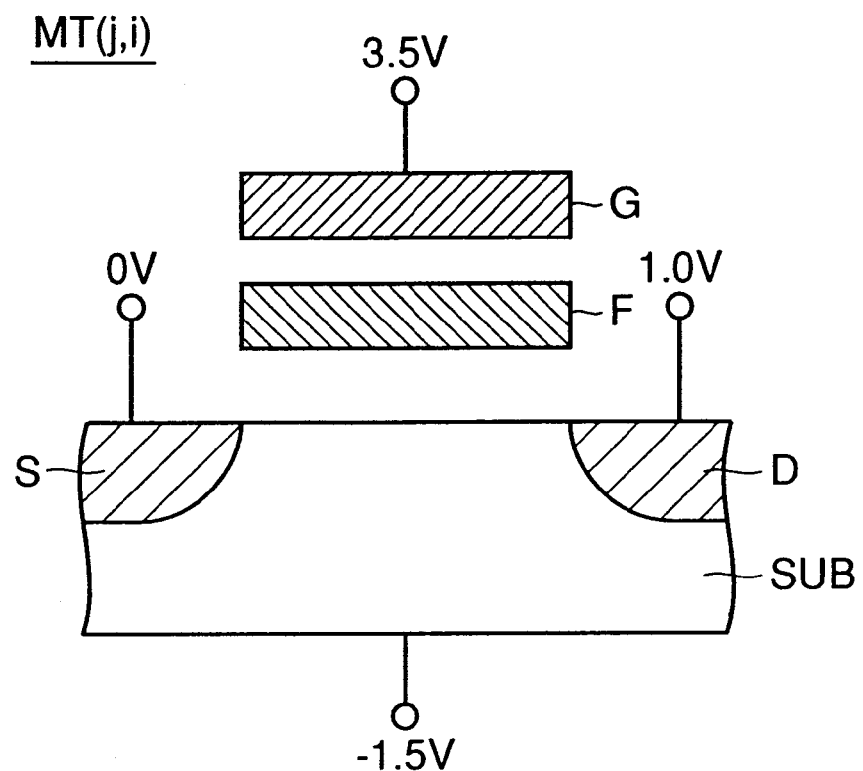
FIG. 12 shows potentials applied to the transistor selected in the circuit diagram of FIG. 11.

FIG. 12 shows potentials applied to the transistor selected in the circuit diagram of FIG. 11.

Referring to FIG. 12, the gate of the selected memory transistor is supplied with 3.5 V, and the source is supplied with 0 V. The drain is supplied with 1.0 V, and the substrate is supplied with -1.5 V.

Thus, the potential on the substrate portion, i.e., well potential $V_{well}$ can be set below 0 V during a verify read operation.

Figure 13:
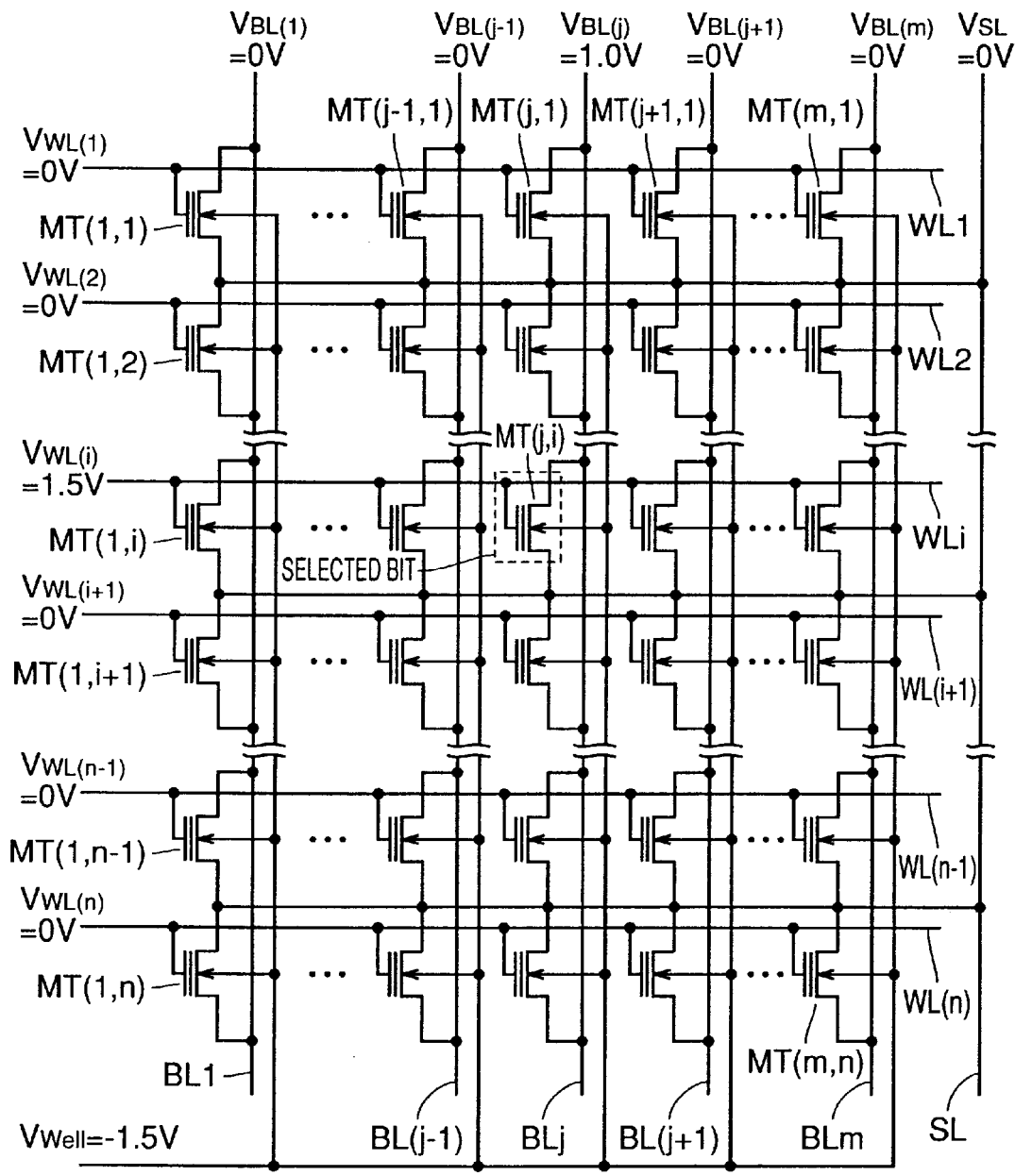
FIG. 13 is a circuit diagram showing voltage setting in the memory block for an over-erase verify in the third embodiment.

FIG. 13 is a circuit diagram showing voltage setting of the memory block during a over-erase verify operation in the third embodiment.

Referring to FIG. 13, word line WLi for selecting the memory transistor corresponding to the selected bit is supplied with 1.5 V, and the other word lines are supplied with 0 V. Bit line BLj which is connected to the drain of the memory transistor corresponding to the selected bit is supplied with 1.0 V, and the other bit lines are supplied with 0 V. Source line potential $V_{SL}$ is set to 0 V, and well potential $V_{well}$ is set to 1.5 V.

Figure 14:
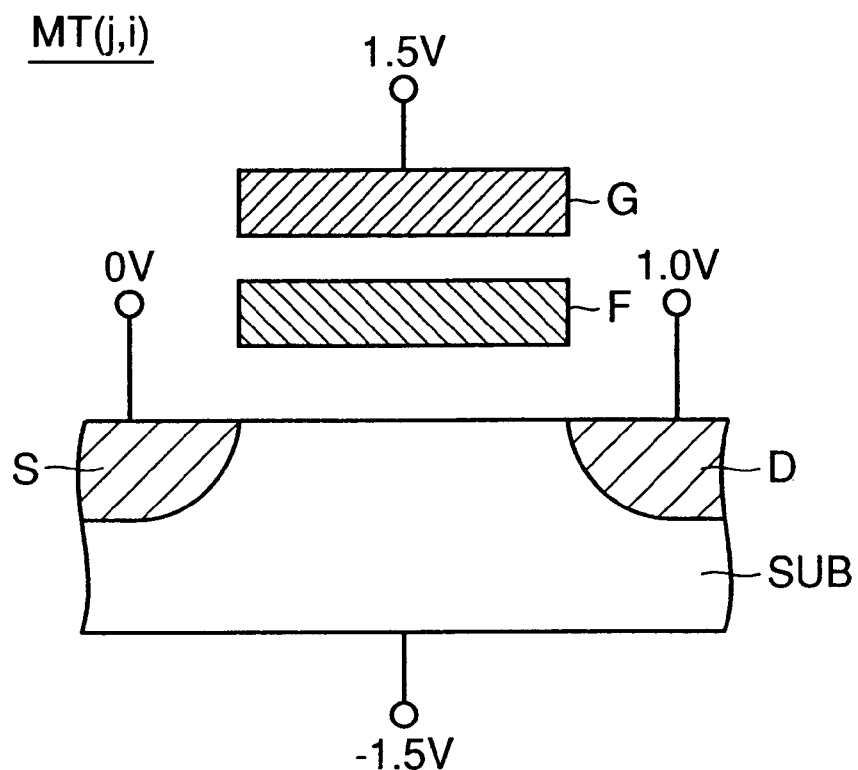
FIG. 14 shows potentials in the memory transistor corresponding to the selected bit shown in FIG. 13.

FIG. 14 shows potentials set in the memory transistor corresponding to the selected bit shown in FIG. 13.

Referring to FIG. 14, the gate of the selected memory transistor is supplied with 1.5 V, the source thereof is supplied with 0 V, and the drain is supplied with 1.0 V. The well is supplied with -1.5 V.

Referring to FIG. 14, the gate of the selected memory transistor is supplied with 1.5 V, the source is supplied with 0 V and the well is supplied with -1.5 V.

Figure 15:
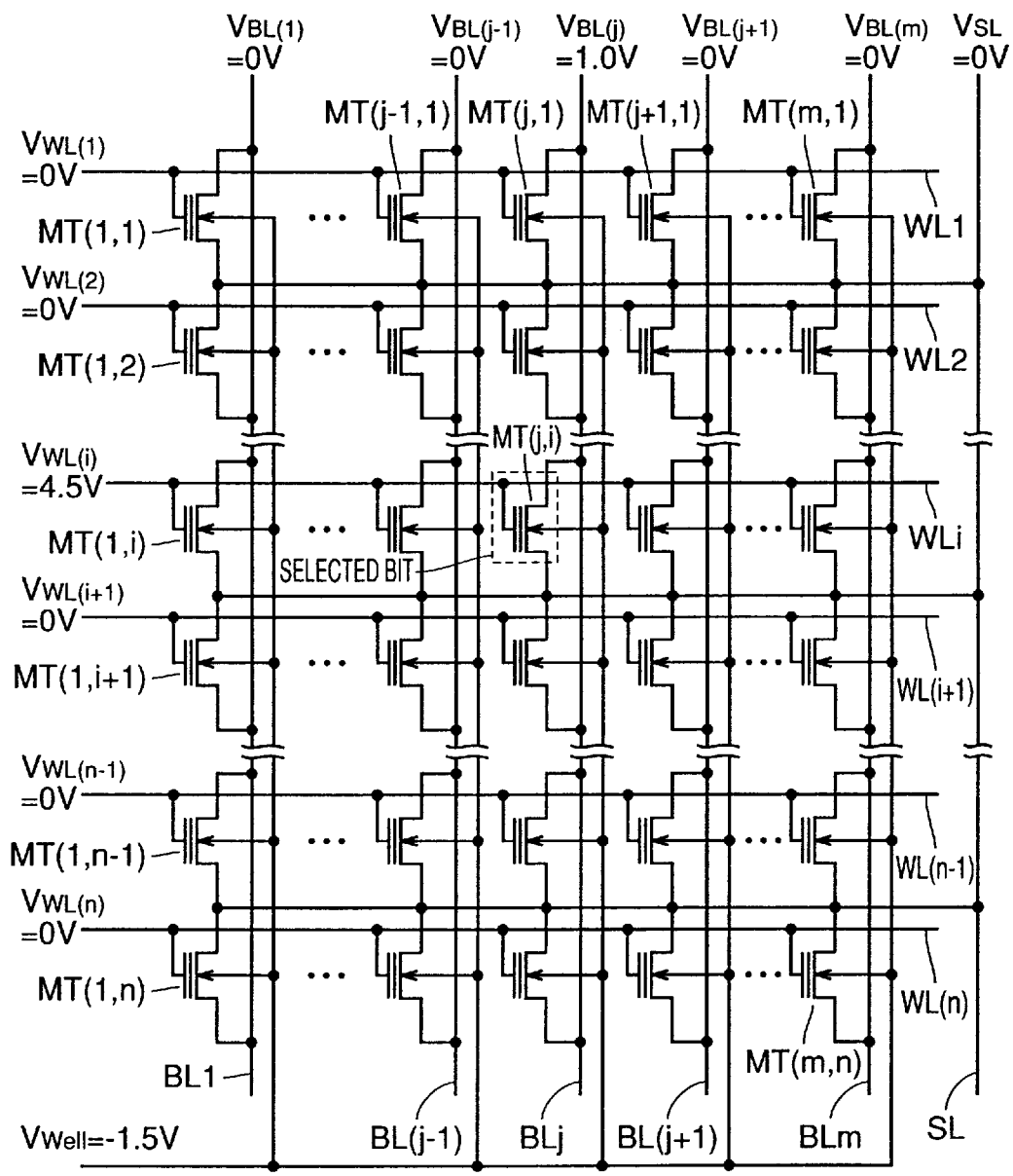
FIG. 15 is a circuit diagram showing voltage setting in a read operation of the third embodiment.

FIG. 15 is a circuit diagram showing voltage setting in the read operation of the third embodiment.

Referring to FIG. 15, word line WLi for selecting the memory transistor corresponding to the selected bit is supplied with 4.5 V. The other word lines are supplied with 0 V. Bit line BLi connected to the drain of the memory transistor corresponding to the selected bit is supplied with 1.0 V, and the other bit lines are supplied with 0 V. Source line potential $V_{SL}$ is set to 0 V, and well potential $V_{well}$ is set to -1.5 V.

Figure 16:
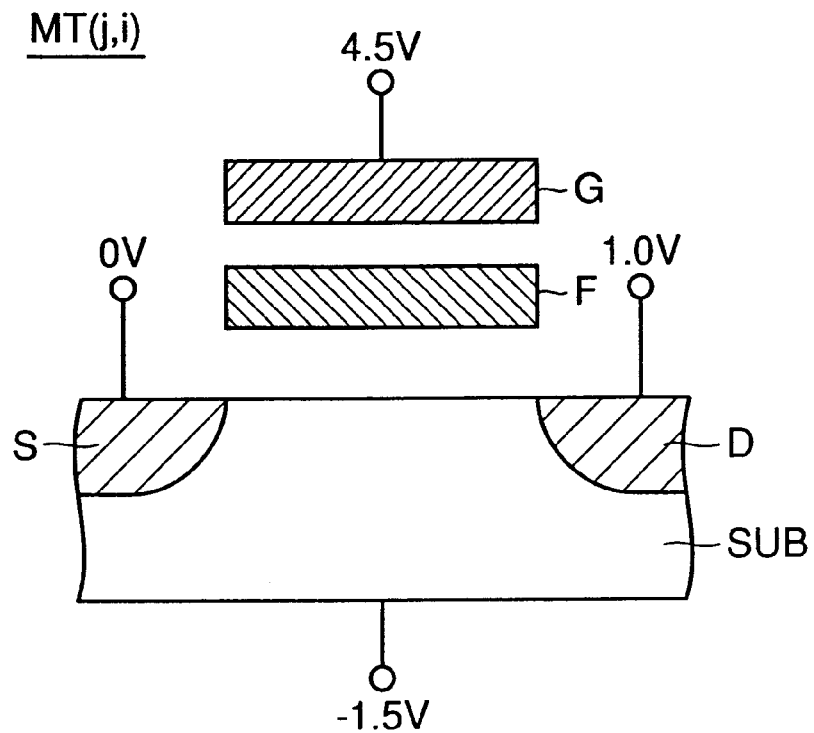
FIG. 16 shows potentials in the memory transistor corresponding to the selected bit in the read operation.

FIG. 16 shows potentials set in the memory transistor corresponding to the selected bit in the read operation.

In the read operation, as shown in FIG. 16, the gate of the selected memory transistor is supplied with 4.5 V, and the source is supplied with 0 V. The drain is supplied with 1.0 V, and the well is supplied with -1.5 V.

Figure 17:
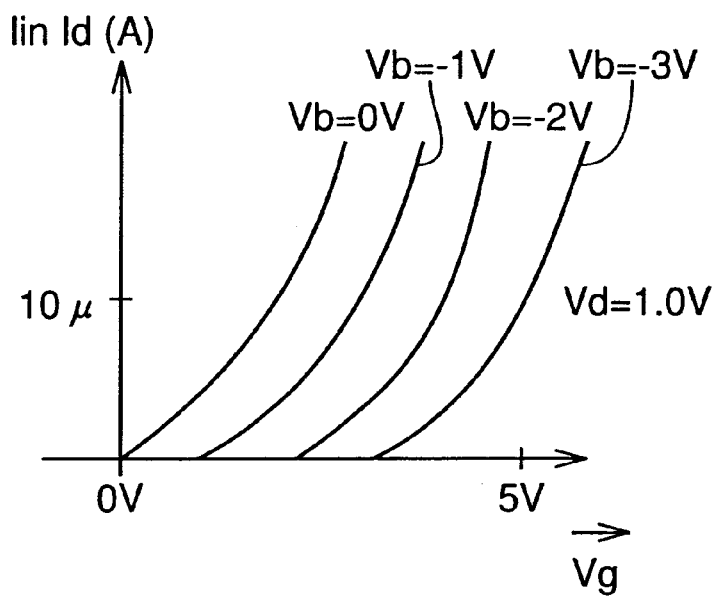
FIG. 17 shows a dependence of a gate potential and a drain current on a substrate potential of the memory transistor having a threshold voltage Vth set to 2.0 V defined at Vb=0 V.

FIG. 17 shows a dependence of the gate potential and the drain current of the memory transistor on the substrate potential in the case where threshold voltage Vth is 2.0 V defined at Vb=0 V.

Figure 18:
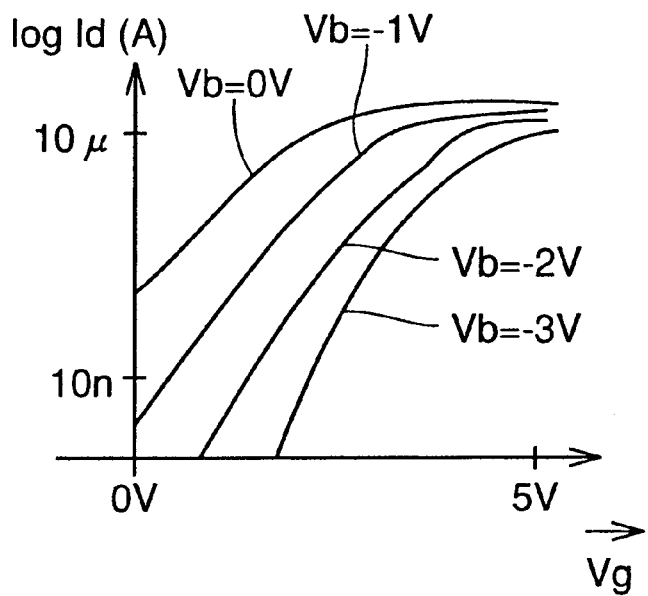
FIG. 18 shows the dependence in FIG. 17 expressed on a logarithmically scaled ordinate.

FIG. 18 shows the dependence in FIG. 17 expressed on a logarithmically scaled ordinate.

As shown in FIGS. 17 and 18, a sub-threshold factor (S. factor) is decreased by applying a negative potential to the substrate portion.

Figure 19:
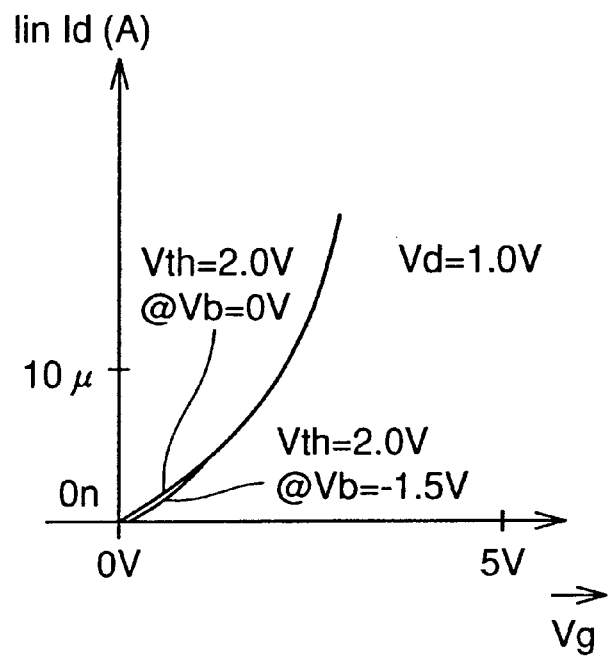
FIG. 19 shows relationships between the gate potential and the drain current in the case where substrate potential Vb is 0 V and threshold voltage Vth is 2.0 V, and in the case where substrate potential Vb is −1.5 V and threshold voltage Vth is 2.0 V.
Figure 20:
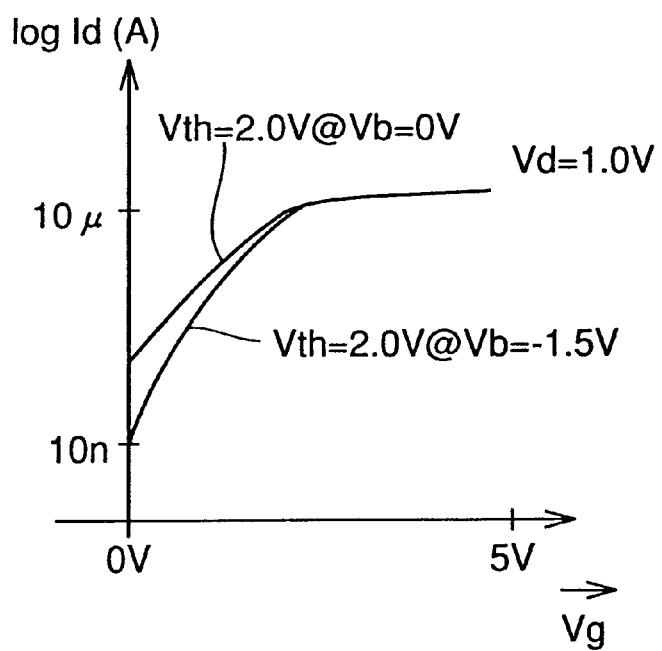
FIG. 20 shows the relationships in FIG. 19 expressed on a logarithmically scaled ordinate.

FIGS. 19 and 20 show the relationships between the gate potential and the drain current in the case where the substrate potential is 0 V and the threshold voltage Vth is 2.0 V, and in the case where substrate potential Vb is -1.5 V and threshold voltage Vth is 2.0 V.

As shown in FIGS. 19 and 20, when substrate potential Vb is negative, the sub-threshold factor is smaller than that in the case where substrate potential Vb is 0 V so that the off-leak current, i.e., drain current Id which flows when the gate potential is 0 V can be smaller the latter case employing the same threshold voltage.

According to the above operations, it is possible to avoid malfunctions, which may occur during verifying and reading in the prior art due to the total sum of the off-leak currents of the unselected cells on the same bit line.

By employing a combination with the first and second embodiments, the distribution width of threshold voltages during the erase verify can be narrow so that the time required for the over-erase recovery and the verify thereof can be reduced, and the total time for completing the erasing can be reduced.

Although the N-type flash memory has been described by way of example, similar effects can be achieved in a P-type flash memory by applying a positive potential to the substrate portion, i.e., well.

As described above, the sub-threshold factor in the characteristics of the gate potential and drain current of the memory cells can be reduced by applying the negative potential to the substrate portion, whereby the off-leak can be suppressed more effectively even with the same the threshold voltage.

Thereby, it is possible to prevent the malfunction in over-erase recovery, which may be caused due to the total sum of the off-leak currents of the unselected memory transistors on the same bit line, in the operations of verifying and reading the memory transistor having a low threshold voltage. Since the distribution width of the threshold voltages can be narrow, the time required for the over-erase recovery and the verify thereof can be reduced, and the total time required for the erasing can be reduced.

[Fourth Embodiment]

In the first to third embodiments, the operation called "program before erasure" is effected as the base of the operations on the memory cell region (block) to be erased as already described. This operation is executed by applying the voltage, which corresponds to the voltage to be applied on a block by block basis in the programming operation, to the memory cells in the selected block to be erased. By the operation of program before erasure, the memory cells in the erased state are set to the programmed state before applying the erase pulse, whereby it is possible to prevent such a situation that threshold voltage Vth excessively lowers to cause the over-erased state when the erase pulse is applied.

The second embodiment employs the step, in which the voltage pulse of a smaller intensity than that for the block program before erasure is applied in combination with the erase pulse, and this step is repeated while verifying the erased state.

This operation of applying the combination of the erase pulse and the block program pulse can significantly reduce the number of memory cells, which have excessively lowered threshold voltages and therefore are in the over-erased state, compared with the conventional case of applying only the erase pulse.

However, even if steps S4 and S20 in FIG. 6 are repeated for reducing the number of memory cells in the over-erased state, it is difficult in some cases to keep the threshold voltages of all the memory transistors within a predetermined range due to variations in memory cell characteristics.

Figure 21:
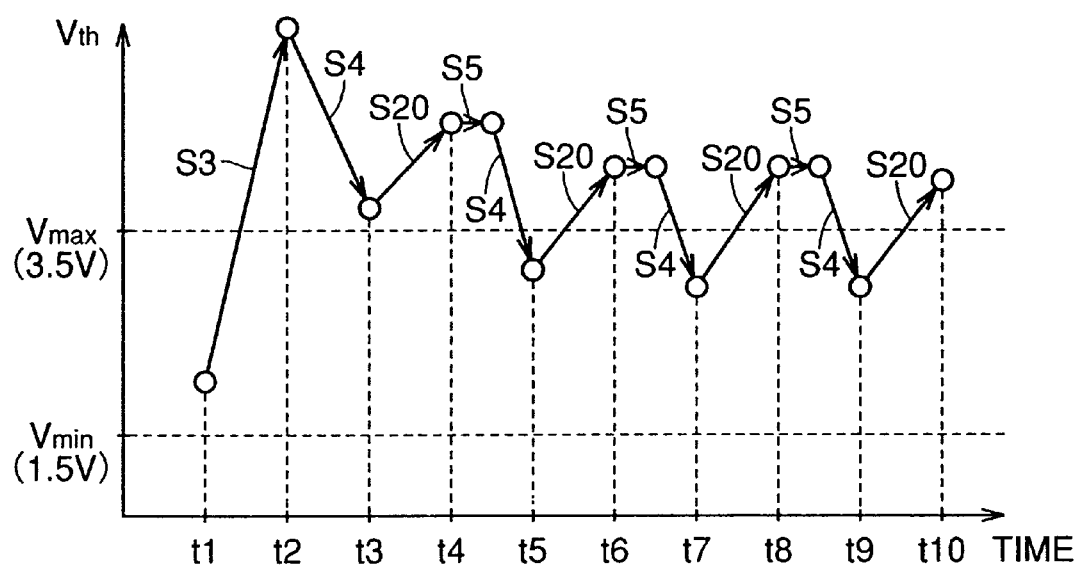
FIG. 21 shows changes in threshold voltage of a memory transistor which cannot be kept within a set threshold voltage range without difficulty.

FIG. 21 shows changes in threshold voltage of the memory transistor which cannot be kept within a set threshold voltage range without difficulty.

Referring to FIGS. 6 and 21, description will now be made on the case where the memory cell was in the erased state, and therefore had a low threshold voltage before the erase command is applied at time t1.

At time t2, the memory transistor is set by the block program before erasure in step S3 to the state where the threshold voltage is much higher than the allowed upper limit Vmax (3.5 V) of the erase determining voltage. Subsequently, the erase pulse is applied to the same memory transistor in step S4 so that the threshold voltage slightly lowers at time t3, and approaches allowed upper limit Vmax (3.5 V) of the erase determination voltage.

Then, the block program pulse is applied in step S20 so that the threshold voltage increases again to expand a difference from the erase determination voltage Vmax at time t4. In step S5, erase verify is performed. Due to the present of this memory transistor, it is determined by the erase verify that the block is not erased.

When the erase pulse is applied again in step S4, the threshold voltage decreases, and temporarily becomes lower than the determination voltage of Vmax. However, the block program pulse is applied in step S20. Therefore, the threshold voltage exceeds the determination value of Vmax again at time t6. The erase verify is executed in step S5, and the it is determined that the erasing is not yet completed.

The memory transistors exhibit variations in tunnel efficiency and amount of charges accumulated in the floating gate due to variations in the manufacturing process. Therefore, such a memory transistor is present that the lowering of the threshold voltage caused by the application of the erase pulse in step S4 is balanced at the vicinity of the determination potential of Vmax with the rising of the threshold voltage caused by the application of the block program pulse in step S20. If the above memory transistor is determined at time t6 as being in the incompletely erased state, it is determined again as being in the incompletely erased state at time t8 after steps S4 and S20, and the processing repeats steps S4, S20 and S5 many times, and thus enters a so-called infinite loop in the worst case.

Figure 22:
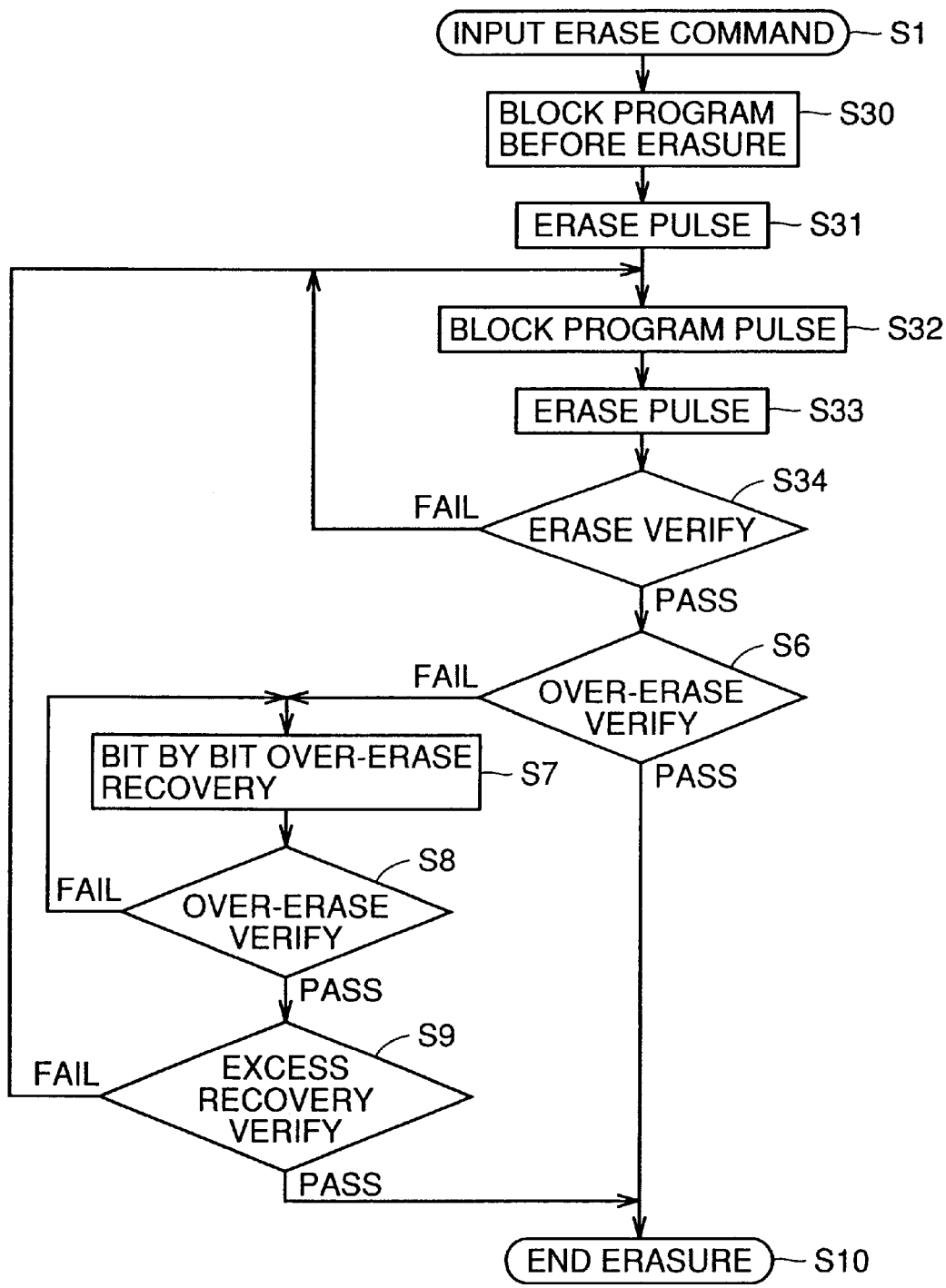
FIG. 22 is a flow chart showing an erase sequence executed in a nonvolatile semiconductor memory device of a fourth embodiment.

FIG. 22 is a flowchart showing the erase sequence which is performed in the nonvolatile semiconductor memory device of the fourth embodiment.

Figure 23:
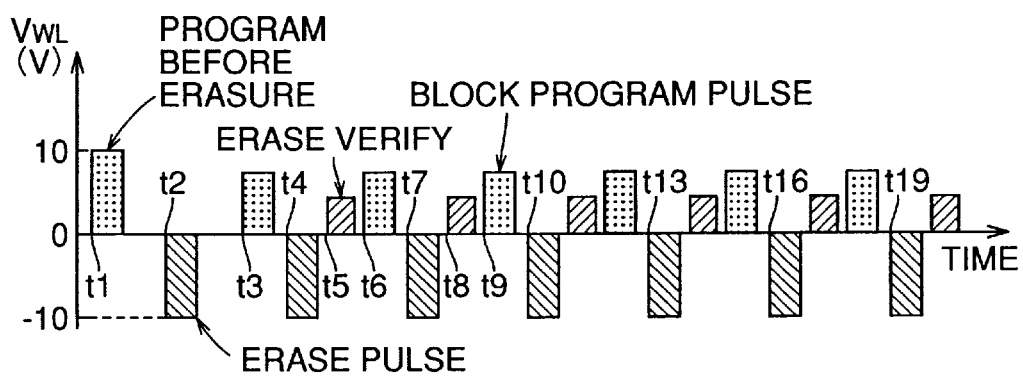
FIG. 23 is a waveform diagram showing changes in gate voltage of the memory transistor, i.e., changes in word line potential $V_{WL}$ in the erase operation according to the sequence of the flowchart shown in FIG. 22.

The sequence in the flowchart of FIG. 22 differs from the erase sequence in the flowchart of the second embodiment shown in FIG. 6 in that steps S30–S34 are employed instead of steps S3, S4, S20 and S5. Steps S6–S10 are the same as those in the flowchart shown in FIG. 6, and therefore description thereof is not repeated. FIG. 23 is a waveform diagram showing changes in gate voltage of the memory transistor, i.e., word line potential $V_{WL}$ which occur when the erasing is performed in accordance with the sequence of the flowchart shown in FIG. 22.

Figure 24:
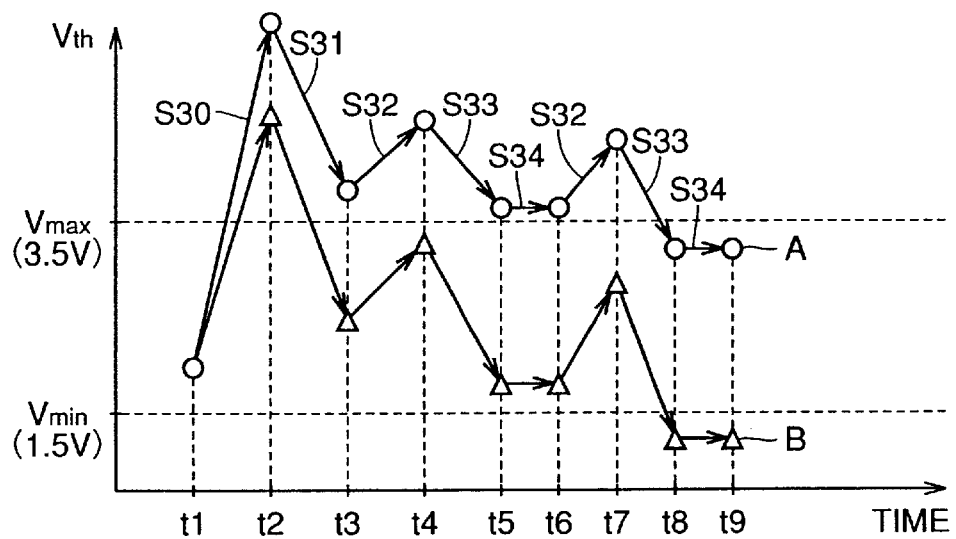
FIG. 24 is a waveform diagram showing changes in threshold voltage of the memory transistor in the erase operation according to the sequence of the flowchart shown in FIG. 22.

FIG. 24 shows changes in threshold voltage of the memory transistors in the erase sequence according to the flowchart shown in FIG. 22.

Figure 65:
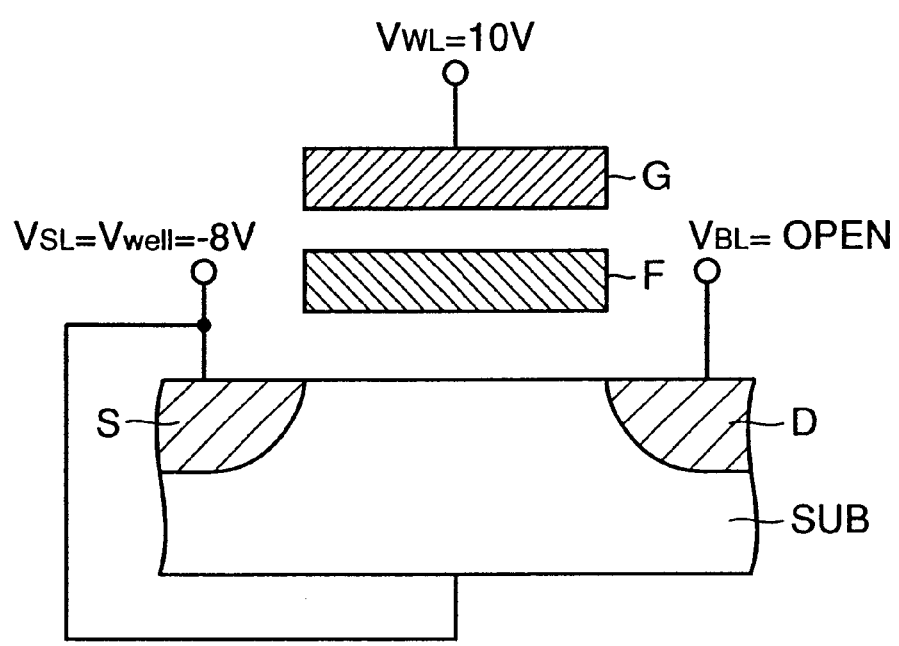
FIG. 65 shows voltages applied to the memory transistor when performing the block program before erasure shown in FIG. 64.
Figure 66:
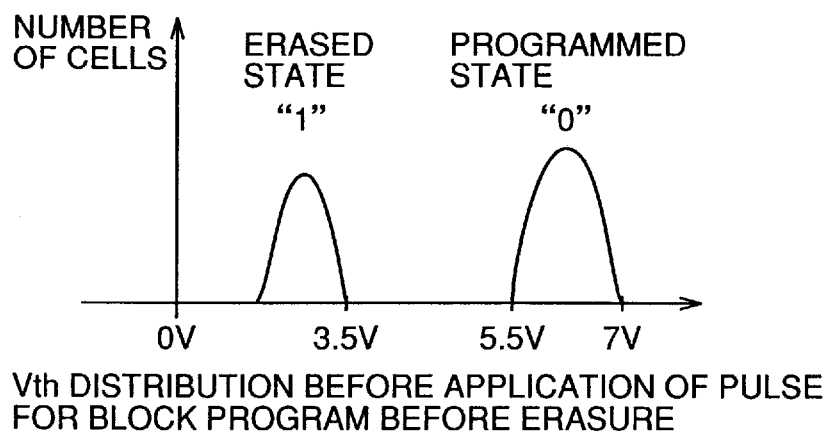
FIG. 66 shows a distribution of the threshold voltages before performing the block program before erasure in step S131 of the erase sequence shown in FIG. 63.
Figure 67:
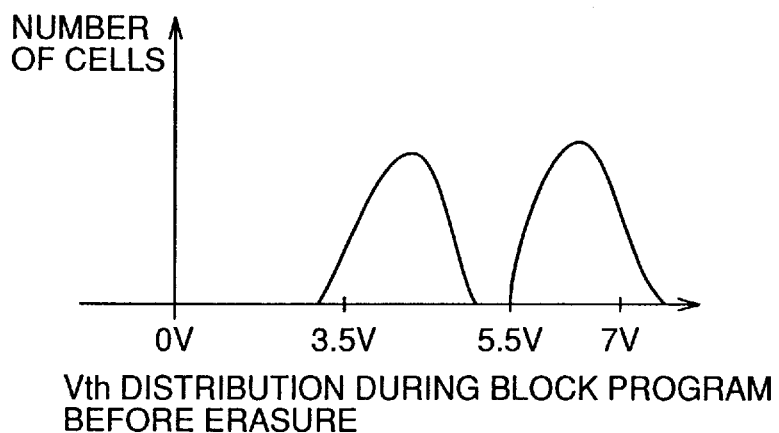
FIG. 67 shows a distribution of the threshold voltages of the memory transistor during the block program before erasure operation.

Referring to FIGS. 23 and 24, the block program before erasure in step S30 shown in FIG. 22 is performed at time t1 so that the gate potential of the memory transistor is set to 10 V. At this time, as shown in FIG. 65, the source and well potentials are set to −8 V, and the bit line is set to the open state. By this application of the program pulse, the threshold voltage exceeds the erase determination voltage of Vmax for the erase verify, as can be seen at times t1–t2 in FIG. 24. In FIG. 24, "A" indicates a behavior of the threshold voltage of memory transistor having the threshold voltage, which cannot be changed easily, in the memory block to be erased, and "B" indicates a behavior of the threshold voltage of memory transistor having the threshold voltage, which can be easily changed, in the same memory block.

Figure 49:
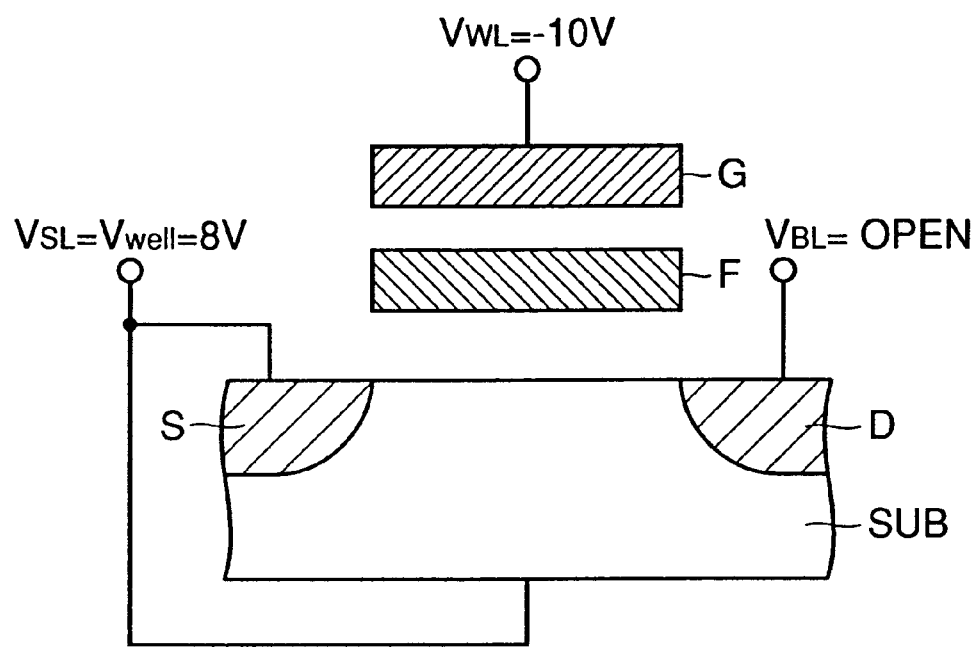
FIG. 49 shows voltages applied to the memory transistor when the erase pulse is applied.

Referring to FIG. 23 again, application of the erase pulse in step S31 shown in FIG. 22 starts at time t2. At this point of time, the word line potential is set to −10 V, e.g., as shown in FIG. 49. Also, the source potential and the well potential are set to 8 V, and the bit line is set to the open state.

In accordance with application of the erase pulse, the threshold voltage decreases at times t2–t3 in FIG. 24.

At time t3, the block program pulse is applied in step S32. This block program pulse has a smaller intensity than that for the block program before erasure in step S3. This application of the block program pulse raises the threshold voltage again, as can be seen at times t3–t4 in FIG. 24.

At time t4, an erase pulse is applied in step S33. This application of the erase pulse reduces the threshold voltage again as can be seen at times t4–t5 in FIG. 24.

Figure 51:
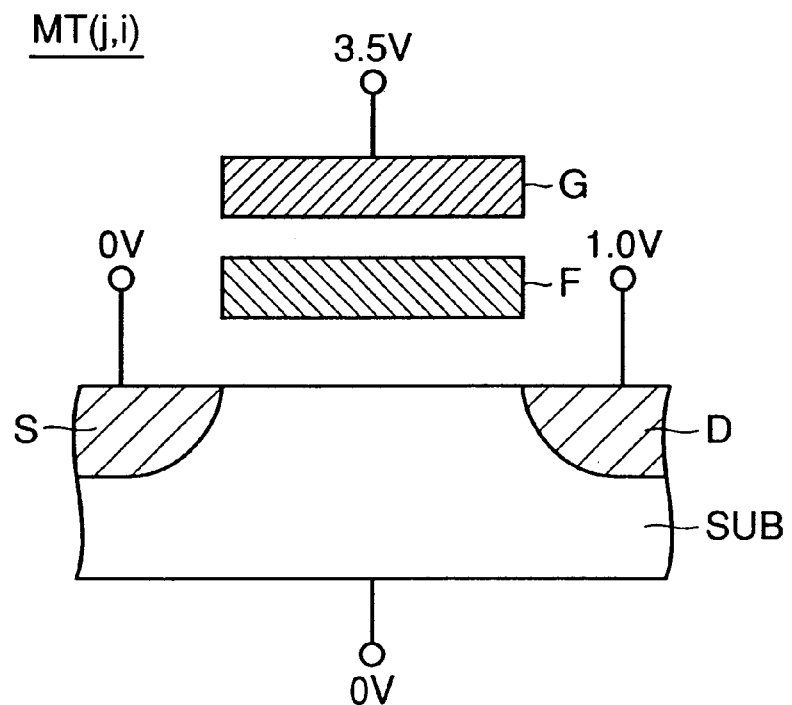
FIG. 51 shows voltages applied to the memory transistor corresponding to a selected bit in FIG. 50.
Figure 52:
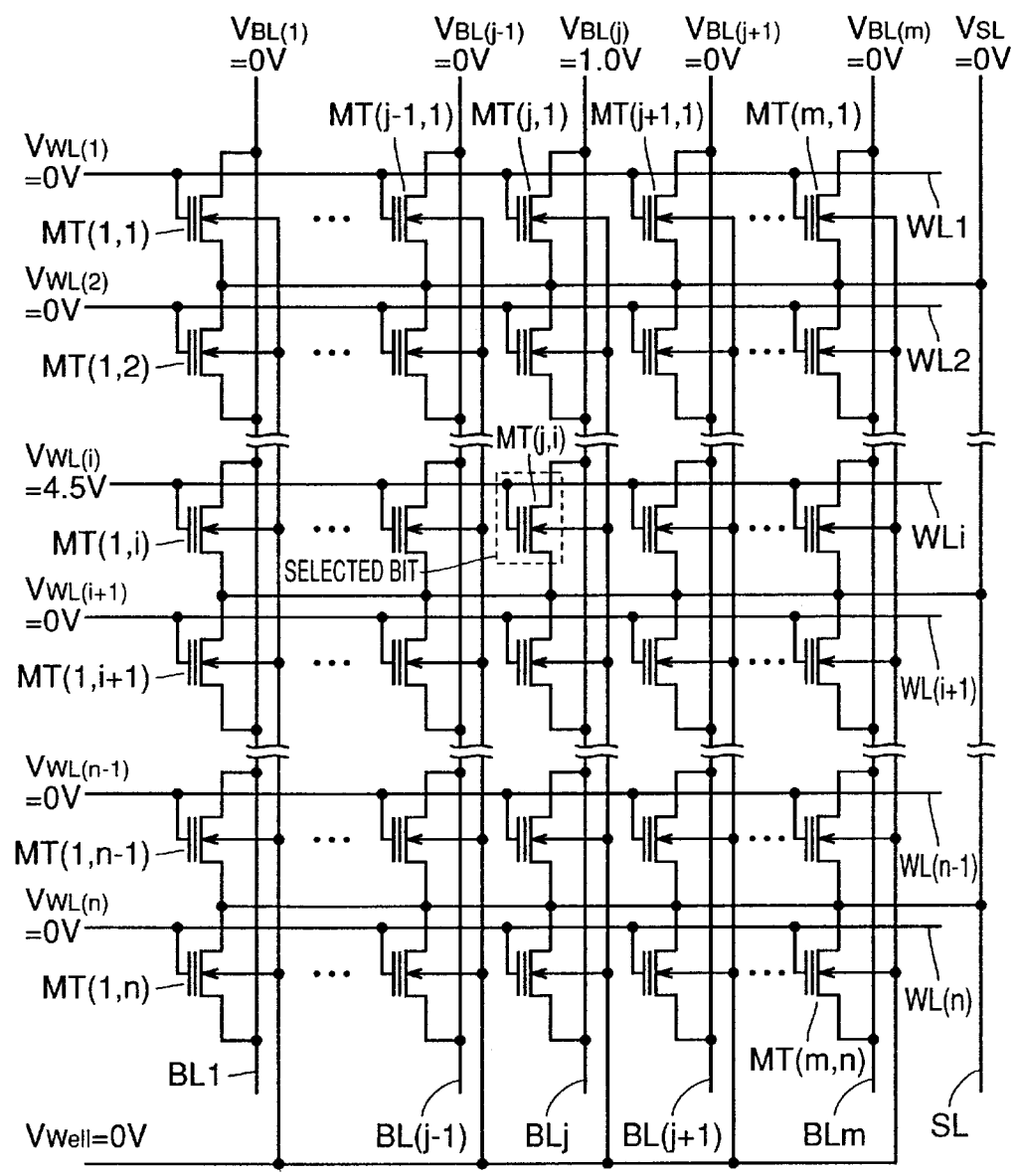
FIG. 52 is a circuit diagram showing voltage setting in a read operation of a flash memory in the prior art.
Figure 53:
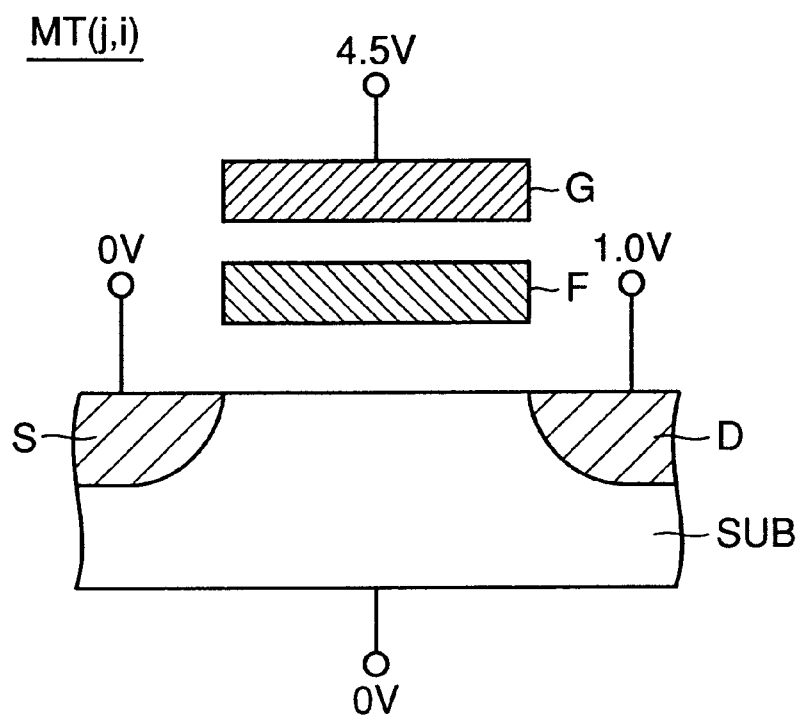
FIG. 53 shows potentials applied to the memory transistor which is selected in the read operation shown in FIG. 52.
Figure 54:
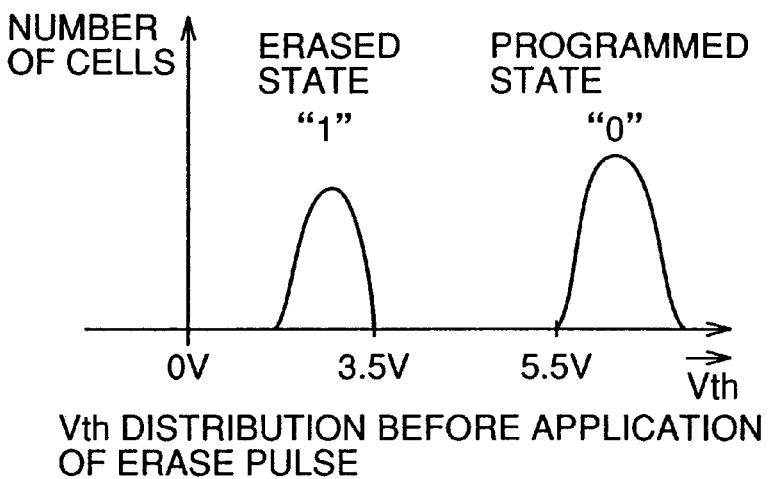
FIG. 54 shows a distribution of threshold voltages before application of the erase pulse.
Figure 55:
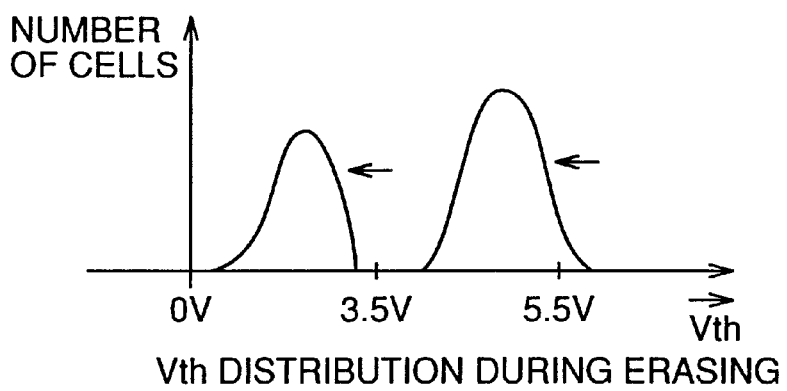
FIG. 55 shows an incompletely erased state where data of all bits are not completely erased although the erase pulse is applied in the erase sequence shown in FIG. 47.
Figure 56:
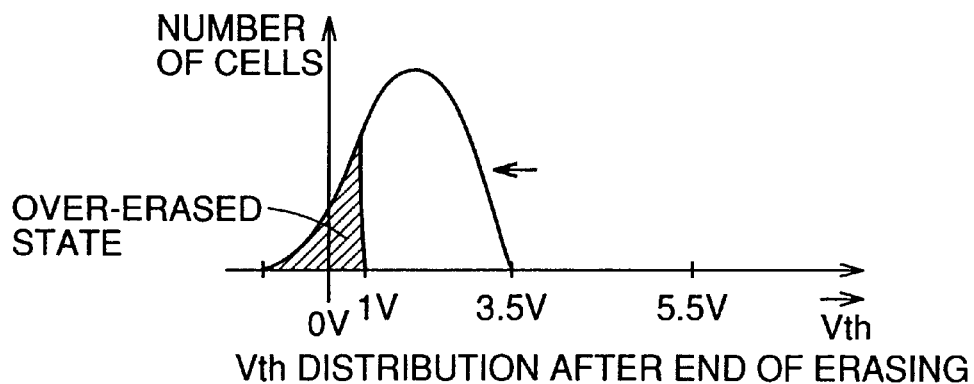
FIG. 56 shows a distribution of the threshold voltages exhibited when the erase verify in step S103 shown in FIG. 47 is passed.
Figure 57:
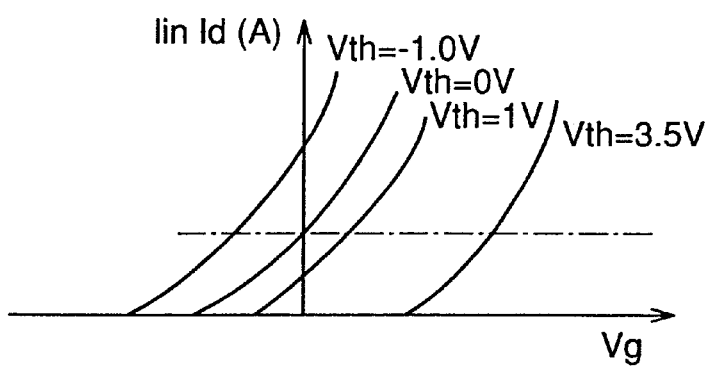
FIG. 57 shows characteristics of gate voltages and drain currents of the memory transistors having various threshold voltages in the erased state.
Figure 58:
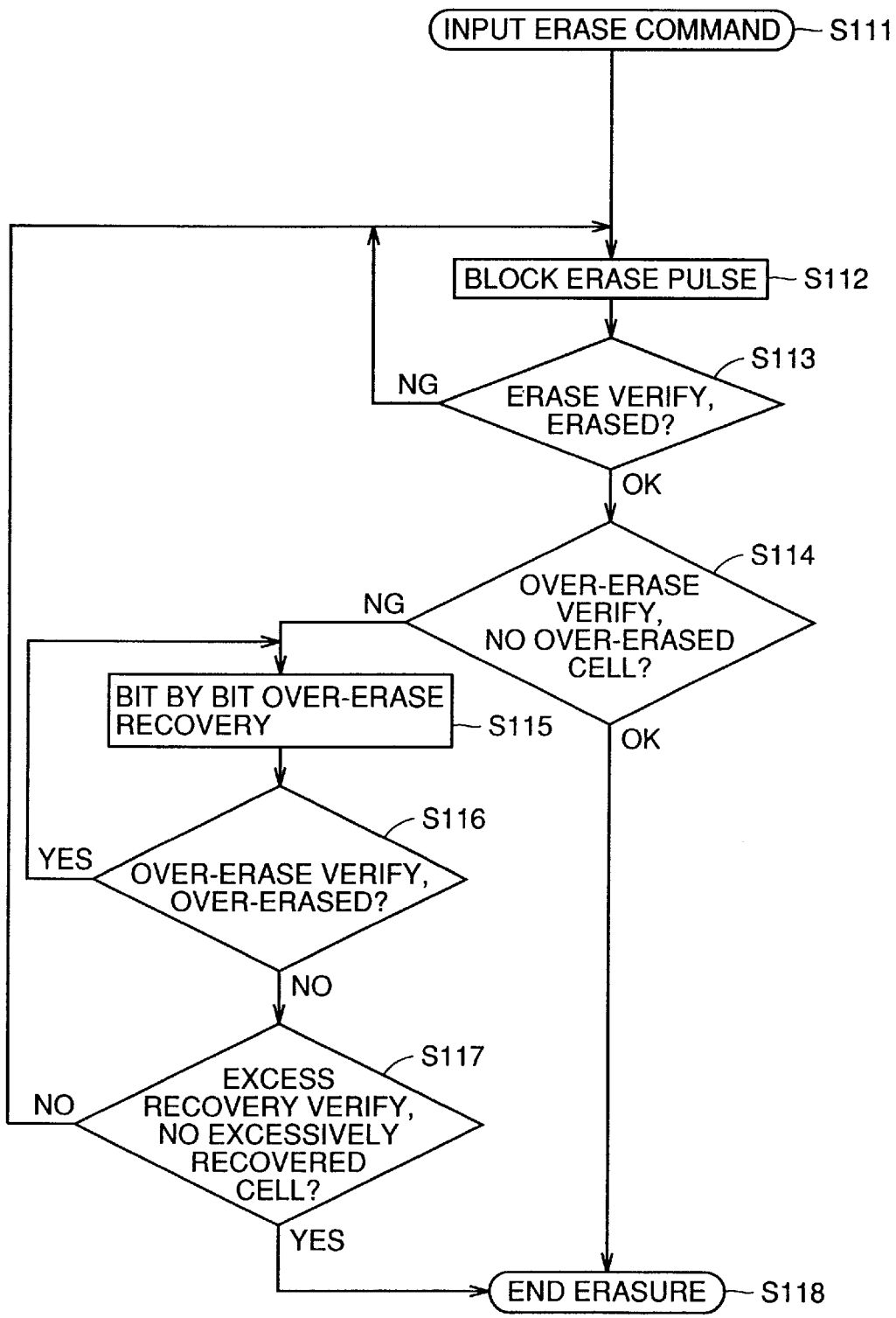
FIG. 58 is a flowchart showing a flow employing countermeasures against the problem of over-erasing of the erase sequence shown in FIG. 47.

At time t5, the erase verify in step S34 is executed. In the erase verify, the potential on word line is set, e.g., to 3.5 V as already described in FIG. 51. Also, the source potential and well potential are set to 0 V, and the potential on bit line is set to 1.0 V. However, the threshold voltage of memory transistor indicated at "A" in FIG. 24 is still larger than the determination value of Vmax. Therefore, step S32 is executed again according to the flowchart of FIG. 22.

At time t6, application of the block program pulse in step S32 starts. As indicated at times t6–t7 in FIG. 24, application of the block program pulse increases the threshold voltage again. At subsequent time t7, the erase pulse is applied in step S33 so that the threshold voltage decreases again, and the memory transistor indicated by "A" passes the erase verify in step S34, as can be seen at times t7–t8 shown in FIG. 24. The memory transistor indicated by "B" has the threshold voltage lower than a determination voltage of Vmin (1.5 V), and therefore will be selectively subjected to the over-erase recovery.

In addition to the above situation, there may be a memory transistor which cannot be erased easily, and the threshold voltage thereof may be larger than the determination value of Vmax in the verify operation. In this case, application of the block program pulse, the erase pulse and the pulse for erase verify is repeated as can be seen at and after time t10 in FIG. 23, and the processing in steps S32–S34 continues until the threshold voltages of a majority of the memory transistors in the memory block to be erased lower to or below the erase determination potential of Vmax.

As described above, the erase pulse is applied in step S33 after applying the block program pulse in step S32, and then the erase verify is executed in step S34. Thereby, even the memory transistor having the threshold voltage, which repetitively increases and decreases around the determination value of Vmax as shown in FIG. 21, can pass the erase verify in step S34.

Accordingly, it is possible to reduce the number of pulses to be applied after entry of the erase command and before completion of the erase verify, and the erase time can be reduced.

[Modification of Fourth Embodiment]

Figure 25:
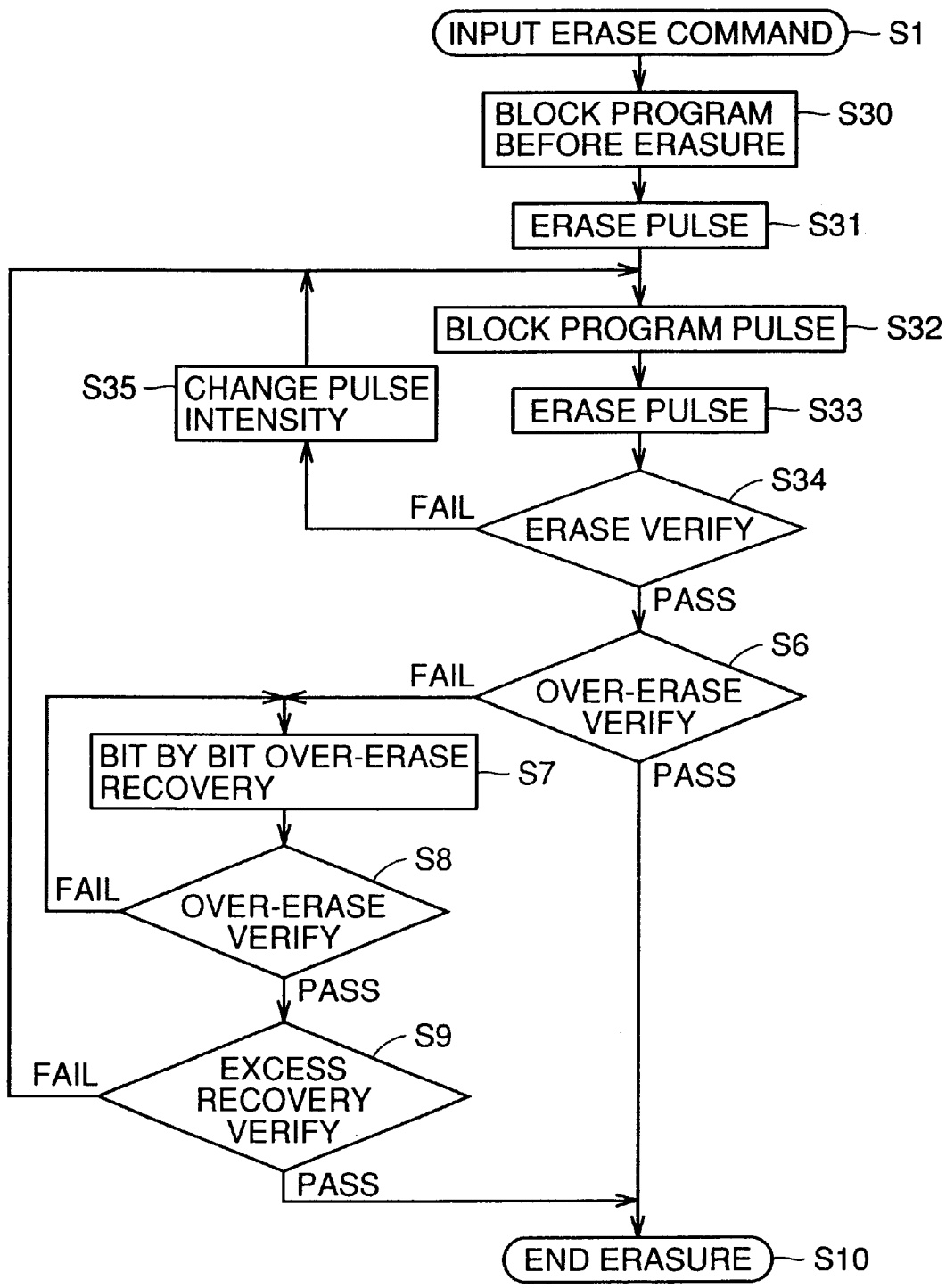
FIG. 25 is a flowchart showing a modification of the erase sequence of a nonvolatile semiconductor memory device according to the fourth embodiment.

FIG. 25 is a flowchart showing the modification of the erase sequence of the nonvolatile semiconductor memory device of the fourth embodiment.

A flowchart shown in FIG. 25 includes the same steps as those in the flowchart of the fourth embodiment shown in FIG. 22, and further includes step S35 for changing the pulse intensity when the erase verify in step S34 is failed, i.e., when it is determined that the erasure is incomplete. The other steps are the same as those in the flowchart shown in FIG. 22, and therefore description thereof is not repeated.

Figure 26:
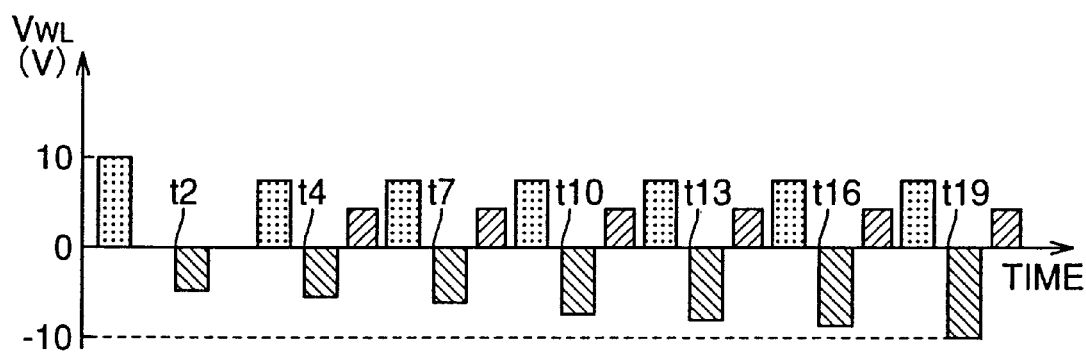
FIG. 26 is a waveform diagram showing an erase operation according to the flowchart in FIG. 25, and particularly showing changes in word line potential.

FIG. 26 is a waveform diagram showing the erase operation according to the flowchart in FIG. 25, and particularly showing changes in word line potential.

Referring to FIGS. 25 and 26, the erase pulse which is applied in step S31 at time t2 sets, e.g., the word line potential to about −5 V. After the application of the block program pulse in step S32, the erase pulse may be applied in step S33 at time t4, in which case the erase pulse has an absolute value which is larger, e.g., by about 0.5 V than the pulse applied in step S31. When the erase verify in step S34 is failed, the pulse intensity is increased in absolute value by about 0.5 V in step S35, and correspondingly the erase pulse of the increased intensity is applied in next step S33 as can be seen at time t7. When the erase verify in step S34 is failed, the intensity of the erase pulse to be subsequently applied is further increased in step S35. In this manner, the intensity of the erase pulse is increased stepwise as can be seen at times t10, t13, t16 and t19. By increasing the erase pulse stepwise as described above, the total times of application of the pulse to be repeated can be reduced. Accordingly, the erase time of the nonvolatile semiconductor memory device can be reduced.

Figure 27:
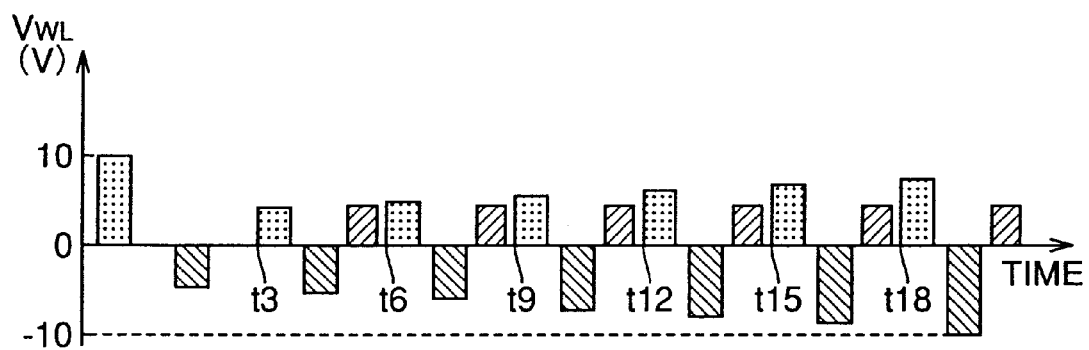
FIG. 27 shows waveforms in the case where a block program pulse is further enhanced stepwise in the waveform shown in FIG. 26.

FIG. 27 shows waveforms in the case where the intensity of the block program pulse is increased stepwise from those in FIG. 26.

FIG. 27 shows that the block program pulse in step S32 which is repetitively applied at and after time t3 is enhanced stepwise in accordance with changes in intensity of the erase pulse. The erase time can be reduced. Further, by adjusting the intensity of the block program pulse, it is possible to narrow further the distribution width of the threshold voltages of the memory transistors after completion of the erase verify in step S34.

As described above, since the distribution width of the threshold voltages is narrowed by utilizing stepwise increase in the intensities of both the block program pulse and the erase pulse at the same time in step S35, the memory cells which are selected bit by bit to be subjected to the over-erase recovery in step S6 of the over-erase verify, and therefore the total erase time can be reduced.

[Fifth Embodiment]

Figure 28:
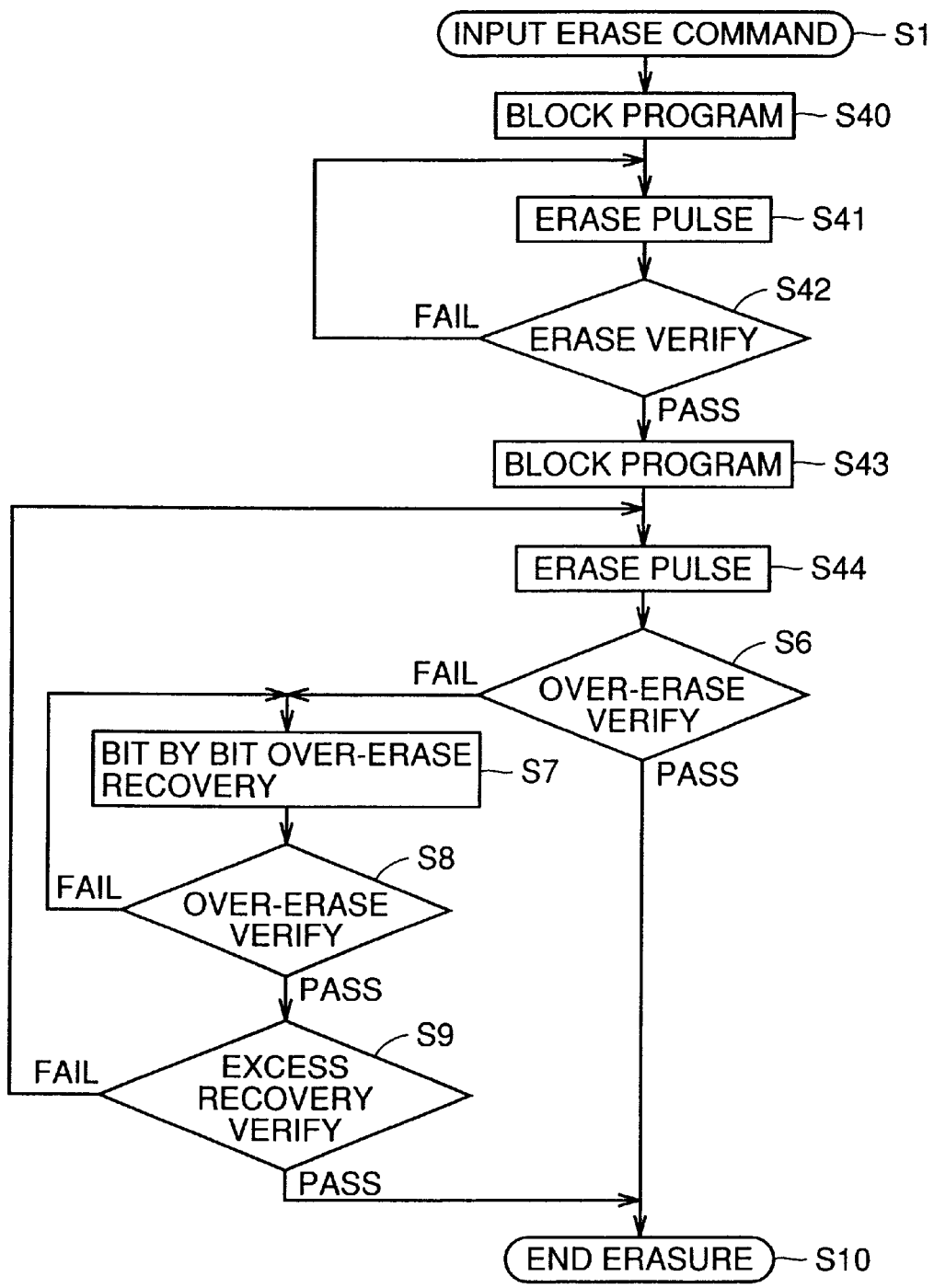
FIG. 28 is a flowchart for showing an erase sequence in a nonvolatile semiconductor memory device according to a fifth embodiment.

FIG. 28 is a flowchart showing the erase sequence in a nonvolatile semiconductor memory device of a fifth embodiment.

Figure 29:
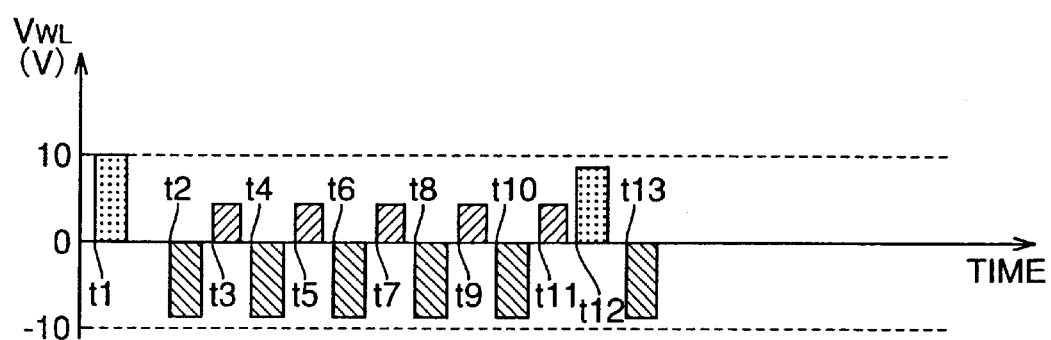
FIG. 29 is a waveform diagram showing changes in word line potential in the case where the erase operation is performed according to the flowchart of FIG. 28.

FIG. 29 is a waveform diagram showing changes in word line potential in the case where erasing is performed according to the flowchart of FIG. 28.

Referring to FIGS. 28 and 29, the erase flow of the fifth embodiment differs from the flowchart of the erase operation shown in FIG. 6 in that steps S40–S44 are employed instead of steps S3, S4, S20 and S5. Steps S6–S10 are the same as those in the flowchart shown in FIG. 6, and therefore description thereof is not repeated.

At time t1, the erase command is entered, and the block program pulse in step S40 is applied.

At subsequent time t2, the erase pulse is applied in step S41. At subsequent time t3, the erase verify is performed in step S42. Since the block, of which erasing is instructed, is not completely erased, the application of the erase pulse in step S41 and the erase verify in step S42 are repeated for a period between times t4 and t10.

At time t11, the erase verify in step S42 is performed. When it is determined that the block to be erased has been completely erased, the processing advances to step S43, and the block program pulse is applied at time t12. This application of the block program pulse narrows the distribution width of the threshold voltages of the memory transistors in the memory block, which have been widely distributed over a range below the erase verify voltage by the erase operations in steps S41 and S42.

At time t13, the erase pulse in step S44 is applied. By appropriately setting the intensity of the erase pulse, it is determined at time t14 in step S6 of the over-erase verify that the over-erased state is present, and it is possible to reduce the number of the memory cells to be subjected to the over-erase recovery bit by bit in and after steps S7.

According to the sequence of the erase operation in the fifth embodiment, as already described, the erasing is first completed in steps S40–S42, and then the wide distribution of the memory cells in the over-erased state is narrowed by the pulse application in steps S43 and S44. In this manner, the memory cells to be subjected to the over-erase recovery bit by bit are reduced in number, and thereby the required time is reduced. Since step of applying the block program pulse is not present during the erase operation in steps S41 and S42, it is possible to reduce the time required before completion of the erase verify in step S42.

[Modification of Fifth Embodiment]

Figure 30:
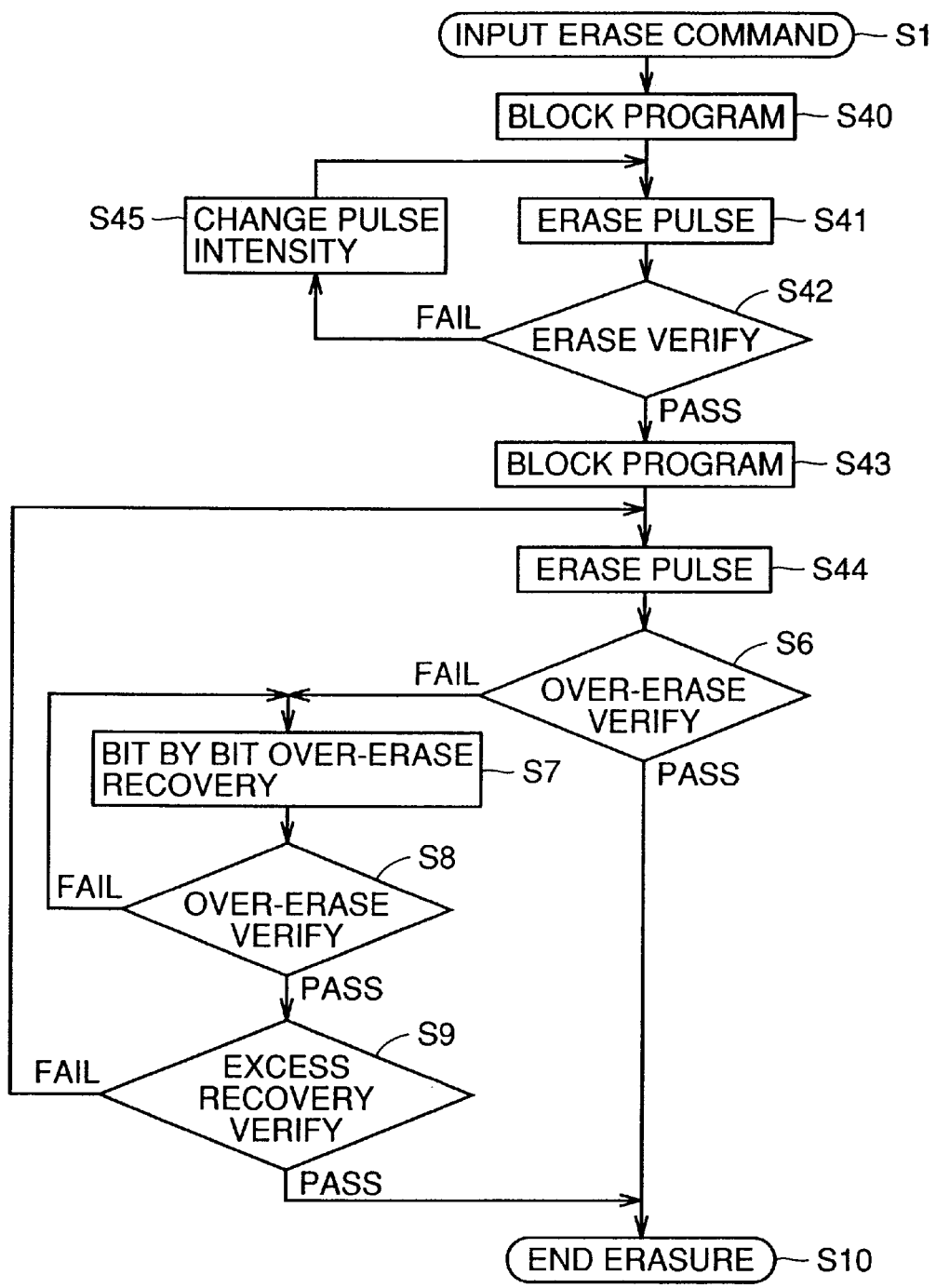
FIG. 30 is a flowchart showing an erase operation in a modification of the fifth embodiment.

FIG. 30 is a flowchart for showing an erase operation in a modification of the fifth embodiment.

Figure 31:
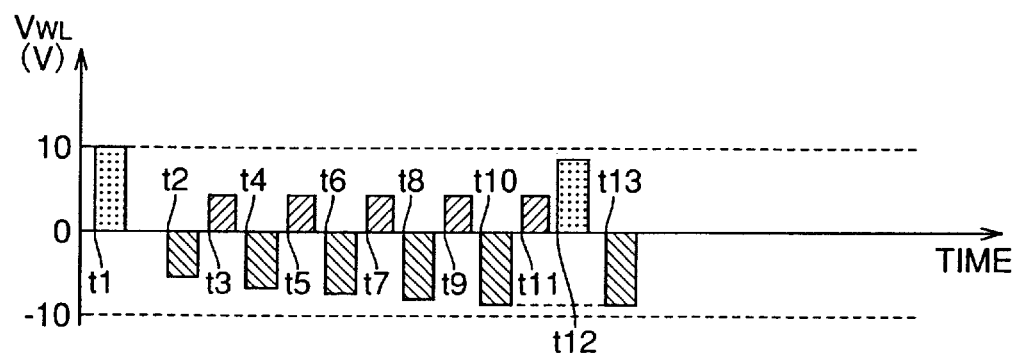
FIG. 31 is a waveform diagram showing the erase operation according to the flowchart shown in FIG. 30, and particularly showing changes in word line potential.

FIG. 31 is a waveform diagram showing the erase operation according to the flowchart of FIG. 30, and particularly showing changes in word line potential.

The flowchart shown in FIG. 30 differs from the flowchart shown in FIG. 28 in that step 45 is employed for changing the intensity of the erase pulse when the erase verify in step S42 is failed. The other steps are the same as those in the flowchart shown in FIG. 28, and therefore description thereof is not repeated.

According to the erase sequence of the flowchart shown in FIG. 30, the erase pulse, which is applied in step S41 for the first time at time t2 in FIG. 31, is set to have a small intensity. When the state does not pass the erase verify, the pulse intensity is changed in step S45 so that the further enhanced erase pulse is applied at time t4. Since the further enhanced erase pulse is subsequently applied as described above when the state does not pass the erase verify, it is possible to reduce the number of pulses which are applied until the state passes the erase verify in step S42, and therefore the time can be reduced.

Figure 32:
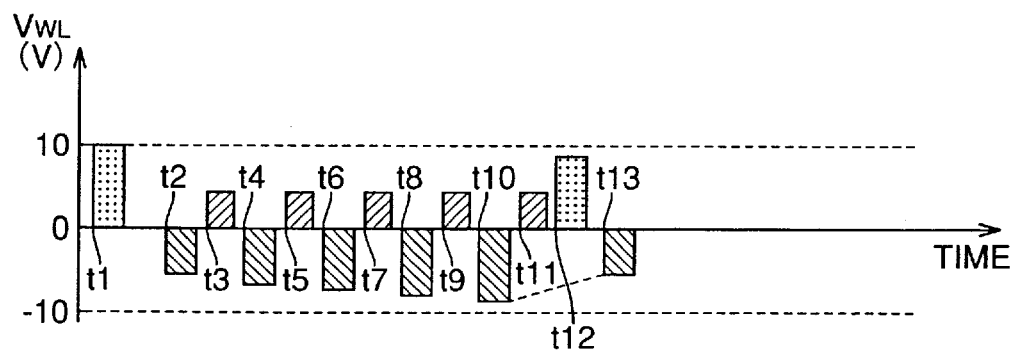
FIG. 32 is a waveform diagram showing a modification of the erase sequence represented by waveforms shown in FIG. 31.

FIG. 32 is a waveform diagram showing a modification of the erase sequence expressed by the waveforms shown in FIG. 31.

Referring to FIGS. 31 and 32, the erase pulse which is shown in FIG. 31 and is applied at time t13 in step S44 has the same intensity as the erase pulse which is used in step S41 when the state passes the erase verify in step 42. In contrast to this, the waveforms shown in FIG. 32 are determined such that the erase pulse applied at time t13 in step S44 is set to have a smaller intensity than that of the last erase pulse which is applied in step S41 before completion of the erase verify.

This is for the following reasons. When the block programming in step S43 is effected on the memory block, of which erasure is once completed, the threshold voltage may exceed the erase determination voltage due to the block programming. The transistors having such exceeding threshold voltages can provide better coupling of the floating gates, and can be erased more easily than the other cells. Therefore, the effect of narrowing the distribution of the threshold voltages can be sufficiently achieved even employing the above manner of reducing the intensity of the erase pulse applied at time t3 as compared with the intensity of the erase pulse applied at time t10.

[Sixth Embodiment]

Figure 33:
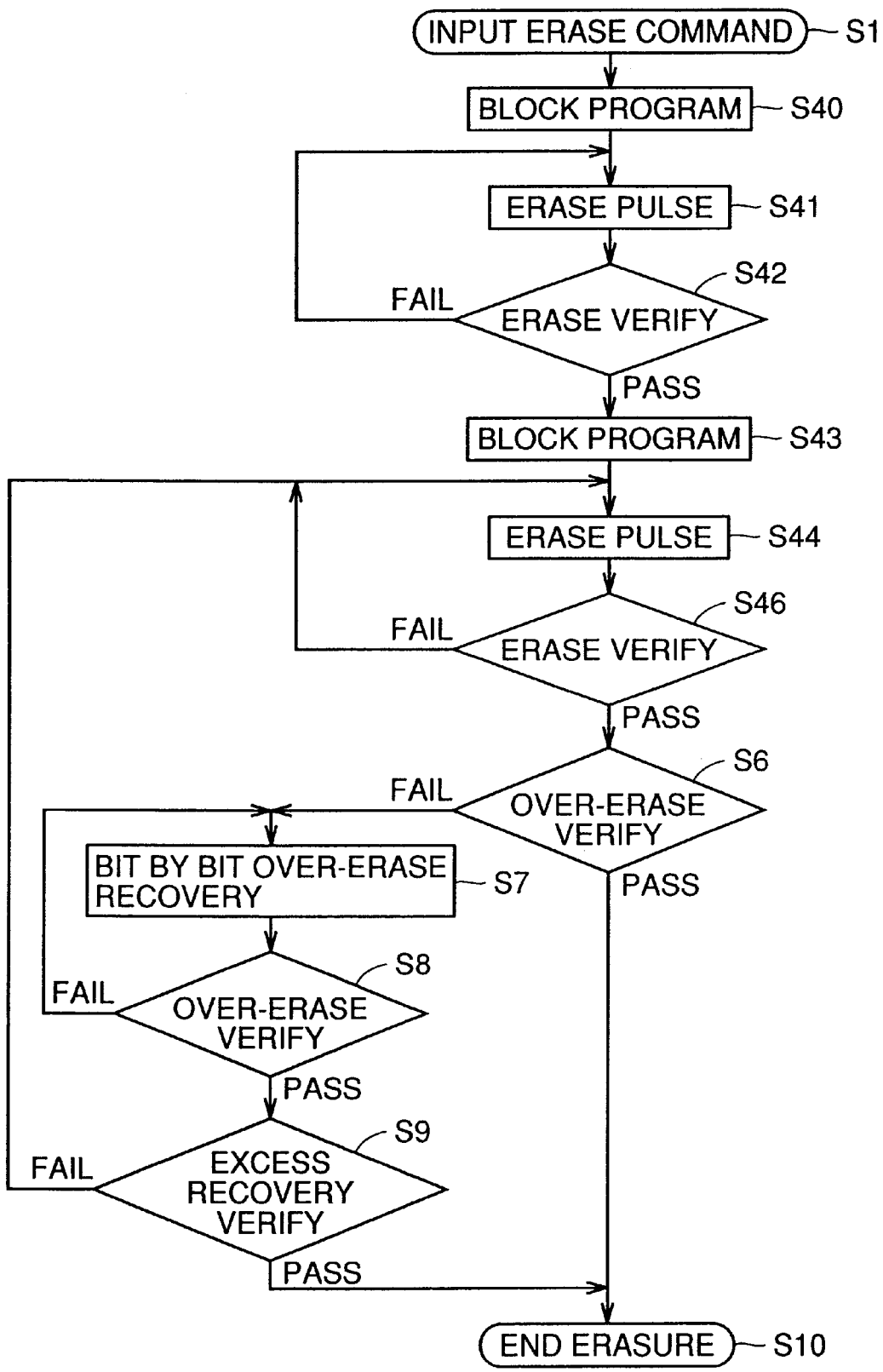
FIG. 33 is a flowchart showing an erase sequence of a nonvolatile semiconductor memory device of a sixth embodiment.

FIG. 33 is a flowchart showing an erase sequence of a nonvolatile semiconductor memory device according to a sixth embodiment of the invention.

The flowchart shown in FIG. 33 differs from the flowchart representing the erase sequence of the second embodiment shown in FIG. 6 in that steps S40–S46 are employed instead of steps S3, S4, S20 and S5. Steps S6–S10 are the same as those in the flowchart shown in FIG. 6, and therefore description thereof is not repeated.

Figure 34:
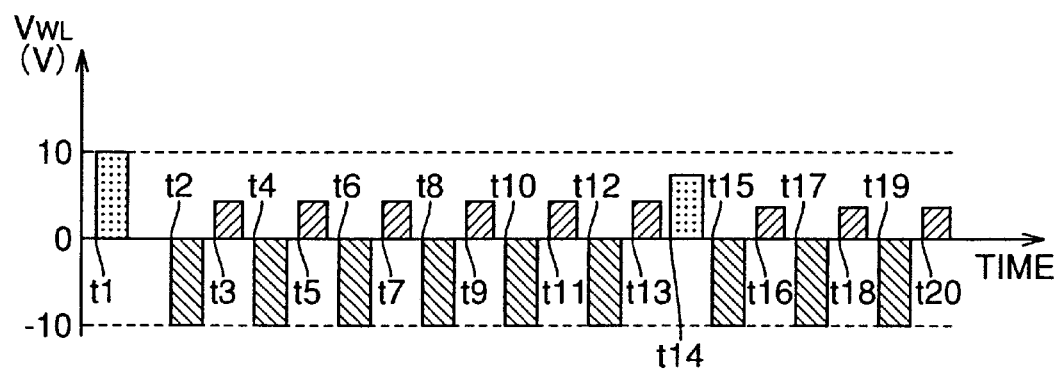
FIG. 34 is a waveform diagram showing an operation according to the flowchart in FIG. 33, and particularly showing changes in word line potential.

FIG. 34 is a waveform diagram showing operations in the flowchart shown in FIG. 33, and particularly showing changes in word line potential.

Referring to FIGS. 33 and 34, application of the block program pulse starts after the erase command shown in step S40 is entered at time t1.

At subsequent time t2, application of the erase pulse in step S41 starts. At time t3, the erase verify is performed (step S42). It is determined that erasure of the memory block is not completed, and the erase pulse in step S41 is applied again at time t4. Thereafter, the erase verify and the application of erase pulse are repeated for a period between times t5 and t13.

When it is determined by the erase verify (step S41) at time t13 that erasing of the memory block is completed, the block program pulse in S43 is applied at time t14. This program pulse has a smaller intensity than the program pulse applied in step S40. It is known that the application of the block program pulse in step S43 considerably narrows the distribution of the threshold voltages. For example, the memory transistors having the threshold voltages of 1.5 V or less are considerably reduced in number compared with the prior art.

At subsequent time t15, the erase pulse in S44 is applied, and the erase verify is performed at time t16. The steps S44 and S46 are repeated (times t17–t20) until the state passes the erase verify.

In the erase sequence of the sixth embodiment, the block program pulse is not used within the loop of the erase verify for reducing the time, and is applied only once in step S43 after the erase verify in step S42. The effect of subsequent application of the erase pulse is verified by executing the erase verify in step S46. Accordingly, the threshold voltages can be controlled more accurately than the erase sequence of the fifth embodiment.

In FIG. 34, the word line potential which is applied during the erase verify in step 42 for a period between times t3 and t14 is set to about 4.0 V. Meanwhile, the word line potential which is applied during the erase verify in step S46 for a period between times t16 and t20 is set to about 3.5 V.

Before application of the block program pulse in step S43 starts at time t14, therefore, the erasing continues until the threshold voltages of the memory transistors included in the memory block change to 4.0 V or less. Thereafter, the block programming in step S43 narrows the distribution of threshold voltages of the memory transistors in the memory block. Thereafter, application of the erase pulse in step S44 and the erase verify in step S46 are performed to lower the threshold voltages to or below 3.5 V.

By performing the control in two stages as described above, the distribution of the threshold voltages is narrowed, and the threshold voltages can be controlled with high accuracy.

Figure 35:
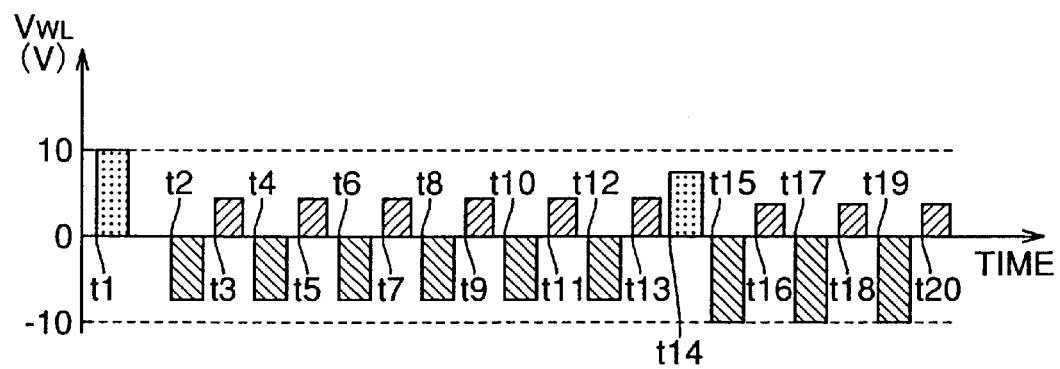
FIG. 35 shows a modification of waveforms showing changes in word line potential shown in FIG. 34.

FIG. 35 shows a modification of waveforms representing changes in word line potential shown in FIG. 34.

According to the waveforms shown in FIG. 35, a slightly low intensity is set in the erase pulse used in step S41 and applied during a period between times t2 and t13, and a slightly high intensity is set in the erase pulse used in step S44 and applied during a period between times t15 and t20, in contrast to the waveforms shown in FIG. 34.

Thus, the intensity of the erase pulse may be changed to an appropriate value corresponding to the determination voltage for the verify so that the threshold voltages may be changed to a range or extent close to the determination voltage for the verify.

[Modification of Sixth Embodiment]

Figure 36:
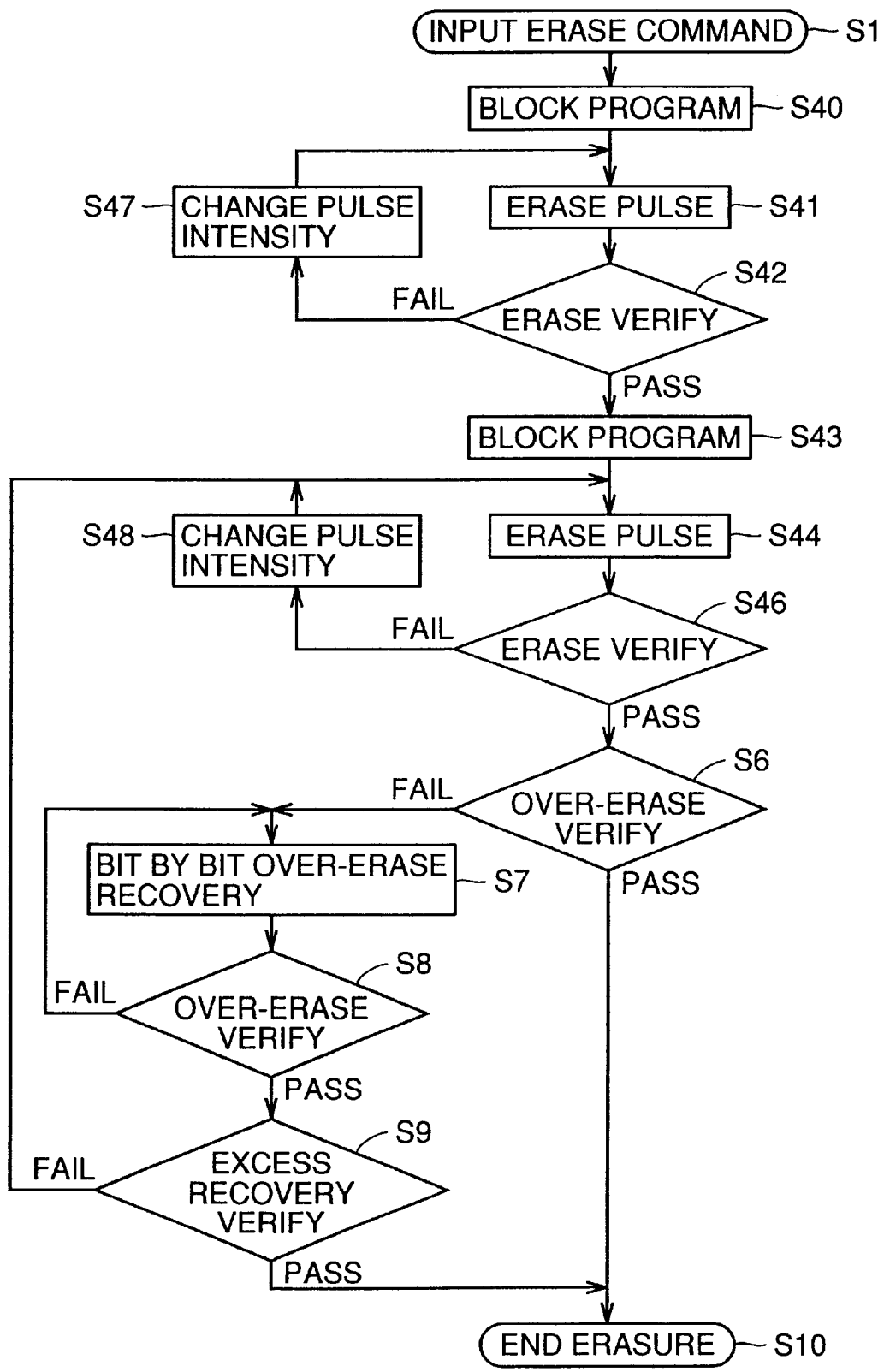
FIG. 36 is a flowchart showing an erase sequence of a modification of the sixth embodiment.

FIG. 36 is a flowchart showing an erase sequence of a modification of the sixth embodiment.

The flowchart shown in FIG. 36 differs from the flowchart shown in FIG. 33 in that the former further includes step S47 of changing the pulse intensity when the erase verify in step S42 is failed as well as step S48 of changing the pulse intensity when the erase verify in step S46 is failed. The other steps are the same as those in the flowchart shown in FIG. 33, and therefore description thereof is not repeated.

Figure 37:
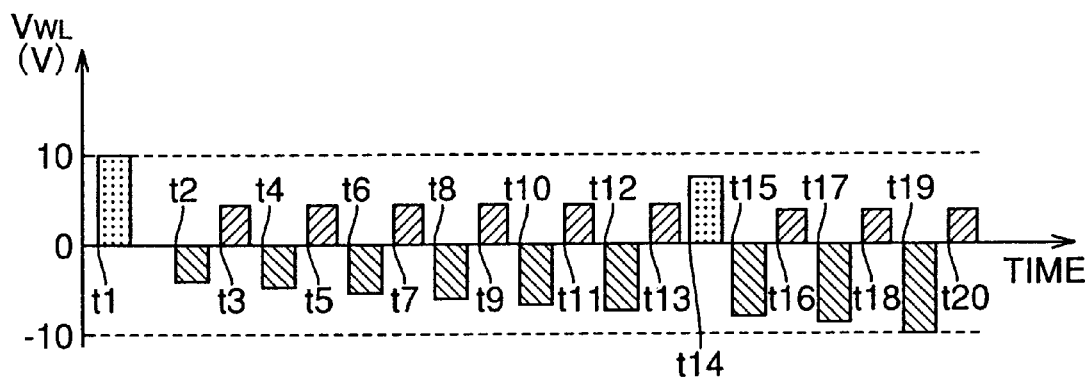
FIG. 37 is a first waveform diagram showing an operation in the erase sequence according to the flowchart shown in FIG. 36, and particularly showing changes in word line potential.

FIG. 37 is a first waveform diagram showing operations in the erase sequence according to the flowchart shown in FIG. 36, and particularly showing changes in word line potential.

Referring to FIG. 37, the intensity of the erase pulse is set low at time t2 when the erase pulse in step S41 is applied for the first time, and the intensity of the erase pulse is increased in step S47 every time the erase verify in step S42 is failed for a period between times t2 and t14.

According to the above manners, the time required for completion of the erase verify in step S42 can be reduced while minimizing the over-erased memory cells. According to this waveform example, the erase pulse in step S44 which is applied at time t15 has a slightly higher intensity than the erase pulse applied at time t12, and the pulse intensity is increased in step S48 every time the erase verify in step S46 is failed. According to the above manner, the time required for completion of the erase verify in step S46 can likewise be reduced, and the memory cells which are determined as being over-erased in step S6 can be reduced in number.

Figure 38:
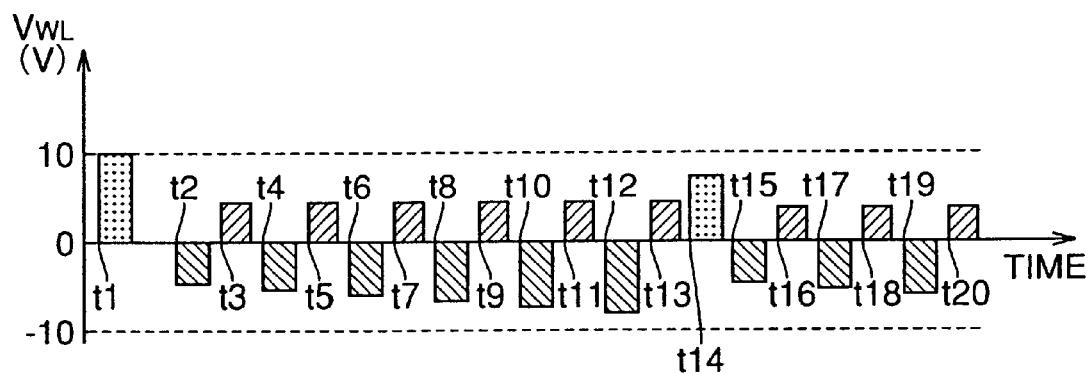
FIG. 38 shows a second example of the waveforms in the erase sequence according to the flowchart shown in FIG. 36.

FIG. 38 shows a second waveform example of the erase sequence according to the flowchart shown in FIG. 36.

According to the waveforms shown in FIG. 38, the initial intensity of the first erase pulse among those, which are applied in step S44 at and after time t5, is equal to the intensity of the erase pulse which is applied first in step S41 at time t2. This is the difference from the waveforms shown in FIG. 37, according to which the intensity of the erase pulse continuously increases. Owing to the above change, it is possible to reduce the number of the memory transistors which are determined as being over-erased in step S6, as compared with the case of applying the waveforms shown in FIG. 37.

Figure 39:
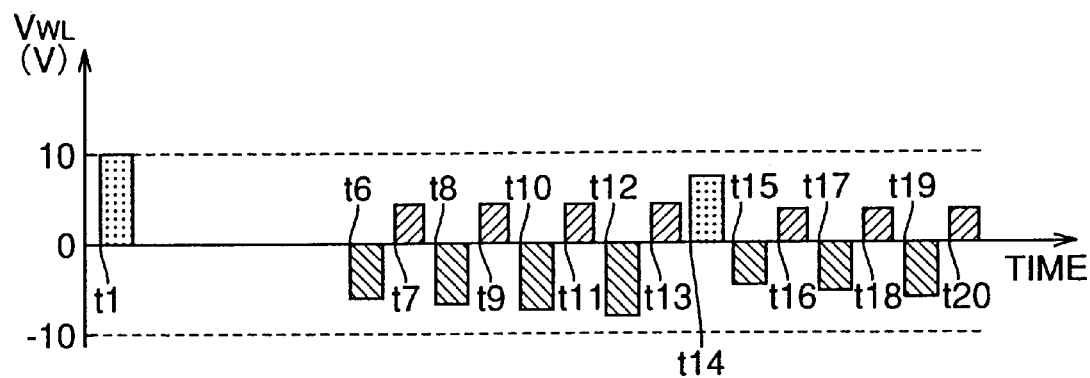
FIG. 39 is a third example of the waveforms in the erase sequence according to the flowchart shown in FIG. 36.

FIG. 39 shows a third waveform example of the erase sequence according to the flowchart in FIG. 36.

The waveforms in FIG. 39 differ from the waveforms in FIG. 38 in that the intensity of the first erase pulse, which is applied in step S44 at time t15, is further smaller than the intensity of the erase pulse, which is applied first in step S41. Owing to the above setting, the erasing can be roughly and rapidly completed in steps S41 and S42, and the erase operation can be completed while accurately controlling the threshold voltages in steps S44 and S46.

[Seventh Embodiment]

Figure 40:
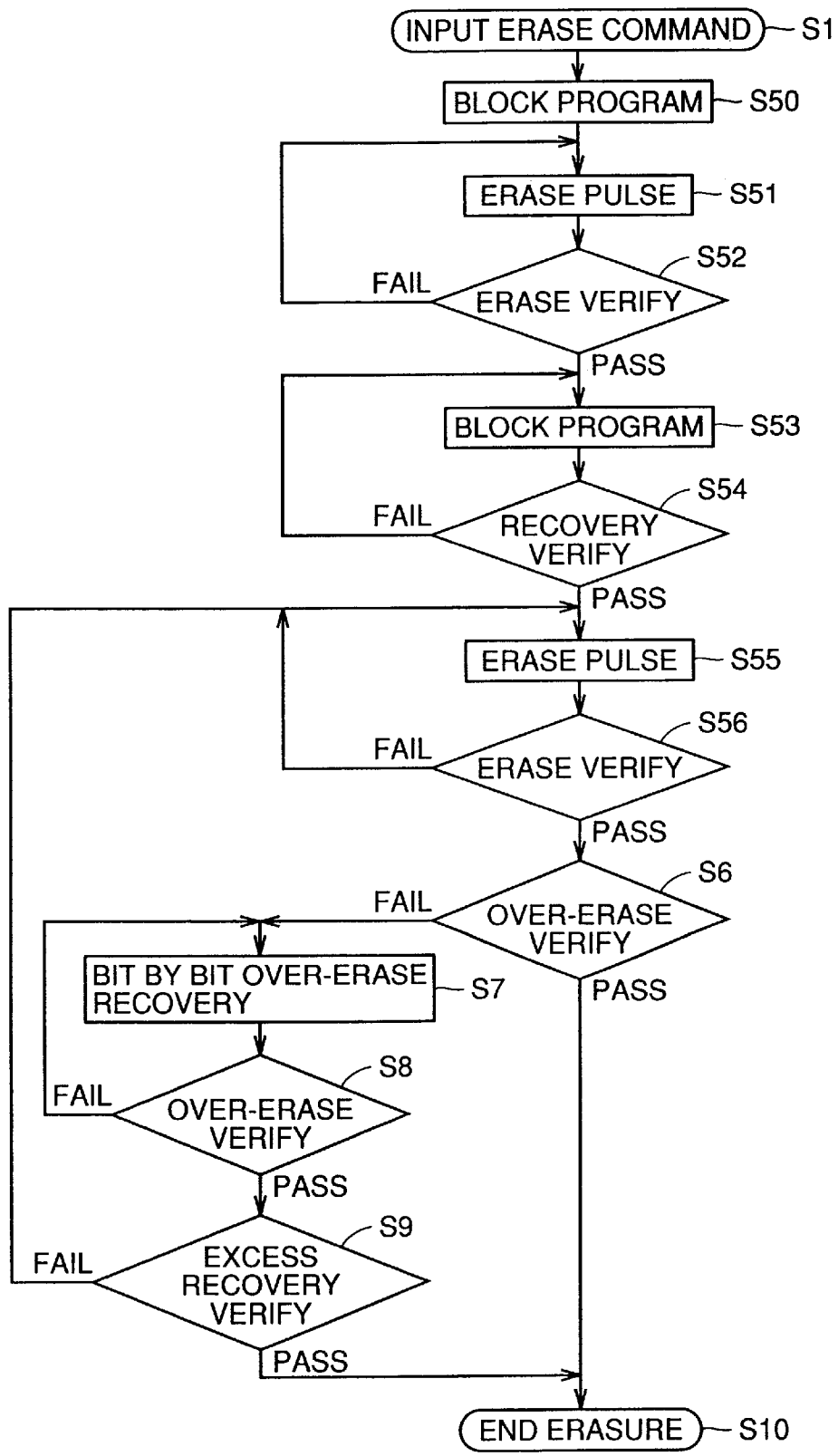
FIG. 40 is a flowchart showing an erase sequence of a nonvolatile semiconductor memory device according to a seventh embodiment.

FIG. 40 is a flowchart of an erase sequence of a nonvolatile semiconductor memory device according to a seventh embodiment.

The flowchart in FIG. 40 differs in the flowchart of the erase sequence of the second embodiment shown in FIG. 6 in that steps S50–S56 are employed instead of steps S3, S4, S20 and S5. Steps S6–S10 are the same as those in the flowchart shown in FIG. 6, and therefore description thereof is not repeated.

Figure 41:
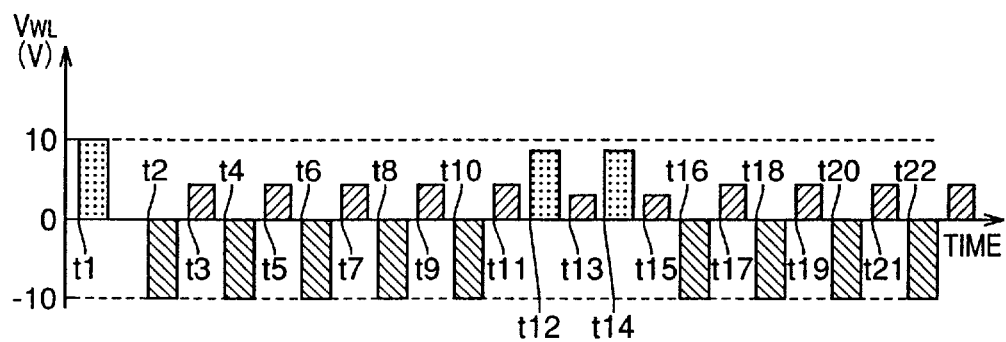
FIG. 41 is a waveform diagram showing the erase sequence according to the flowchart shown in FIG. 40, and particularly showing changes in word line potential.

FIG. 41 is a waveform diagram showing the erase sequence according to the flowchart shown in FIG. 40, and particularly showing changes in word line potential.

Referring to FIGS. 40 and 41, the erase command is applied in step S1, and the block program pulse is applied at time t1 (step S50).

At subsequent time t2, the erase pulse in step S51 is applied. For the erase verify in step S52, a potential of about 3.5 V is applied to the word line at time t3. Thereafter, steps S51 and S52 are repeated for a period between times t4 and t12.

When it is verified by the erase verify at time t11 that the threshold voltage is 3.5 V or less, the processing advances to step S53 for applying the block program pulse at time t12. At time t13, the recovery verify in step S54 is performed. A gate potential applied in this operation is about 1.5 V, and is lower than that in the case of the erase verify in step S52.

When the recovery verify is passed at time t15, the erase pulse in step S55 will be applied at time t16. Application of the erase pulse in step S55 is repeated until the erase verify in step S56 is passed.

As already described, the erasing is first completed in steps S51 and S52. In steps S53 and S54, it is verified that the recovery is effected on the over-erased memory transistors. In steps S55 and S56, it is verified that the erasing of the memory transistors in the memory block is completed. According to the foregoing manners, the distribution width of the threshold voltages of the memory transistors in the memory block can be reduced more reliably, and it is possible to reduce the number of the memory transistors, on which the over-erase recovery must be effected bit by bit in step S6. Thereby, the total erase time can be reduced.

Further, the determination conditions employed for the program verify in step S54 can be defined by the number of the memory transistors.

According to a usual manner, the write pulse is applied to the memory block, and then the recovery verify is passed when the memory transistor, which has the threshold voltage smaller than 1.5 V, and therefore is in the over-erased state, is not present in the memory block.

In contrast to this, the following manner may be employed. The number of the transistors in the over-erased state is determined. When the number of the over-erased memory transistors thus determined is smaller than a predetermined number, the recovery verify is passed.

For example, it is assumed that the over-erase recovery of the memory cell in steps S7–S9 takes about 10 $\mu$s per bit. If the over-erased memory cells of 10,000 bits are present after the usual erase operation, the processing time of 100 ms is required. In this situation, if the predetermined number employed as the determination conditions in step S54 is set, e.g., to 100 bits, the over-erased memory transistors of up to 100 bits are accepted, and the processing time for the over-erase recovery decreases by 1 ms.

Accordingly, the effect of reducing the total erase time can be sufficiently achieved even if the processing in step S54 is stopped when performed only to a certain extent. Therefore, in view of the time required for recovery of all the over-erased memory cells, the process may be configured to accept a predetermined number of memory transistors in the over-erased state.

Figure 42:
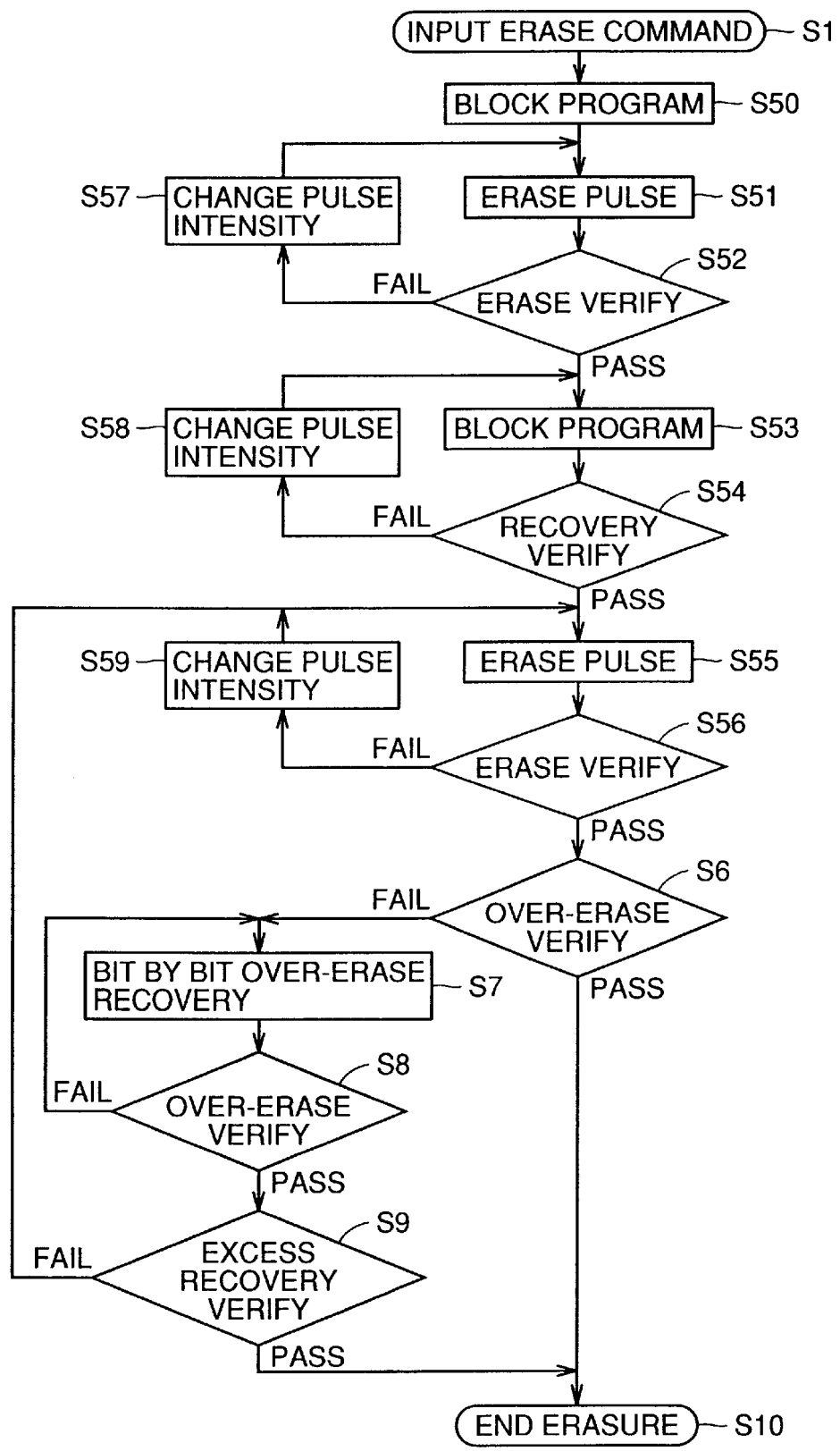
FIG. 42 is a flowchart showing a modification of the seventh embodiment.

FIG. 42 is a flowchart of a modification of the seventh embodiment.

The flowchart in FIG. 42 includes the same steps as those in the flowchart shown in FIG. 40, and further includes step S57 for changing the pulse intensity when the erase verify is failed in step S52, step S58 for changing the pulse intensity when the recovery verify is failed in step S54, and step S59 for changing the pulse intensity when the erase verify is failed in step S56. The other steps are the same as those in the flowchart shown in FIG. 40, and therefore description thereof is not repeated.

Figure 43:
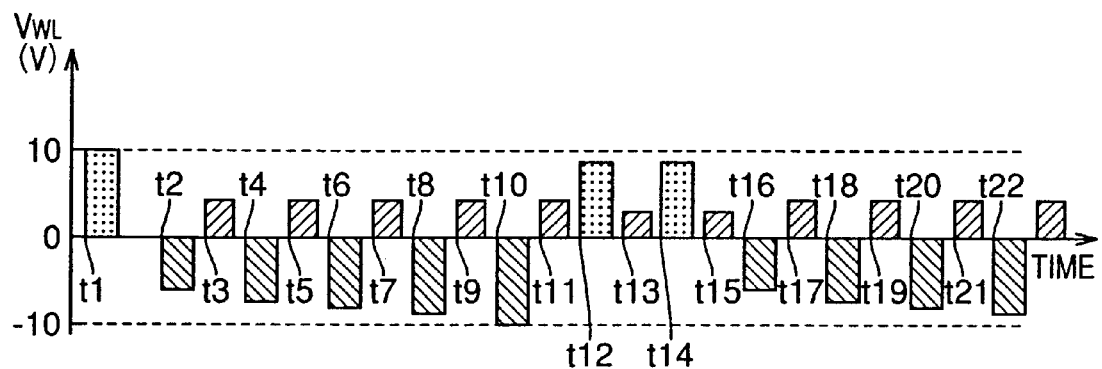
FIG. 43 is a first waveform diagram showing operations in the flowchart shown in FIG. 42, and particularly showing changes in word line potential.
Figure 44:
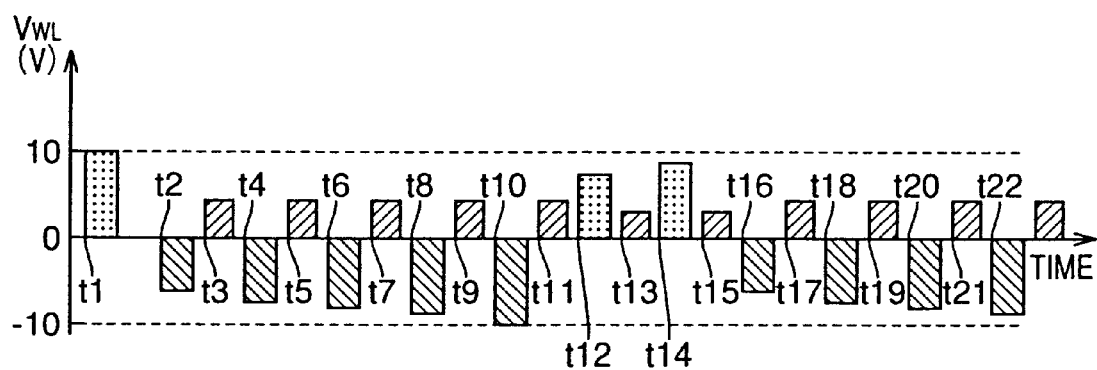
FIG. 44 is a second waveform diagram showing operations in the flowchart shown in FIG. 42, and particularly showing changes in word line potential.

FIGS. 43 and 44 are first and second waveform diagrams showing the operations in the flowchart shown in FIG. 42, and particularly showing changes in word line potential.

Referring to FIG. 43, the intensity of the erase pulse, which is applied in step S57 for a period between times t2 and t11, is changed stepwise so that it is enhanced every time the erase verify is failed. According to this, the erase time can be reduced while suppressing the number of the over-erased memory transistors.

Further, the intensity of the erase pulse, which is applied at times t16–t22, is increased stepwise in step S59 every time the erase verify in step 56 is failed. Accordingly, the time required before completion of the erase verify in step S56 can be reduced while suppressing the number of the over-erased memory transistors.

Further, the intensity of the block program pulse in step S53, which is applied at times t12–t15, is increased stepwise in step S58 every time the recovery verify in step S54 is failed. Therefore, the time required for completing the recovery verify in step S54 can be reduced, while suppressing the number of the excessively recovered memory transistors.

[Eighth Embodiment]

Figure 45:
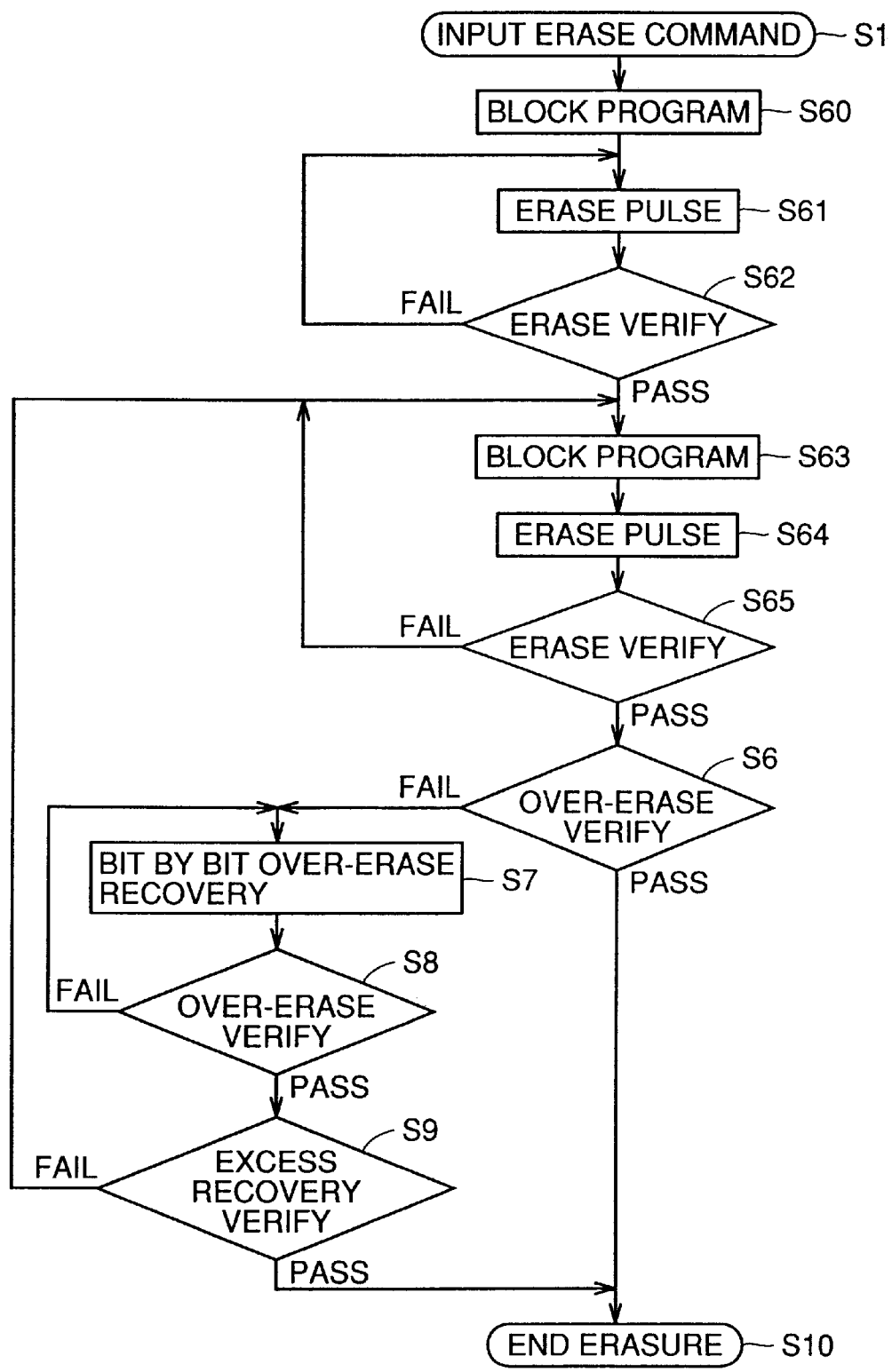
FIG. 45 is a flowchart showing an erase sequence of a nonvolatile semiconductor memory device according to an eighth embodiment.

FIG. 45 is a flowchart showing an erase sequence of a nonvolatile semiconductor memory device of an eighth embodiment.

Figure 46:
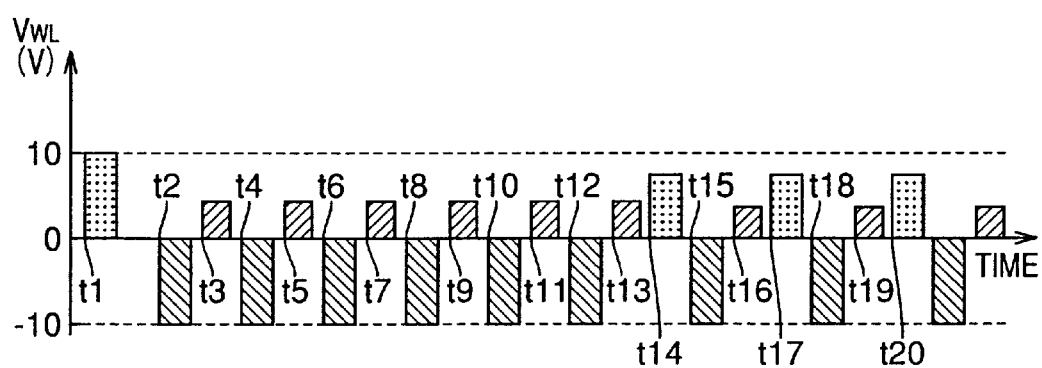
FIG. 46 is a waveform diagram showing operations according to the flowchart in FIG. 45, and particularly showing changes in word line potential.
Figure 47:
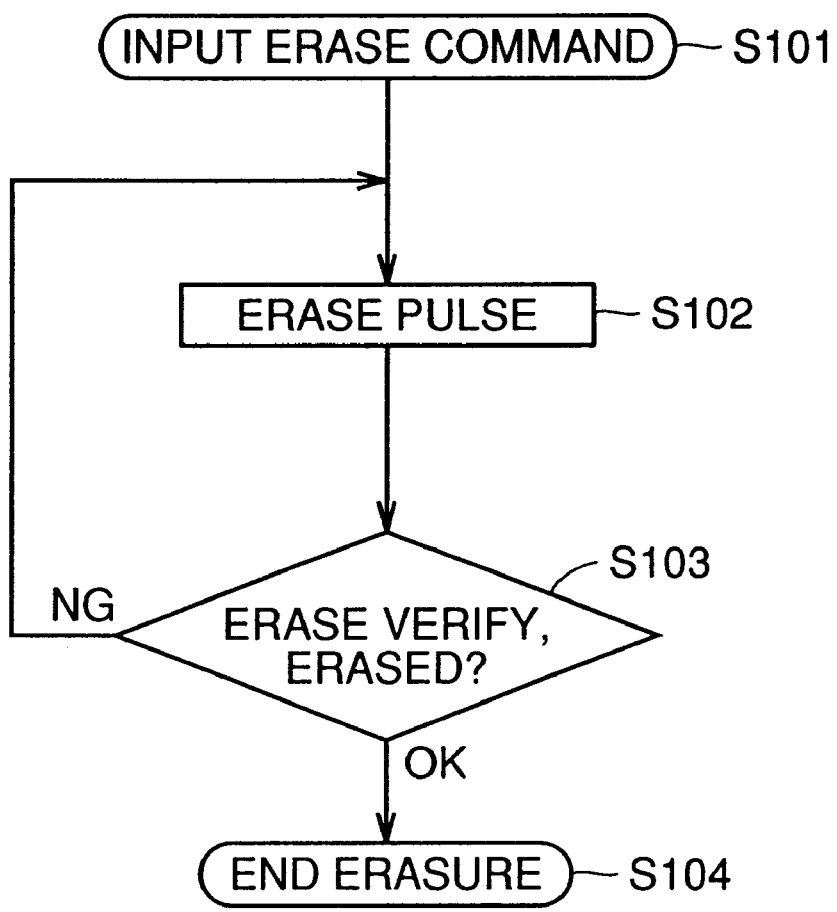
FIG. 47 is a flowchart showing an example of the most simple erase sequence of a conventional flash memory.

FIG. 46 is a waveform diagram showing operations in the flowchart shown in FIG. 45, and particularly showing changes in word line potential.

The flowchart shown in FIG. 45 differs from the flowchart shown in FIG. 6 in that steps S60–S65 are employed instead of steps S3, S4, S20 and S5 in the flowchart shown in FIG. 6. Steps S6–S16 are the same as those in the flowchart shown in FIG. 6, and therefore description thereof is not repeated.

Referring to FIGS. 45 and 46, when the erase command is applied in step S1, the block program before erasure is executed at time t1 (step S60). At time t2, the erase pulse is applied (step S61).

At subsequent time t3, the pulse for the erase verify in step S62 is applied. This pulse places the potential of about 4.0 V on the word line. The application of erase pulse in step S61 is repeated for a period of times t4–t12 until the above verify is passed.

When it is determined at time t12 in step 62 of the erase verify that the erasing is completed, the block program pulse in step S63 is applied at time t14. At time t15, the erase pulse in step S64 is applied, and the erase verify in step S65 is executed at time t16. In step S65 for the erase verify, the potential on the word line is set to about 3.5 V for determining whether the complete erasing is already performed or not. At times t17–t20, application of the block program pulse and the erase pulse in steps S63 and S64 is repeated until the erase verify in step S65 is passed.

According to the above configuration, the first erasing by the erase pulse is executed in steps S61 and S62, and thereafter the erasing operation, in which the threshold voltages are further reduced precisely, is performed in steps S63–S65. The erase sequence of the eighth embodiment can reduce the distribution width of the threshold voltages as compared with the prior art, while reducing the erase time, as can be done also in the sixth and seventh embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a memory block including a plurality of nonvolatile memory transistors arranged in rows and columns;

a plurality of word lines for selecting the rows of said memory transistors, respectively;

a plurality of bit lines provided corresponding to the columns of said memory transistors;

a potential generating portion for generating a potential to be applied to said plurality of word lines, said plurality of bit lines, and substrates and sources of said plurality of memory transistors; and a program/erase control portion for controlling the potential generated by said potential generating portion to erase data in said memory block, wherein said program/erase control portion performs erasing of information held in said memory block by collectively performing programming on said plurality of memory transistors after collectively applying a first erase pulse to said plurality of memory transistors, then repeating the collective application of a second erase pulse to said plurality of memory transistors until said plurality of memory transistors assume an erased state, and selectively performing recovery on the memory transistor in an over-erased state after detection of said erased state.

2. The nonvolatile semiconductor memory device according to claim 1, wherein said memory transistor is an MOS transistor having a floating gate, and the application of said first erase pulse shifts a threshold voltage of said memory transistor by an amount smaller than that of shift of the threshold voltage of said memory transistor caused by the collective application of said second erase pulse.

3. The nonvolatile semiconductor memory device according to claim 2, wherein said first erase pulse is applied one time in an operation of erasing the information held by said memory block.

4. The nonvolatile semiconductor memory device according to claim 1, wherein said memory transistor is an N channel MOS transistor, and said program/erase control portion applies a negative potential reducing a sub-threshold current of said memory transistor to said substrate when verifying said erased state by applying a potential difference between the drain and source of said memory transistor, and detecting a current flowing therebetween.

5. A nonvolatile semiconductor memory device comprising:

a memory block including a plurality of nonvolatile memory transistors arranged in rows and columns;

a plurality of word lines for selecting the rows of said memory transistors, respectively;

a plurality of bit lines provided corresponding to the columns of said memory transistors;

a potential generating portion for generating a potential to be applied to said plurality of word lines, said plurality of bit lines, and substrates and sources of said plurality of memory transistors; and a program/erase control portion for controlling said potential generating portion to erase data in said memory block, wherein said program/erase control portion performs erasing of information held in said memory block by repeating, until said plurality of memory transistors assume an erased state, the collective application of a program pulse to said plurality of memory transistors after collectively applying an erase pulse to said plurality of memory transistors, and selectively performing recovery on the memory transistor in an over-erased state after verification of said erased state.

6. The nonvolatile semiconductor memory device according to claim 5, wherein said memory transistor is an MOS transistor having a floating gate, and the application of said program pulse shifts a threshold voltage of said memory transistor by an amount smaller than that of shift of the threshold voltage of said memory transistor caused by the application of said erase pulse.

7. The nonvolatile semiconductor memory device according to claim 5, wherein said memory transistor is an N channel MOS transistor, and said program/erase control portion applies a negative potential reducing a sub-threshold current of said memory transistor to said substrate when verifying said erased state by applying a potential difference between the drain and source of said memory transistor, and detecting a current flowing therebetween.

8. A method of erasing data in a nonvolatile semiconductor memory device including a memory block provided with a plurality of nonvolatile memory transistors arranged in rows and columns, a plurality of word lines for selecting the rows of said memory transistors, respectively, a plurality of bit lines arranged corresponding to the columns of said memory transistors, a potential generating portion for generating a potential to be applied to said plurality of word lines, said plurality of bit lines, and substrates and sources of said memory transistors, and a program/erase control portion for controlling said potential generating portion to erase data of said memory block, comprising the steps of:

performing programming on said plurality of memory transistors collectively after collectively applying a first erase pulse to said plurality of memory transistors;

repeating an operation of collectively applying a second erase pulse to said plurality of memory transistors until said plurality of memory transistors assume the erased state; and selectively performing a recovery operation on the memory transistor in the over-erased state when said erased state is verified.

9. The method of erasing data of the nonvolatile semiconductor memory device according to claim 8, wherein said memory transistor is an MOS transistor having a floating gate, and the application of said first erase pulse shifts a threshold voltage of said memory transistor by an amount smaller than that of shift of the threshold voltage of said memory transistor caused by the collective application of said second erase pulse.

10. A method of erasing data in a nonvolatile semiconductor memory device including a memory block provided with a plurality of nonvolatile memory transistors arranged in rows and columns, a plurality of word lines for selecting the rows of said memory transistors, respectively, a plurality of bit lines arranged corresponding to the columns of said memory transistors, a potential generating portion for generating a potential to be applied to said plurality of word lines, said plurality of bit lines, and substrates and sources of said memory transistors, and a program/erase control portion for controlling said potential generating portion to erase data of said memory block, comprising the steps of:

repeating, until said plurality of memory transistors assume the erased state, an operation of collectively applying a program pulse to said plurality of memory transistors after collectively applying an erase pulse to said plurality of memory transistors; and selectively performing a recovery operation on the memory transistor in the over-erased state when said erased state is verified.

11. The method of erasing data of the nonvolatile semiconductor memory device according to claim 10, wherein said memory transistor is an MOS transistor having a floating gate, and the application of said program pulse shifts a threshold voltage of said memory transistor by an amount smaller than that of shift of the threshold voltage of said memory transistor caused by the application of said erase pulse.

12. A method of erasing data in a nonvolatile semiconductor memory device including a memory block provided with a plurality of nonvolatile memory transistors arranged in rows and columns, a plurality of word lines for selecting the rows of said memory transistors, respectively, a plurality of bit lines arranged corresponding to the columns of said memory transistors, a potential generating portion for generating a potential to be applied to said plurality of word lines, said plurality of bit lines, and substrates and sources of said memory transistors, and a program/erase control portion for controlling said potential generating portion to erase data of said memory block, comprising the steps of:

collectively applying a first erase pulse to said plurality of memory transistors;

repeating, until said plurality of memory transistors assume the erased state, an operation of collectively applying a second erase pulse to said plurality of memory transistors after collectively applying a program pulse to said plurality of memory transistors; and selectively performing a recovery operation on the memory transistor in the over-erased state.

13. The method of erasing data of the nonvolatile semiconductor memory device according to claim 12, wherein an intensity of said second erase pulse is increased stepwise until said plurality of memory transistors assume the erased state.

14. The method of erasing data of the nonvolatile semiconductor memory device according to claim 13, wherein an intensity of said program pulse is increased stepwise until said plurality of memory transistors assume the erased state.

15. A method of erasing data in a nonvolatile semiconductor memory device including a memory block provided with a plurality of nonvolatile memory transistors arranged in rows and columns, a plurality of word lines for selecting the rows of said memory transistors, respectively, a plurality of bit lines arranged corresponding to the columns of said memory transistors, a potential generating portion for generating a potential to be applied to said plurality of word lines, said plurality of bit lines, and substrates and sources of said memory transistors, and a program/erase control portion for controlling said potential generating portion to erase data of said memory block, comprising the steps of:

repeating an operation of collectively applying a first erase pulse to said plurality of memory transistors until said plurality of memory transistors assume the erased state;

applying a second erase pulse to said plurality of memory transistors collectively after collectively applying a first program pulse to said plurality of memory transistors; and selectively performing a recovery operation on the memory transistor in the over-erased state.

16. The method of erasing data of the nonvolatile semiconductor memory device according to claim 15, wherein said memory transistor is an MOS transistor having a floating gate, and the application of said second erase pulse shifts a threshold voltage of said memory transistor by an amount smaller than that of shift of the threshold voltage of said memory transistor caused by the last application of said first erase pulse.

17. A method of erasing data in a nonvolatile semiconductor memory device including a memory block provided with a plurality of nonvolatile memory transistors arranged in rows and columns, a plurality of word lines for selecting the rows of said memory transistors, respectively, a plurality of bit lines arranged corresponding to the columns of said memory transistors, a potential generating portion for generating a potential to be applied to said plurality of word lines, said plurality of bit lines, and substrates and sources of said memory transistors, and a program/erase control portion for controlling said potential generating portion to erase data of said memory block, comprising the steps of:

repeating an operation of collectively applying a first erase pulse to said plurality of memory transistors until said plurality of memory transistors assume a first erased state;

collectively applying a program pulse to said plurality of memory transistors in said first erased state;

repeating an operation of collectively applying a second erase pulse to said plurality of memory transistors after applying said program pulse until said plurality of memory transistors assume a second erased state; and selectively performing a recovery operation on the memory transistor in the over-erased state when said second erased state is verified.

18. The method of erasing data of the nonvolatile semiconductor memory device according to claim 17, further comprising the step of collectively applying a preliminary program pulse for performing preliminary program before erasure to said plurality of memory transistors prior to said step of repeating application of said first erase pulse.

19. The method of erasing data of the nonvolatile semiconductor memory device according to claim 18, wherein said memory transistor is an MOS transistor having a floating gate, and the application of said program pulse shifts a threshold voltage of said memory transistor by an amount smaller than that of shift of the threshold voltage of said memory transistor caused by the application of said preliminary program pulse.

20. The method of erasing data of the nonvolatile semiconductor memory device according to claim 17, wherein said memory transistor is an MOS transistor having a floating gate, said first erased state provides the threshold voltage of said memory transistor equal to or smaller than a first value, and said second erased state provides the threshold voltage of said memory transistor equal to or smaller than a second value smaller than said first value.

21. The method of erasing data of the nonvolatile semiconductor memory device according to claim 17, wherein an intensity of said first erase pulse is increased stepwise until said plurality of memory transistors assume the first erased state.

22. The method of erasing data of the nonvolatile semiconductor memory device according to claim 21, wherein an intensity of said second erase pulse is increased stepwise until said plurality of memory transistors assume the second erased state.

23. The method of erasing data of the nonvolatile semiconductor memory device according to claim 22, wherein said memory transistor is an MOS transistor having a floating gate, and the first application of said second erase pulse shifts a threshold voltage of said memory transistor by an amount equal to or smaller than that of shift of the threshold voltage of said memory transistor caused by the last application of said first erase pulse.

24. A method of erasing data in a nonvolatile semiconductor memory device including a memory block provided with a plurality of nonvolatile memory transistors arranged in rows and columns, a plurality of word lines for selecting the rows of said memory transistors, respectively, a plurality of bit lines arranged corresponding to the columns of said memory transistors, a potential generating portion for generating a potential to be applied to said plurality of word lines, said plurality of bit lines, and substrates and sources of said memory transistors, and a program/erase control portion for controlling said potential generating portion to erase data of said memory block, comprising the steps of:

repeating an operation of collectively applying a first erase pulse to said plurality of memory transistors until said plurality of memory transistors assume a first erased state;

repeating, until said plurality of memory transistors assume a second erased state, an operation of collectively applying a second erase pulse to said plurality of memory transistors in said first erased state after collectively applying a program pulse to said plurality of memory transistors; and selectively performing a recovery operation on the memory transistor in the over-erased state when said second erased state is verified.

25. The method of erasing data of the nonvolatile semiconductor memory device according to claim 24, wherein said memory transistor is an MOS transistor having a floating gate, said first erased state provides the threshold voltage of said memory transistor equal to or smaller than a first value, and said second erased state provides the threshold voltage of said memory transistor equal to or smaller than a second value smaller than said first value.

26. A method of erasing data in a nonvolatile semiconductor memory device including a memory block provided with a plurality of nonvolatile memory transistors arranged in rows and columns, a plurality of word lines for selecting the rows of said memory transistors, respectively, a plurality of bit lines arranged corresponding to the columns of said memory transistors, a potential generating portion for generating a potential to be applied to said plurality of word lines, said plurality of bit lines, and substrates and sources of said memory transistors, and a program/erase control portion for controlling said potential generating portion to erase data of said memory block, comprising the steps of:

repeating an operation of collectively applying a first erase pulse to said plurality of memory transistors until said plurality of memory transistors assume a first erased state;

collectively applying a program pulse to said plurality of memory transistors in said first erased state until said plurality of memory transistors assume a predetermined recovered state;

repeating an operation of collectively applying a second erase pulse to said plurality of memory transistors in said first recovered state until said plurality of memory transistors assume a second erased state; and selectively performing a recovery operation on the memory transistor in the over-erased state when said second erased state is verified.

27. The method of erasing data of the nonvolatile semiconductor memory device according to claim 26, wherein said memory transistor is an MOS transistor having a floating gate, said predetermined recovered state provides the threshold voltage of said memory transistor equal to or larger than a first value, and said over-erased state provides the threshold voltage of said memory transistor smaller than a second value larger than said first value.

28. The method of erasing data of the nonvolatile semiconductor memory device according to claim 26, wherein said memory transistor is an MOS transistor having a floating gate, and the memory transistors having the threshold voltage smaller than a first value and being smaller in number than a predetermined value are present among said plurality of memory transistors in said predetermined recovered state.

29. The method of erasing data of the nonvolatile semiconductor memory device according to claim 26, further comprising the step of collectively applying a preliminary program pulse for performing preliminary program before erasure to said plurality of memory transistors prior to said step of repeating application of said first erase pulse.

30. The method of erasing data of the nonvolatile semiconductor memory device according to claim 29, wherein said memory transistor is an MOS transistor having a floating gate, and the application of said program pulse shifts a threshold voltage of said memory transistor by an amount smaller than that of shift of the threshold voltage of said memory transistor caused by the application of said preliminary program pulse.

* * * * *

UNITED STATES PATENT AND TRADEMARK OFFICE
CERTIFICATE OF CORRECTION

| | | |
|---|---|---|
| PATENT NO. | : 6,330,192 B1 | Page 1 of 1 |
| DATED | : December 11, 2001 | |
| INVENTOR(S) | : Atsushi Ohba et al. | |

It is certified that error appears in the above-identified patent and that said Letters Patent is hereby corrected as shown below:

<u>Title page,</u>
Item [30], "Foreign Application Priority Data," change the priority application numbers "12-018508" to -- 2000-018508 -- and change "12-097705" to -- 2000-097705 --.

Signed and Sealed this

Twentieth Day of August, 2002

Attest:

JAMES E. ROGAN
Attesting Officer     Director of the United States Patent and Trademark Office